US010224279B2

(12) United States Patent
Or-Bach et al.

(10) Patent No.: US 10,224,279 B2
(45) Date of Patent: Mar. 5, 2019

(54) SEMICONDUCTOR DEVICE AND STRUCTURE

(71) Applicant: Monolithic 3D Inc., San Jose, CA (US)

(72) Inventors: Zvi Or-Bach, San Jose, CA (US); Brian Cronquist, San Jose, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

(21) Appl. No.: 14/814,865

(22) Filed: Jul. 31, 2015

(65) Prior Publication Data

US 2015/0340316 A1    Nov. 26, 2015

Related U.S. Application Data

(63) Continuation-in-part of application No. 13/836,080, filed on Mar. 15, 2013, now Pat. No. 9,117,749.

(51) Int. Cl.
*H01L 23/528*    (2006.01)
*H01L 27/108*    (2006.01)
(Continued)

(52) U.S. Cl.
CPC ............ *H01L 23/528* (2013.01); *G11C 5/025* (2013.01); *G11C 5/04* (2013.01); *G11C 8/16* (2013.01); *G11C 11/403* (2013.01); *G11C 13/0007* (2013.01); *H01L 27/0688* (2013.01); *H01L 27/10802* (2013.01); *H01L 27/10805* (2013.01);
(Continued)

(58) Field of Classification Search
CPC .............. G11C 11/403; G11C 13/0007; G11C 2213/71; G11C 2213/75; G11C 5/025; G11C 5/04; G11C 8/16; H01L 2224/16145; H01L 2224/32145; H01L 23/528; H01L 27/0688; H01L 27/10802; H01L 27/10805; H01L 27/2436; H01L 27/2481; H01L 27/249; H01L 45/04; H01L 45/06; H01L 45/08; H01L 45/085; H01L 45/1226; H01L 45/141; H01L 45/145; H01L 45/146; H01L 45/147; H01L 45/1206
See application file for complete search history.

(56) References Cited

U.S. PATENT DOCUMENTS 3,007,090 A    10/1961    Rutz
3,819,959 A    6/1974    Chang et al.
(Continued)

FOREIGN PATENT DOCUMENTS

EP          1267594 A2    12/2002
WO PCT/US2008/063483      5/2008

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.
(Continued)

*Primary Examiner* — Sophia Nguyen
(74) *Attorney, Agent, or Firm* — Tran & Associates

(57) ABSTRACT

A 3D device, including: a first layer including a first memory including a first transistor; a second layer including a second memory including a second transistor; and a Resistive RAM structure, where the second transistor is self-aligned to the first transistor, and where the Resistive RAM structure is overlaying the first layer and is overlaid by the second layer.

20 Claims, 82 Drawing Sheets

(51) Int. Cl.

| | |
|---|---|
| G11C 8/16 | (2006.01) |
| H01L 27/06 | (2006.01) |
| H01L 27/24 | (2006.01) |
| G11C 13/00 | (2006.01) |
| H01L 45/00 | (2006.01) |
| G11C 5/02 | (2006.01) |
| G11C 5/04 | (2006.01) |
| G11C 11/403 | (2006.01) |

(52) U.S. Cl.
CPC ........ *H01L 27/249* (2013.01); *H01L 27/2436* (2013.01); *H01L 27/2481* (2013.01); *H01L 45/04* (2013.01); *H01L 45/06* (2013.01); *H01L 45/08* (2013.01); *H01L 45/085* (2013.01); *H01L 45/1226* (2013.01); *H01L 45/141* (2013.01); *H01L 45/145* (2013.01); *H01L 45/146* (2013.01); *H01L 45/147* (2013.01); *G11C 2213/71* (2013.01); *G11C 2213/75* (2013.01); *H01L 2224/16145* (2013.01); *H01L 2224/32145* (2013.01)

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |

(56) References Cited

U.S. PATENT DOCUMENTS

| | | |
|---|---|---|
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Fans |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |

(56) References Cited

U.S. PATENT DOCUMENTS

| | | | |
|---|---|---|---|
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,026,521 B1* | 9/2011 | Or-Bach .............. H01L 21/268 257/67 |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,114,757 B1* | 2/2012 | Or-Bach .............. H01L 21/8221 257/67 |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,148 B2* | 6/2012 | Sekar .................. H01L 21/268 257/67 |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,237,228 B2* | 8/2012 | Or-Bach .............. G03F 9/7076 257/369 |
| 8,266,560 B2 | 8/2012 | McIlrath |
| 8,264,065 B2 | 9/2012 | Su et al. |
| 8,288,816 B2 | 10/2012 | Komori et al. |
| 8,298,875 B1* | 10/2012 | Or-Bach .............. H01L 29/4236 257/E21.411 |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,373,230 B1* | 2/2013 | Or-Bach .............. B82Y 10/00 257/347 |
| 8,374,033 B2 | 2/2013 | Kito et al. |
| 8,395,191 B2* | 3/2013 | Or-Bach .............. G03F 9/7076 257/213 |
| 8,432,719 B2 | 4/2013 | Lue |
| 8,432,751 B2 | 4/2013 | Hafez |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,508,994 B2 | 8/2013 | Okhonin |

(56) References Cited

U.S. PATENT DOCUMENTS

| | | |
|---|---|---|
| 8,513,725 B2 | 8/2013 | Sakuma et al. |
| 8,514,623 B2 | 8/2013 | Widjaja et al. |
| 8,525,342 B2 | 10/2013 | Chandrasekaran |
| 8,546,956 B2 | 10/2013 | Nguyen |
| 8,566,762 B2 | 10/2013 | Morimoto et al. |
| 8,581,349 B1 * | 11/2013 | Sekar .................. H01L 27/2436 257/402 |
| 8,603,888 B2 | 12/2013 | Liu |
| 8,619,490 B2 | 12/2013 | Yu |
| 8,643,162 B2 | 2/2014 | Madurawe |
| 8,650,516 B2 | 2/2014 | McIlrath |
| 8,659,070 B2 * | 2/2014 | Tanaka ................. H01L 21/8221 257/324 |
| 8,679,861 B2 | 3/2014 | Bose |
| 8,687,399 B2 * | 4/2014 | Sekar .................... G11C 11/406 365/174 |
| 8,773,562 B1 | 7/2014 | Fan |
| 8,775,998 B2 | 7/2014 | Morimoto |
| 8,803,206 B1 * | 8/2014 | Or-Bach ............... H01L 27/098 257/278 |
| 8,841,777 B2 | 9/2014 | Farooq |
| 8,853,785 B2 | 10/2014 | Augendre |
| 8,896,054 B2 | 11/2014 | Sakuma et al. |
| 8,902,663 B1 * | 12/2014 | Or-Bach ................. G11C 16/02 365/185.08 |
| 8,907,442 B2 * | 12/2014 | Or-Bach ............... G03F 9/7076 257/368 |
| 8,928,119 B2 | 1/2015 | Leedy |
| 8,971,114 B2 | 3/2015 | Kang |
| 9,030,858 B2 * | 5/2015 | Or-Bach ................ G11C 11/406 365/174 |
| 9,117,749 B1 * | 8/2015 | Or-Bach ............. H01L 27/2436 |
| 9,172,008 B2 | 10/2015 | Hwang |
| 9,219,005 B2 * | 12/2015 | Or-Bach ................ B82Y 10/00 |
| 9,227,456 B2 | 1/2016 | Chien |
| 9,230,973 B2 | 1/2016 | Pachamuthu et al. |
| 9,299,641 B2 * | 3/2016 | Sekar .................. H01L 23/3677 |
| 9,334,582 B2 | 5/2016 | See |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,673,257 B1 | 6/2017 | Takaki |
| 9,997,530 B2 | 6/2018 | Yon et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 * | 3/2006 | Iino ..................... H01L 21/8221 257/315 |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |

(56) References Cited

U.S. PATENT DOCUMENTS

| | | |
|---|---|---|
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu et al. |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0124845 A1 | 5/2008 | Yu et al. |
| 2008/0128745 A1 | 6/2008 | Mastro et al. |
| 2008/0128780 A1* | 6/2008 | Nishihara ......... H01L 21/8221 257/316 |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0103318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |

(56) References Cited

U.S. PATENT DOCUMENTS

| | | |
|---|---|---|
| 2009/0224330 A1* | 9/2009 | Hong .................. G11C 11/412 257/368 |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1* | 12/2009 | Kim .................... H01L 21/8221 257/314 |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1* | 9/2010 | Awaya ................ H01L 27/2454 257/3 |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0084314 A1* | 4/2011 | Or-Bach ............... G03F 9/7076 257/209 |
| 2011/0092030 A1* | 4/2011 | Or-Bach ............. G06F 17/5072 438/129 |
| 2011/0101537 A1 | 5/2011 | Barth et al. |
| 2011/0102014 A1 | 5/2011 | Madurawe |
| 2011/0108888 A1* | 5/2011 | Or-Bach ............. H01L 21/76254 257/204 |
| 2011/0111560 A1 | 5/2011 | Purushothaman |
| 2011/0115023 A1 | 5/2011 | Cheng |
| 2011/0121366 A1* | 5/2011 | Or-Bach ............. H01L 21/6835 257/204 |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1* | 6/2011 | Augendre ........... H01L 21/8221 257/368 |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0233617 A1* | 9/2011 | Or-Bach ............. H01L 21/76254 257/202 |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0032294 A1* | 2/2012 | Or-Bach ............. H01L 21/26506 257/499 |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0091587 A1* | 4/2012 | Or-Bach ............. H01L 21/6835 257/741 |
| 2012/0126197 A1 | 5/2012 | Chung |
| 2012/0129301 A1* | 5/2012 | Or-Bach ............. H01L 21/6835 438/129 |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193719 A1* | 8/2012 | Or-Bach ............. H01L 21/6835 257/368 |
| 2012/0193785 A1 | 8/2012 | Lin |
| 2012/0220102 A1* | 8/2012 | Or-Bach ............. H01L 21/76254 438/458 |
| 2012/0241919 A1 | 9/2012 | Mitani |

(56) References Cited

U.S. PATENT DOCUMENTS

| | | | |
|---|---|---|---|
| 2012/0286822 A1 | 11/2012 | Madurawe | |
| 2012/0304142 A1 | 11/2012 | Morimoto | |
| 2012/0317528 A1 | 12/2012 | McIlrath | |
| 2012/0319728 A1 | 12/2012 | Madurawe | |
| 2013/0020707 A1* | 1/2013 | Or-Bach | B82Y 10/00 257/741 |
| 2013/0026663 A1 | 1/2013 | Radu et al. | |
| 2013/0037802 A1 | 2/2013 | England | |
| 2013/0049796 A1 | 2/2013 | Pang | |
| 2013/0070506 A1 | 3/2013 | Kajigaya | |
| 2013/0082235 A1* | 4/2013 | Gu | H01L 21/8258 257/9 |
| 2013/0097574 A1 | 4/2013 | Balabanov et al. | |
| 2013/0100743 A1 | 4/2013 | Lue | |
| 2013/0128666 A1 | 5/2013 | Avila | |
| 2013/0187720 A1 | 7/2013 | Ishii | |
| 2013/0193550 A1 | 8/2013 | Sklenard et al. | |
| 2013/0196500 A1* | 8/2013 | Batude | H01L 21/76843 438/627 |
| 2013/0203248 A1 | 8/2013 | Ernst et al. | |
| 2013/0241026 A1* | 9/2013 | Or-Bach | H01L 21/8221 257/506 |
| 2013/0263393 A1 | 10/2013 | Mazumder | |
| 2013/0337601 A1 | 12/2013 | Kapur | |
| 2014/0015136 A1 | 1/2014 | Gan et al. | |
| 2014/0048867 A1 | 2/2014 | Toh | |
| 2014/0098594 A1* | 4/2014 | Azuma | H01L 27/2418 365/148 |
| 2014/0099761 A1 | 4/2014 | Kim et al. | |
| 2014/0103959 A1 | 4/2014 | Andreev | |
| 2014/0117413 A1 | 5/2014 | Madurawe | |
| 2014/0120695 A1 | 5/2014 | Ohtsuki | |
| 2014/0131885 A1 | 5/2014 | Samadi et al. | |
| 2014/0137061 A1 | 5/2014 | McIlrath | |
| 2014/0145347 A1 | 5/2014 | Samadi et al. | |
| 2014/0146630 A1 | 5/2014 | Xie et al. | |
| 2014/0149958 A1 | 5/2014 | Samadi et al. | |
| 2014/0151774 A1 | 6/2014 | Rhie | |
| 2014/0191357 A1 | 7/2014 | Lee | |
| 2014/0225218 A1 | 8/2014 | Du | |
| 2014/0225235 A1 | 8/2014 | Du | |
| 2014/0252306 A1 | 9/2014 | Du | |
| 2014/0253196 A1 | 9/2014 | Du et al. | |
| 2014/0264228 A1 | 9/2014 | Toh | |
| 2014/0357054 A1 | 12/2014 | Son et al. | |
| 2015/0037942 A1* | 2/2015 | Mouli | B82Y 10/00 438/157 |
| 2015/0123072 A1* | 5/2015 | Sekar | H01L 21/268 257/5 |
| 2015/0243887 A1 | 8/2015 | Saitoh | |
| 2015/0249053 A1* | 9/2015 | Or-Bach | H01L 23/5386 257/401 |
| 2015/0255418 A1 | 9/2015 | Gowda | |
| 2015/0340316 A1* | 11/2015 | Or-Bach | G11C 5/025 257/2 |
| 2015/0340369 A1 | 11/2015 | Lue | |
| 2015/0348945 A1* | 12/2015 | Or-Bach | H01L 21/743 257/384 |
| 2016/0049201 A1 | 2/2016 | Lue | |
| 2016/0104780 A1 | 4/2016 | Mauder | |
| 2016/0133603 A1 | 5/2016 | Ahn | |
| 2016/0141299 A1 | 5/2016 | Hong | |
| 2016/0141334 A1 | 5/2016 | Takaki | |
| 2016/0307952 A1 | 10/2016 | Huang | |
| 2016/0343687 A1 | 11/2016 | Vadhavkar | |
| 2017/0069601 A1 | 3/2017 | Park | |
| 2017/0092371 A1 | 3/2017 | Harari | |
| 2017/0098596 A1 | 4/2017 | Lin | |
| 2017/0148517 A1 | 5/2017 | Harari | |
| 2017/0179146 A1 | 6/2017 | Park | |
| 2017/0221900 A1 | 8/2017 | Widjaja | |
| 2018/0090368 A1 | 3/2018 | Eun-Jeong et al. | |
| 2018/0108416 A1 | 4/2018 | Harari | |
| 2018/0294284 A1 | 10/2018 | Tarakji | |

OTHER PUBLICATIONS

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et. al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (φFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

(56) References Cited

OTHER PUBLICATIONS

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.

Bobba, S. et al., "CELONCEL: Effective Design Technique for 3-D Monolithic Integration targeting High Performance Integrated Circuits", Asia pacific DAC 2011, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "'Three Dimensionally Stacked NAND Flash Memory Technology Using Stacking Single Crystal Si Layers on ILD and TANOS Structure for Beyond 30nm Node'", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.

(56) References Cited

OTHER PUBLICATIONS

Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",w-ww.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.

(56) References Cited

OTHER PUBLICATIONS

Wu, B., et al., "Extreme ultraviolet lithography and three dimensional circuits," Applied Phyisics Reviews, 1, 011104 (2014).

Delhougne, R., et al., "First Demonstration of Monocrystalline Silicon Macaroni Channel for 3-D NAND Memory Devices" IEEE VLSI Tech Digest, 2018, pp. 203-204.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T. et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development, vol. 52, No. 4.5, pp. 449-464, Jul. 2008.

Bez, R., et al., "Introduction to Flash memory," Proceedings IEEE, 91(4), 489-502 (2003).

Auth, C. et al., "45nm High-k+Metal Gate Strain-Enchanced Transistors," Symposium on VLSI Technology . Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et.al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to-2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr. and Meth. in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

Vengurlekar, A., et al., "Mechanism of Dopant Activation Enhancement in Shallow Junctions by Hydrogen", Proceedings of the Materials Research Society, vol. 864, Spring 2005, E9.28.1-6.

Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.

Guo, X. et al., "Cascade single-chip phosphor-free white light emitting diodes," Applied Physics Letters, 2008, pp. 013507-1-013507-3, vol. 92.

Takafuji, Y. et al., "Integration of Single Crystal Si TFTs and Circuits on a Large Glass Substrate," IEEE International Electron Devices Meeting (IEDM), Dec. 7-9, 2009, pp. 1-4.

Wierer, J.J. et al., "High-power AlGaInN flip-chip light-emitting diodes, " Applied Physics Letters, May 28, 2001, pp. 3379-3381, vol. 78, No. 22.

El-Gamal, A., "Trends in CMOS Image Sensor Technology and Design," International Electron Devices Meeting Digest of Technical Papers, Dec. 2002.

Ahn, S.W., "Fabrication of a 50 nm half-pitch wire grid polarizer using nanoimprint lithography," Nanotechnology, 2005, pp. 1874-1877, vol. 16, No. 9.

Johnson, R.C., "Switching LEDs on and off to enlighten wireless communications," EE Times, Jun. 2010, last accessed Oct. 11, 2010, <http://www.embeddedinternetdesign.com/design/225402094>.

Ohsawa, et al., "Autonomous Refresh of Floating Body Cell (FBC)", International Electron Device Meeting, 2008, pp. 801-804.

Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.

Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.

(56) References Cited

OTHER PUBLICATIONS

Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedingss—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.

(56) References Cited

OTHER PUBLICATIONS

Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore'S Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Agarwal, A., et al., "Efficient production of silicon-on-insulator films by co-implantation of He+ with H+" Applied Physics Letters, vol. 72, No. 9, Mar. 1998, pp. 1086-1088.

(56) References Cited

OTHER PUBLICATIONS

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process: A New SOI wafer fabrication method", Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate $SiO2$," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al.,"Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

\* cited by examiner

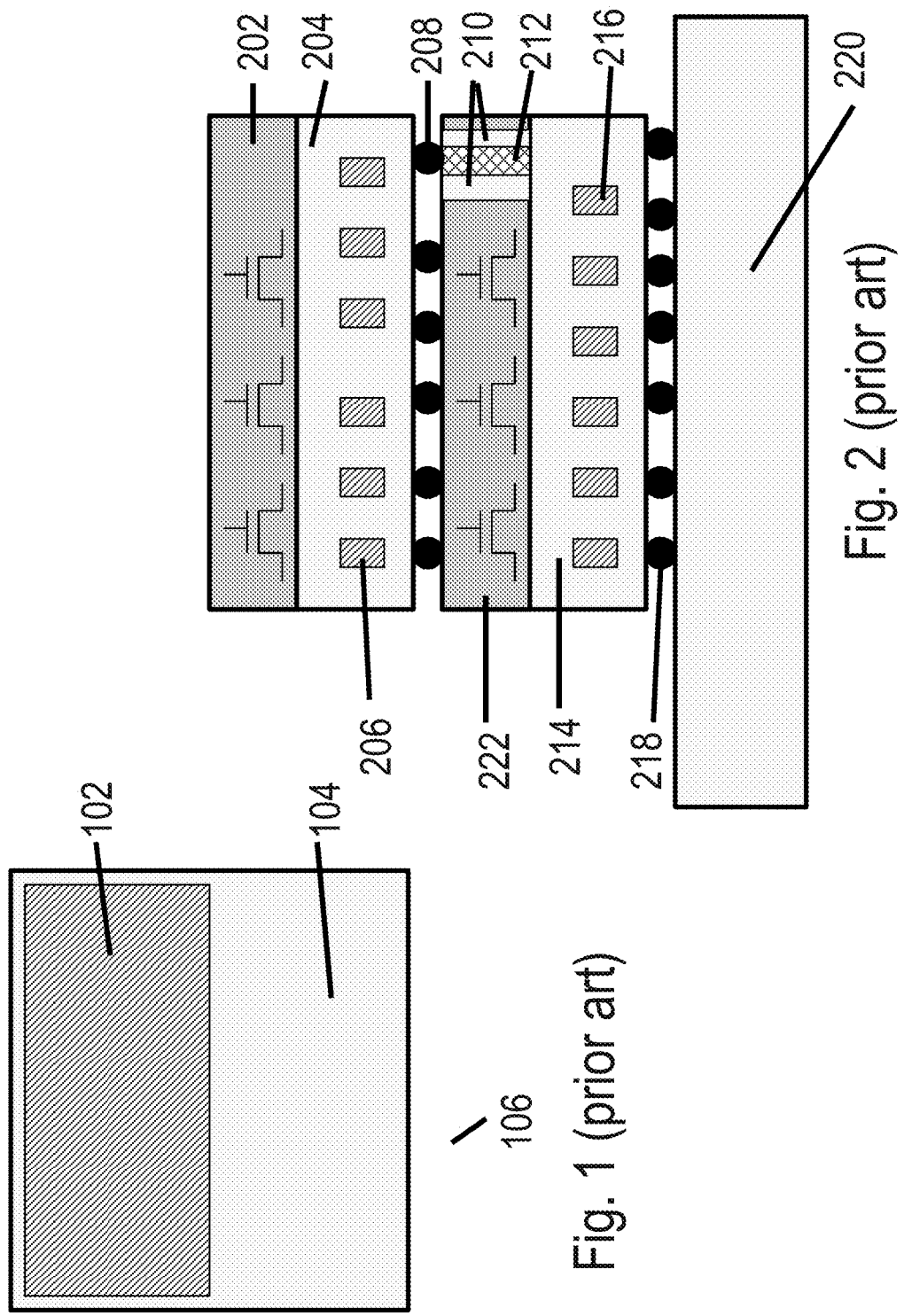

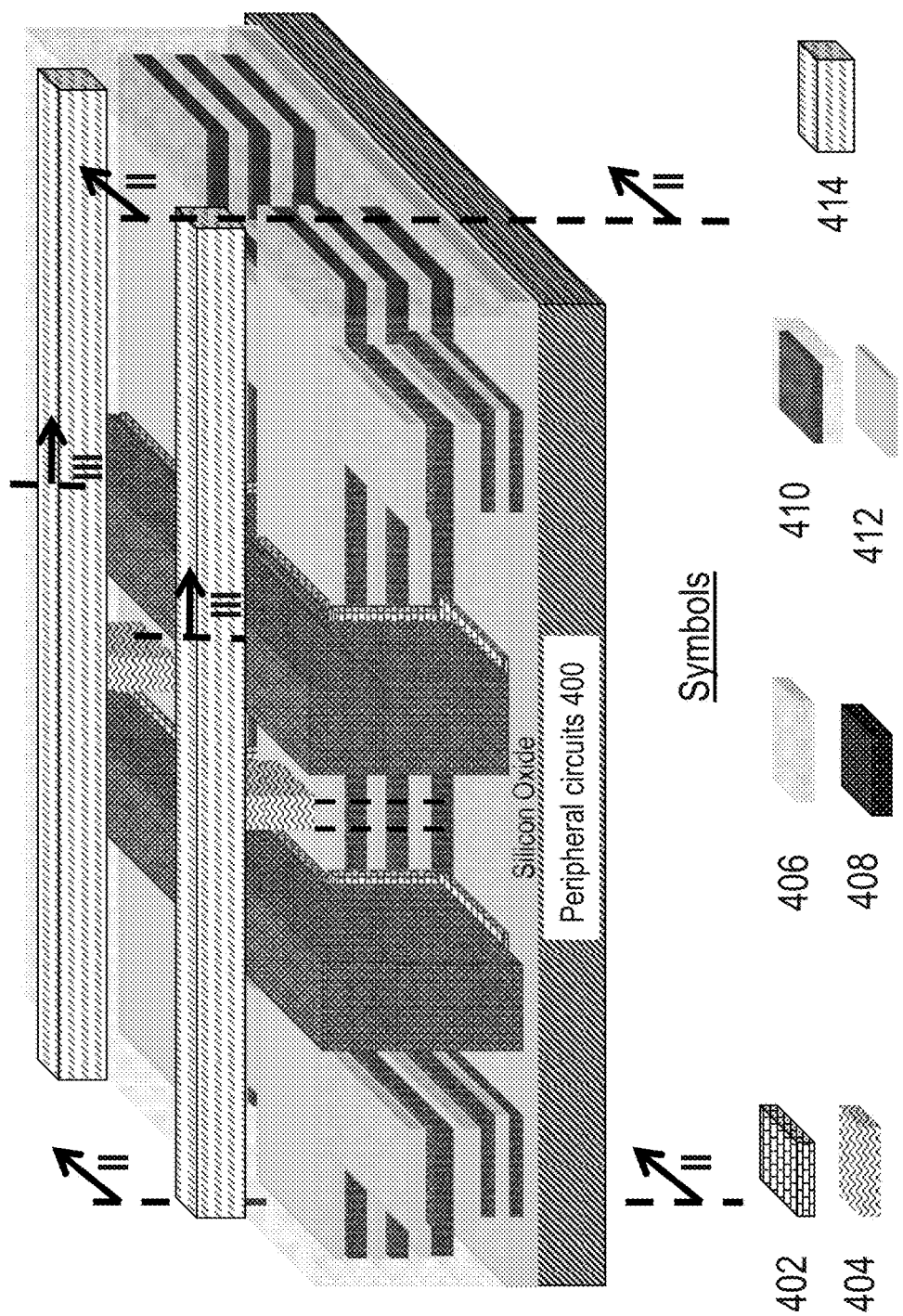

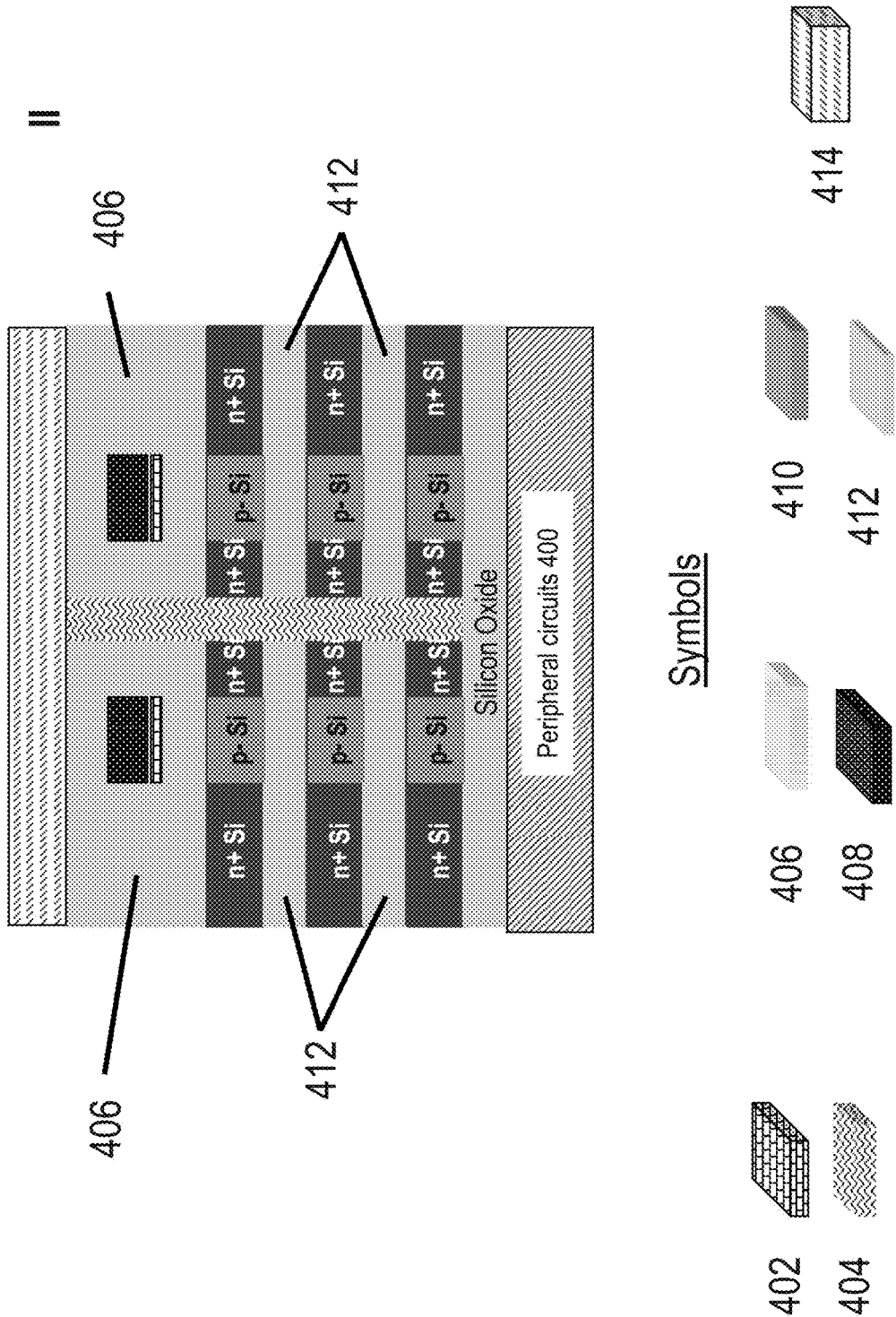

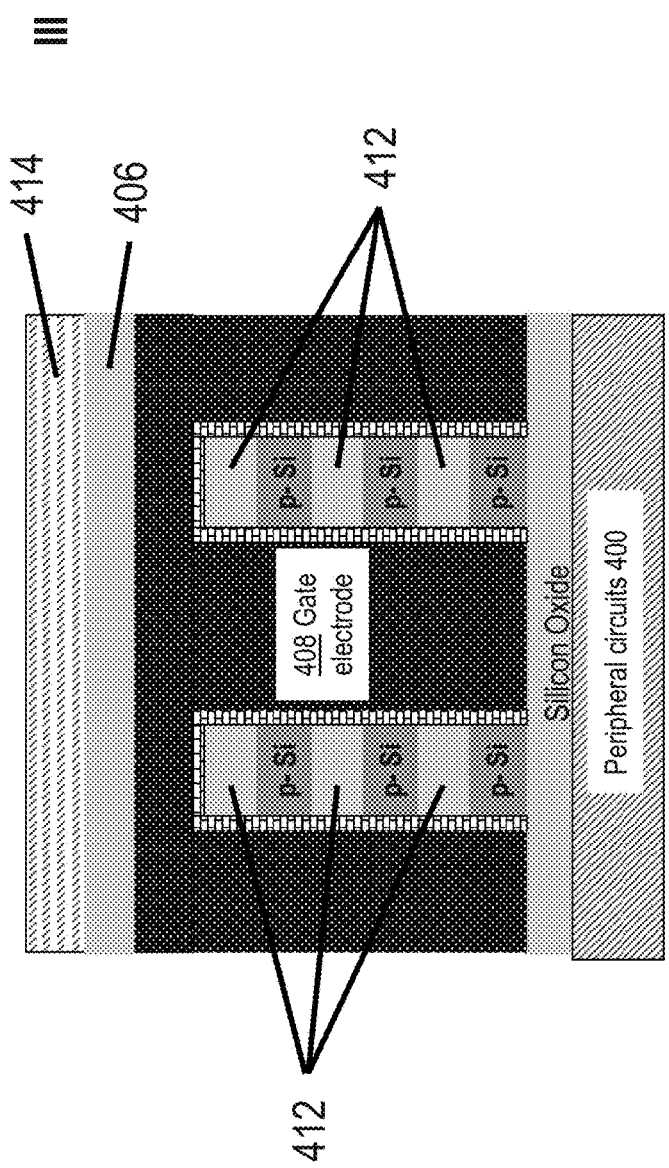
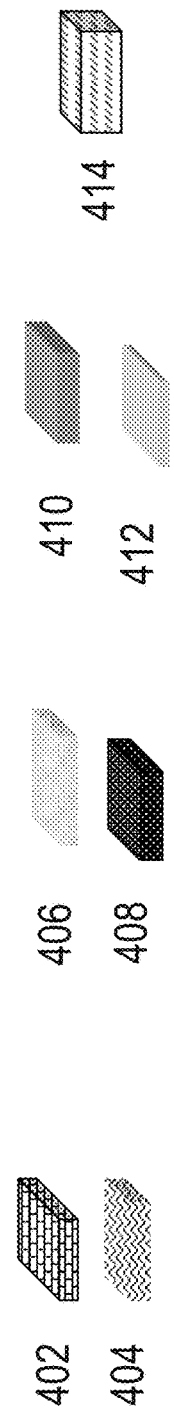
Fig. 4C

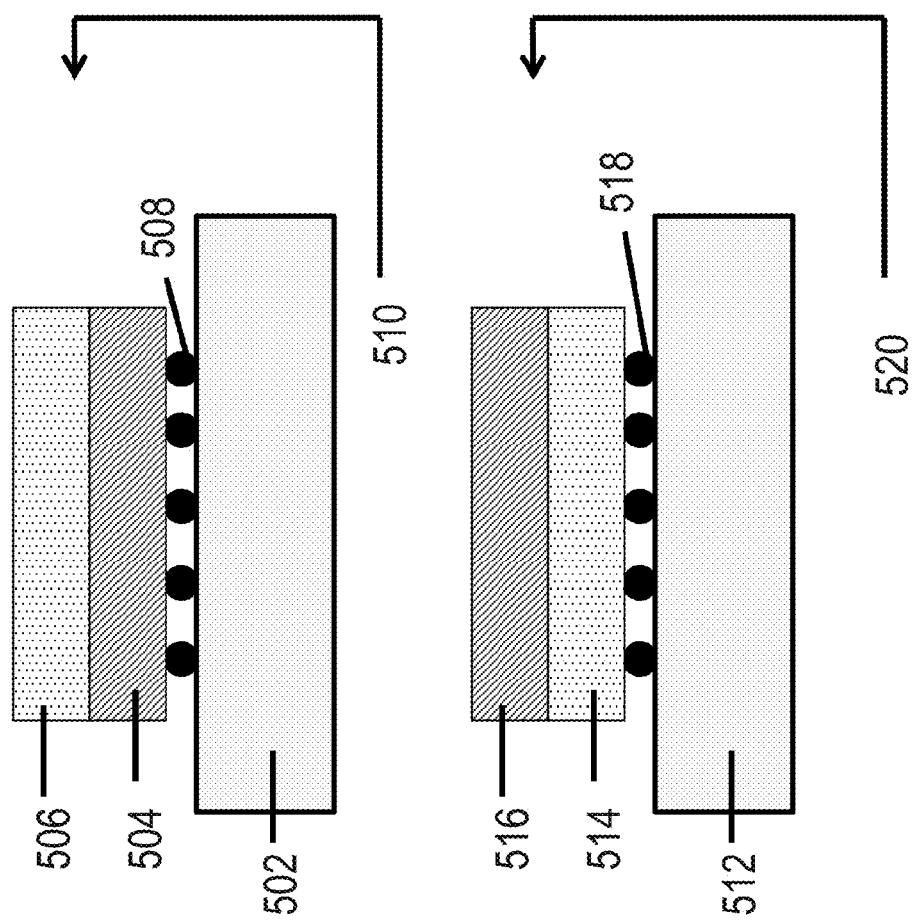

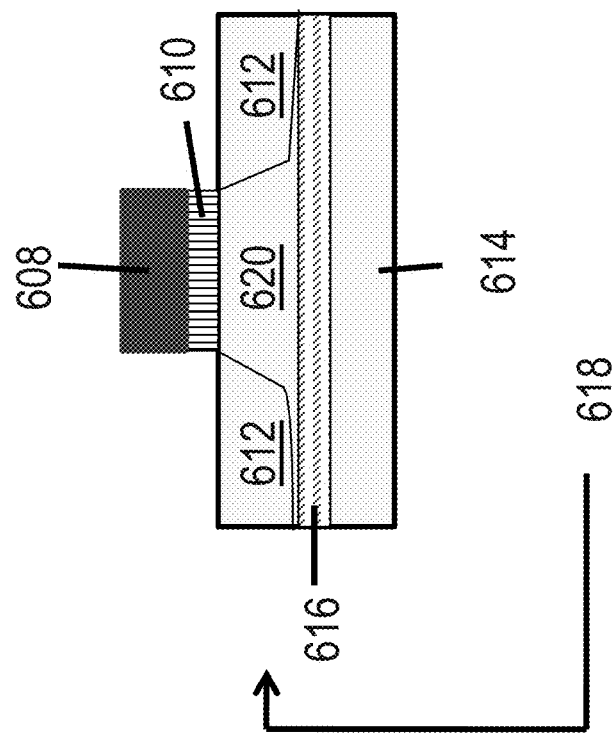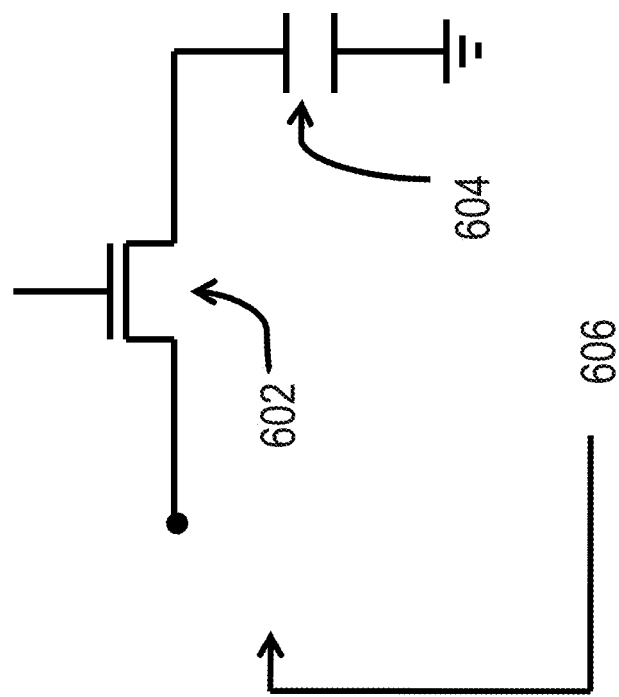
Fig. 6

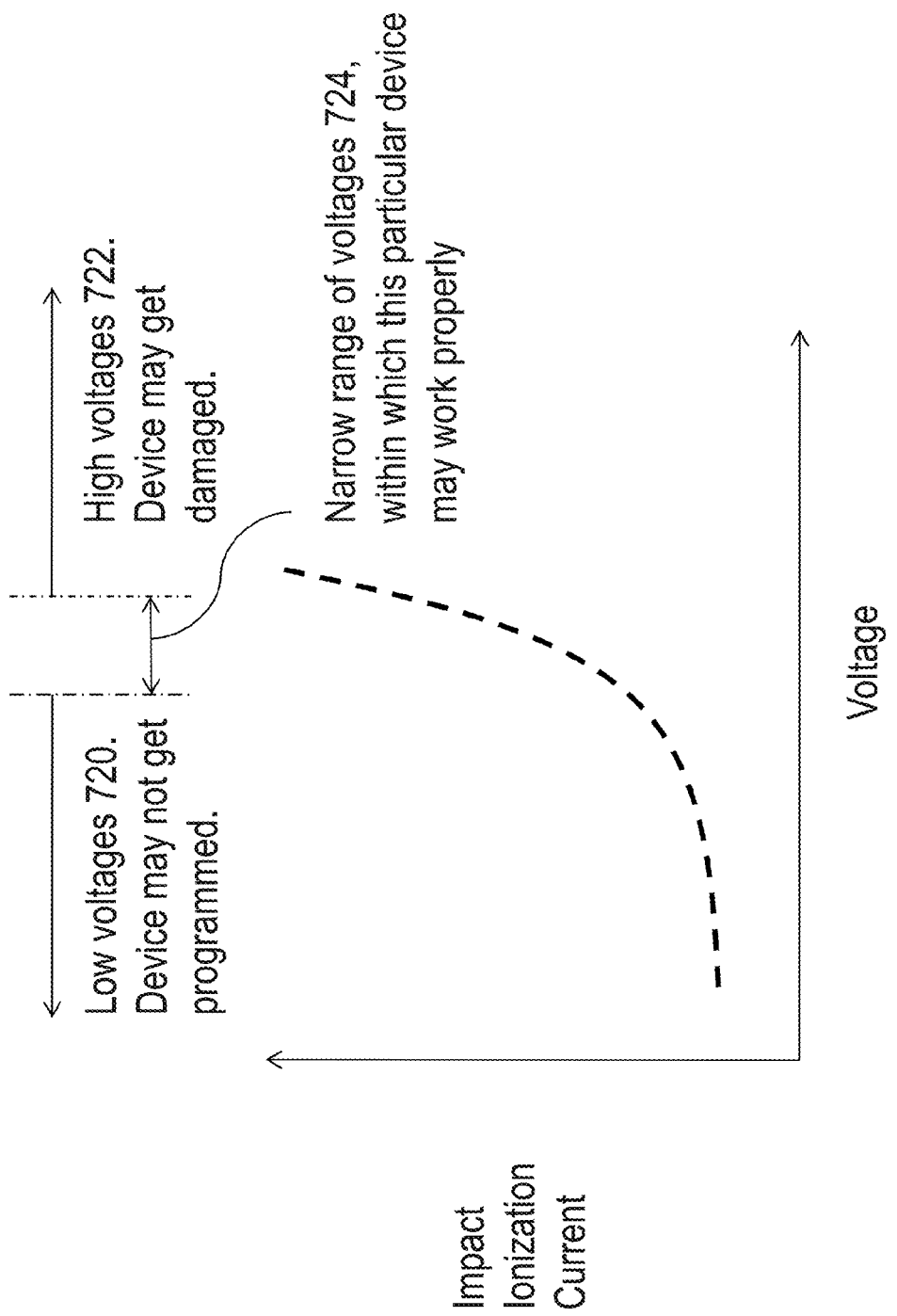

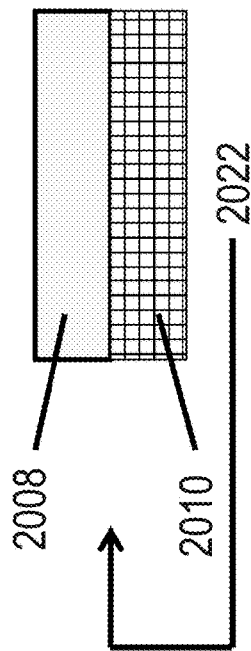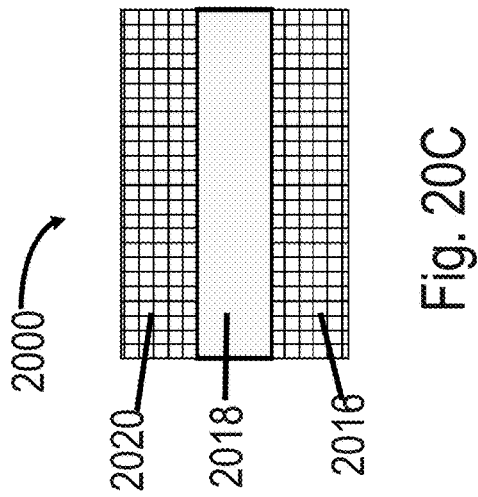
Fig. 20B
Fig. 20C
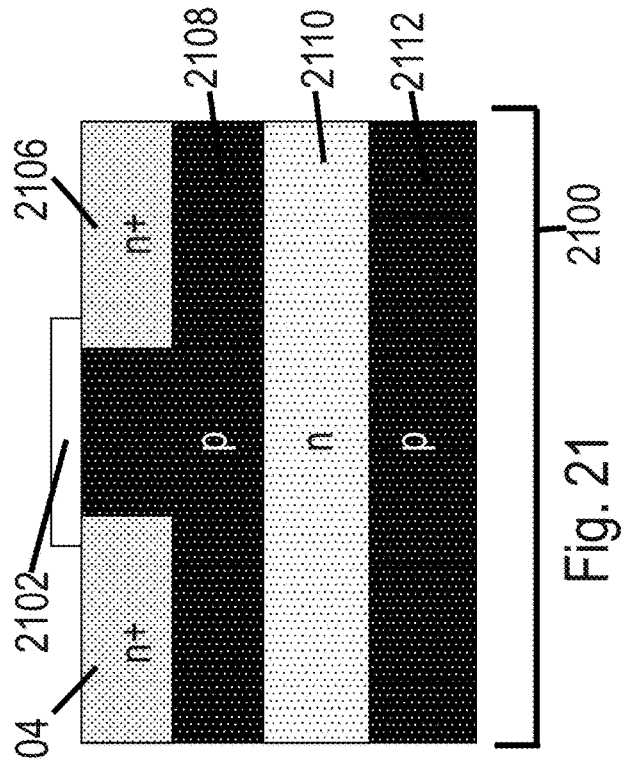
Fig. 21

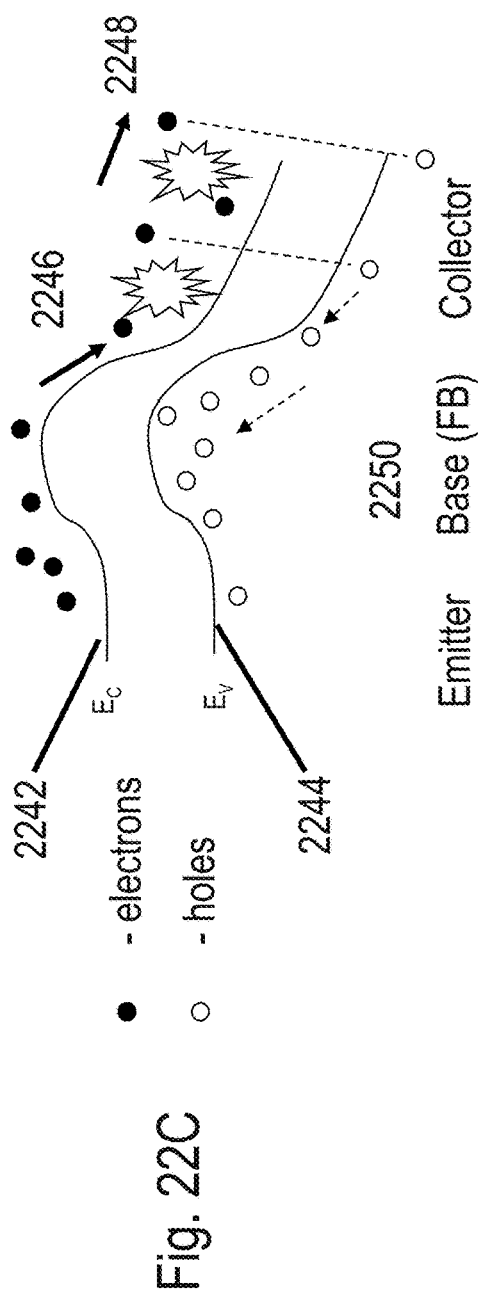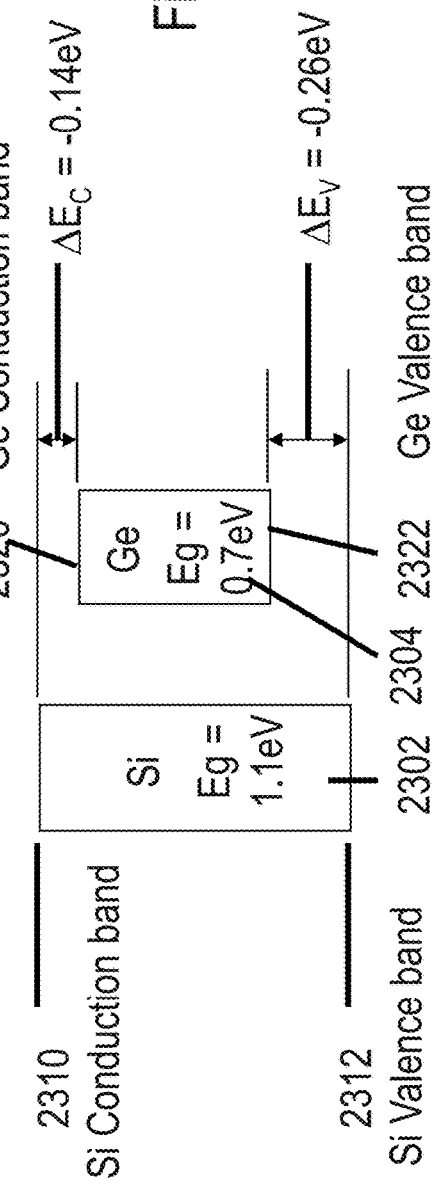

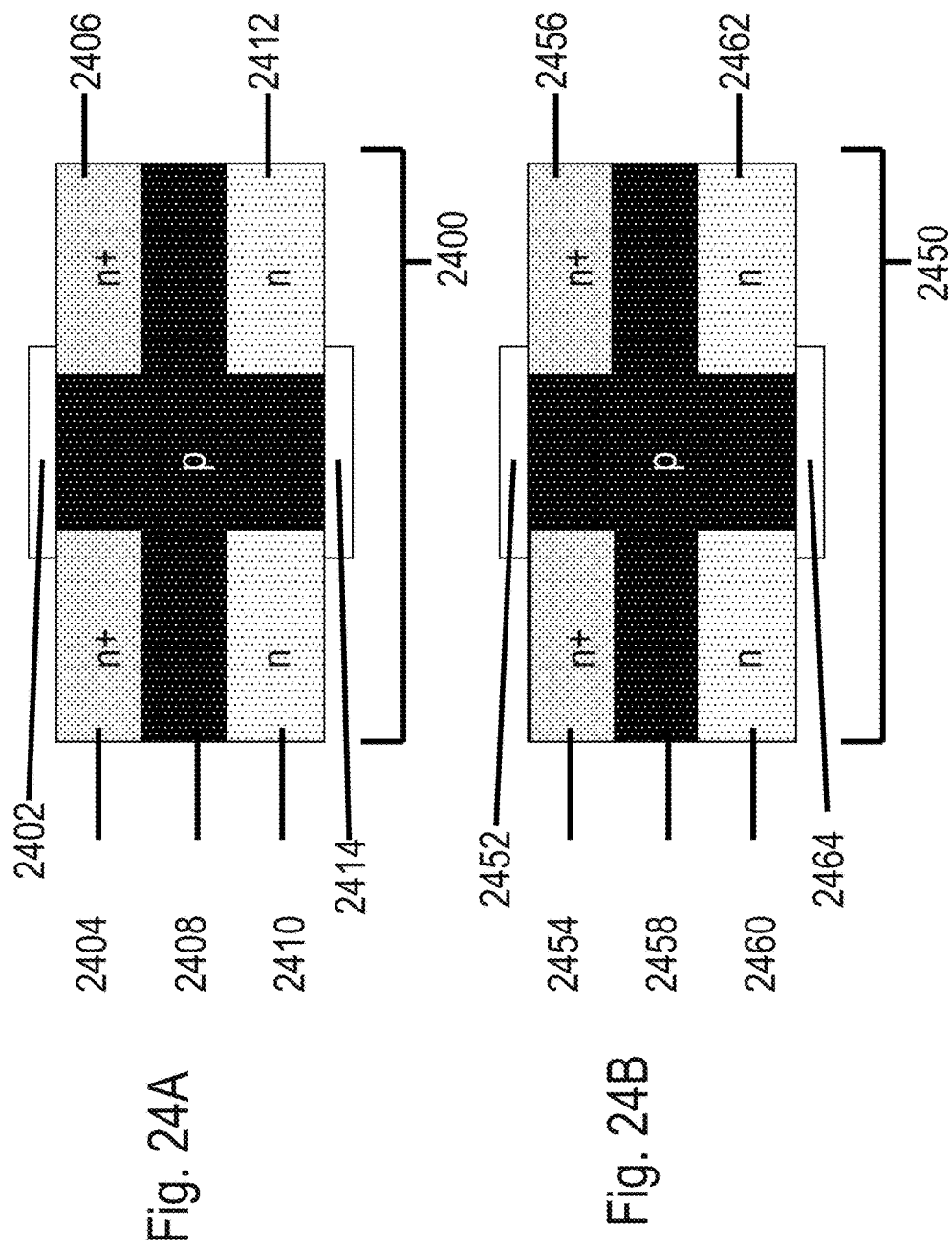

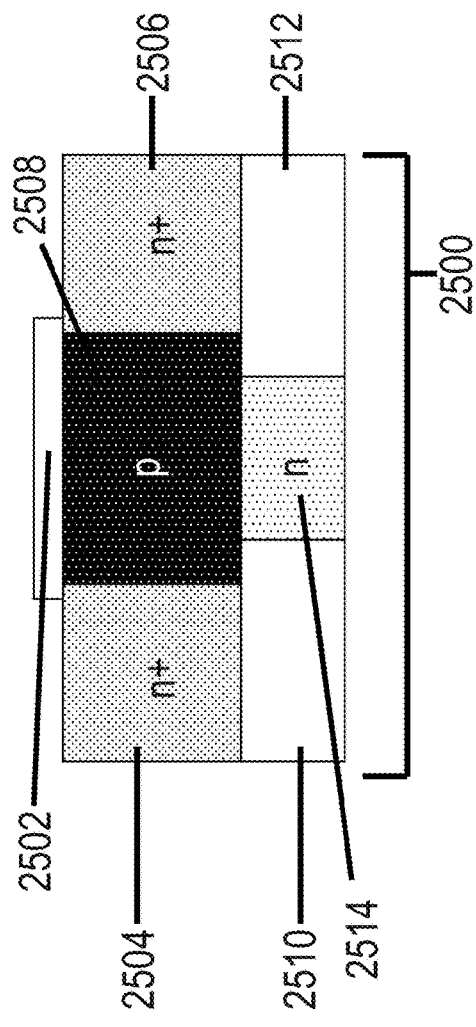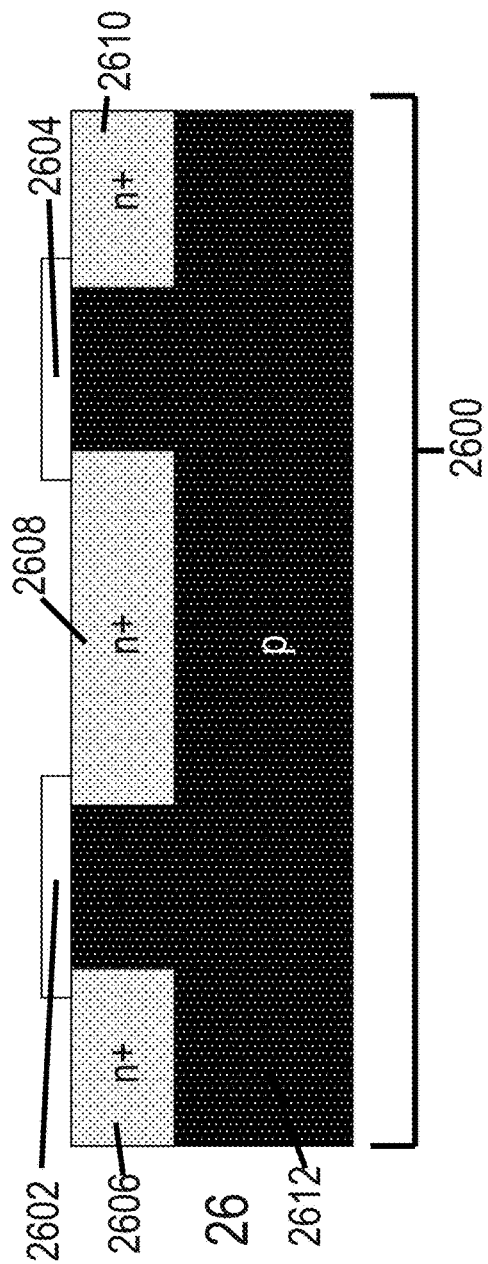
Fig. 25
Fig. 26

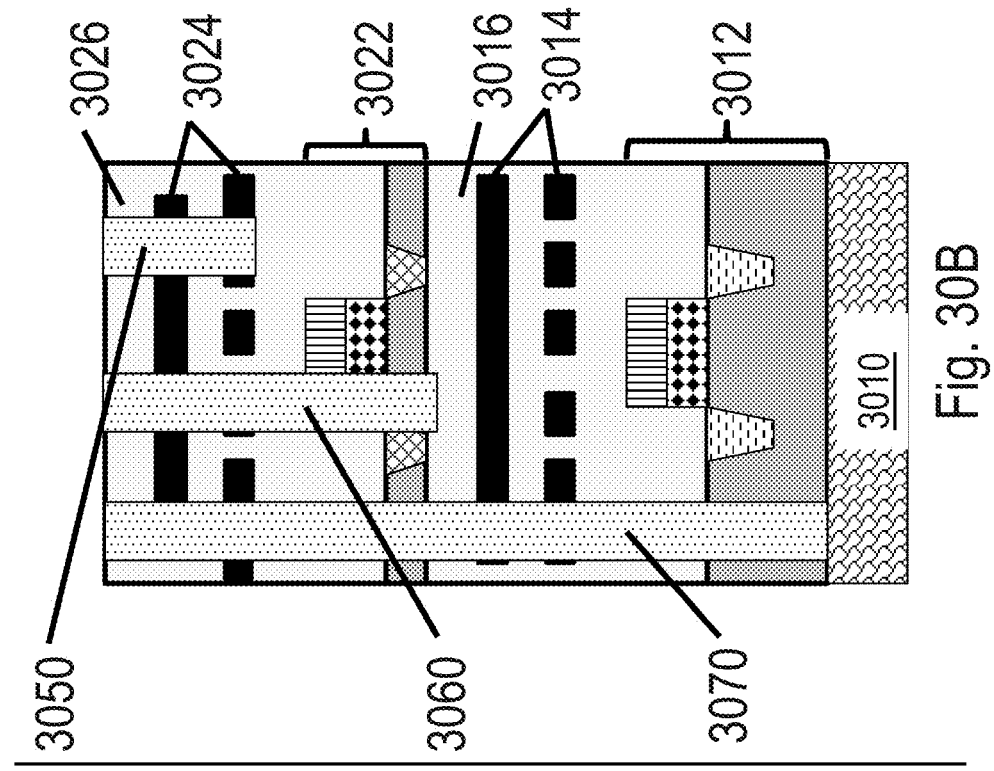
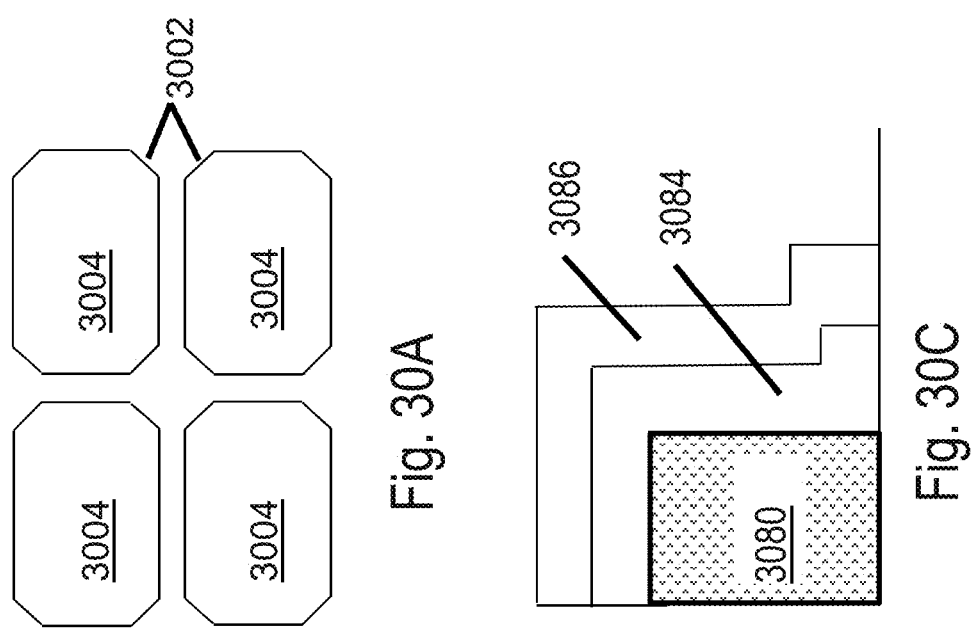
Fig. 30B
Fig. 30A
Fig. 30C

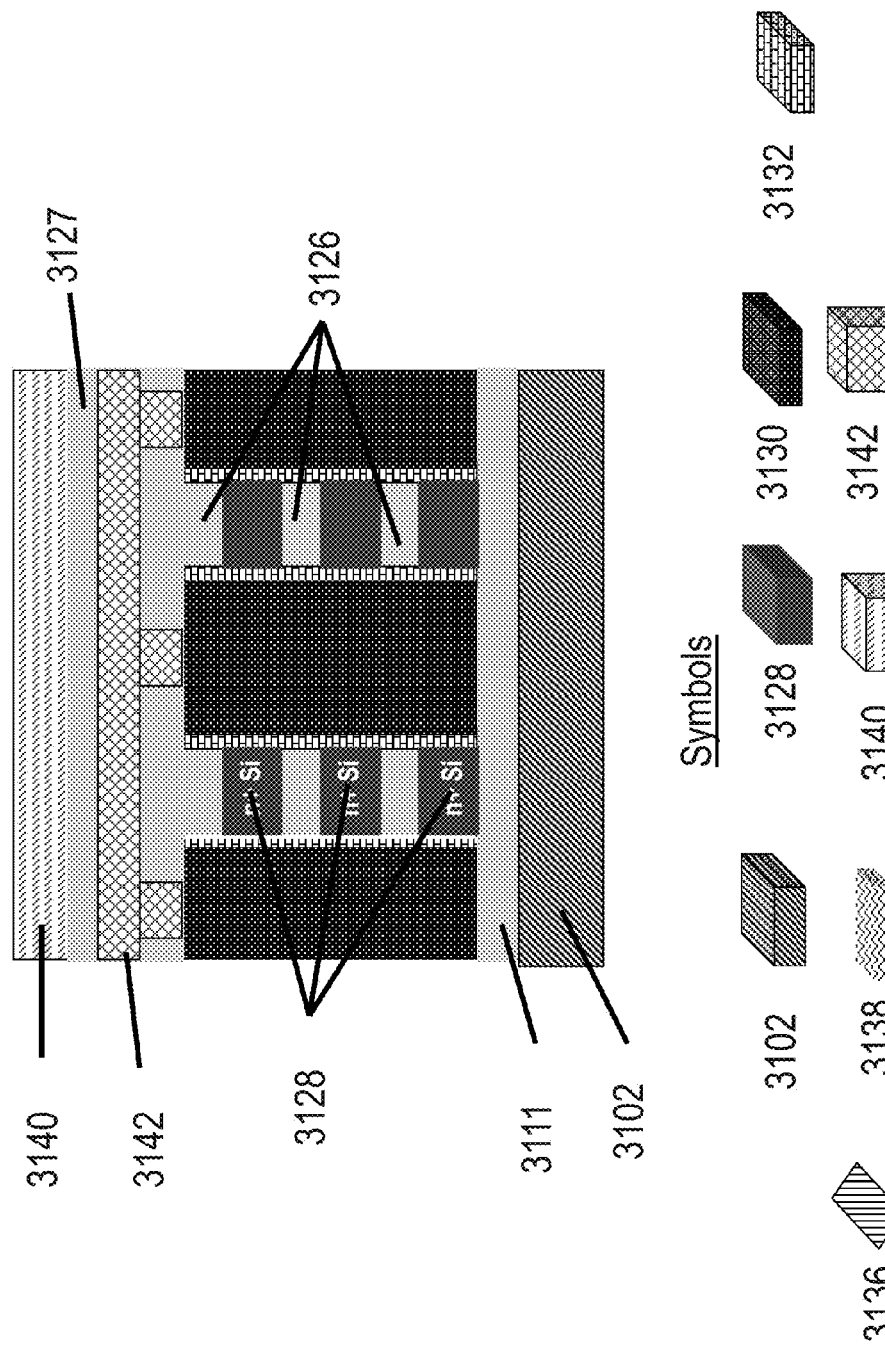

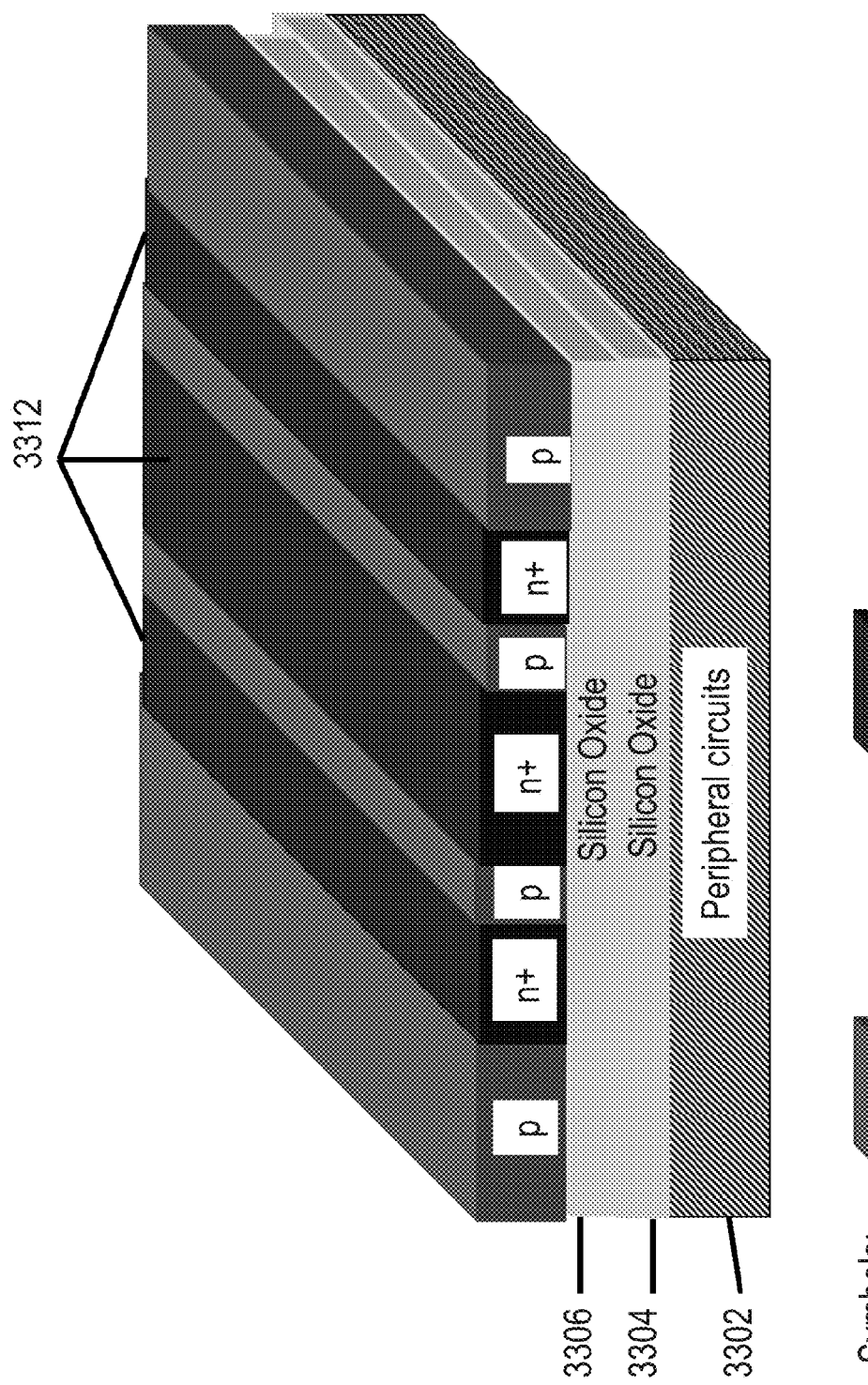

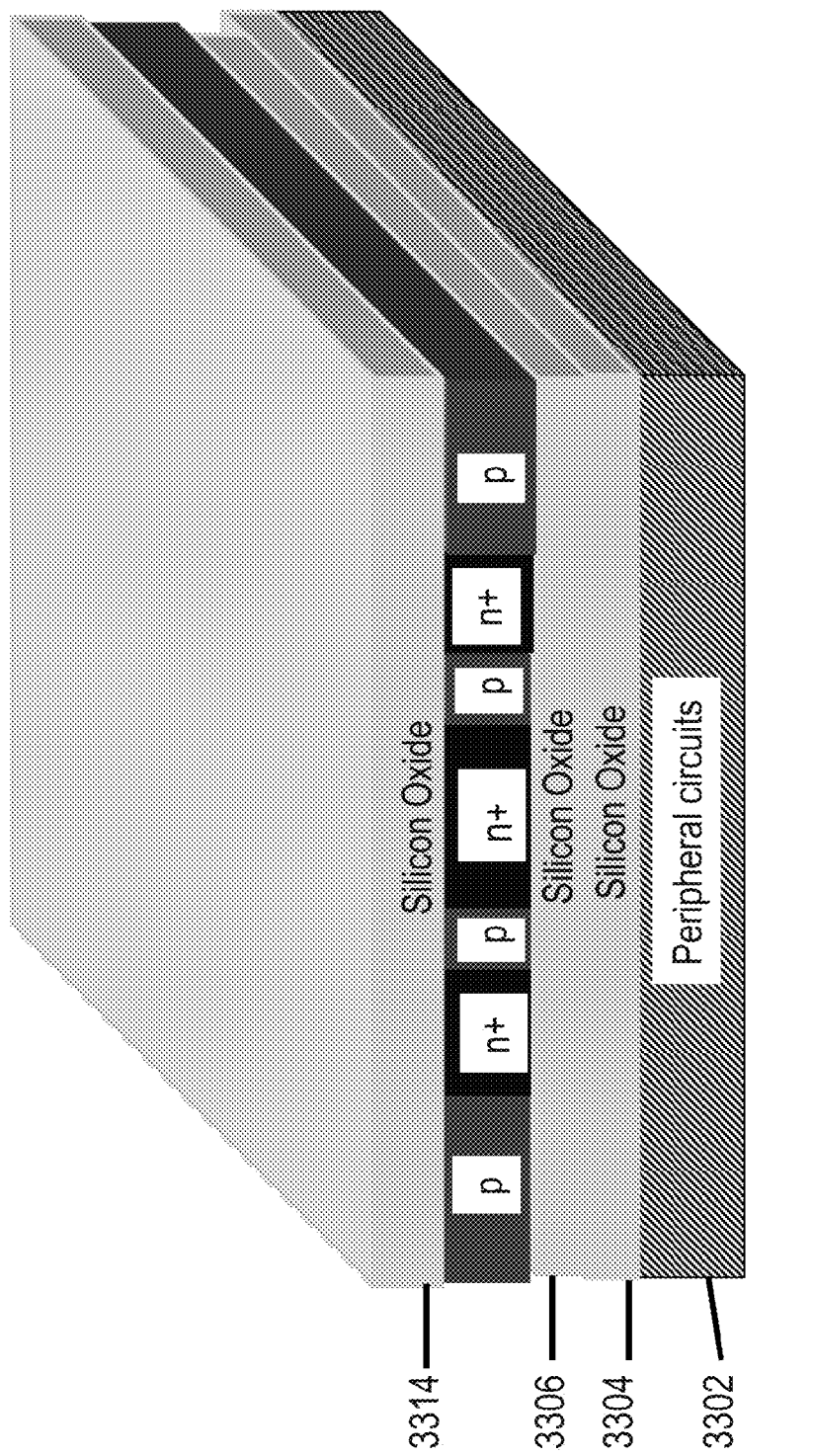

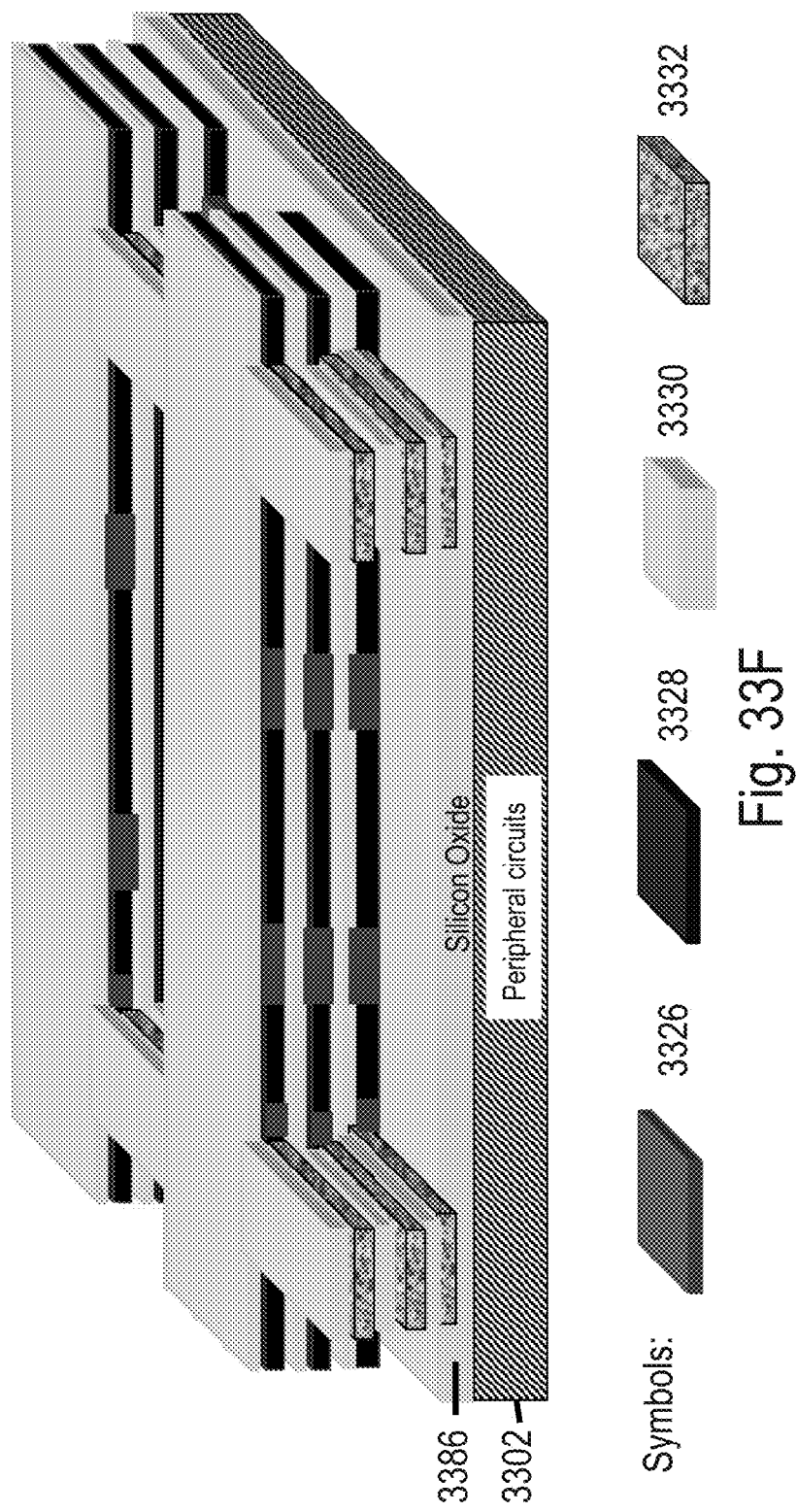

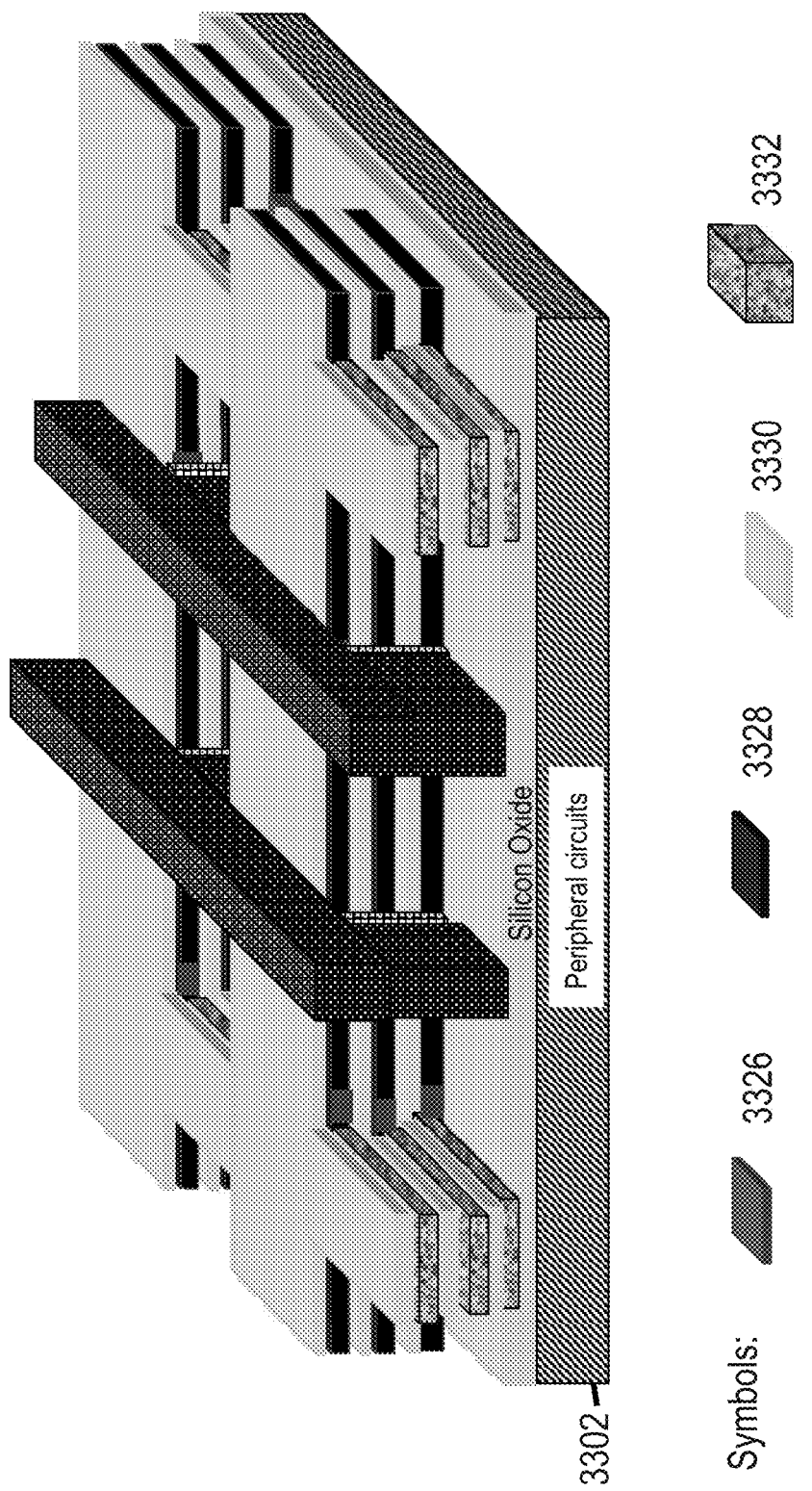

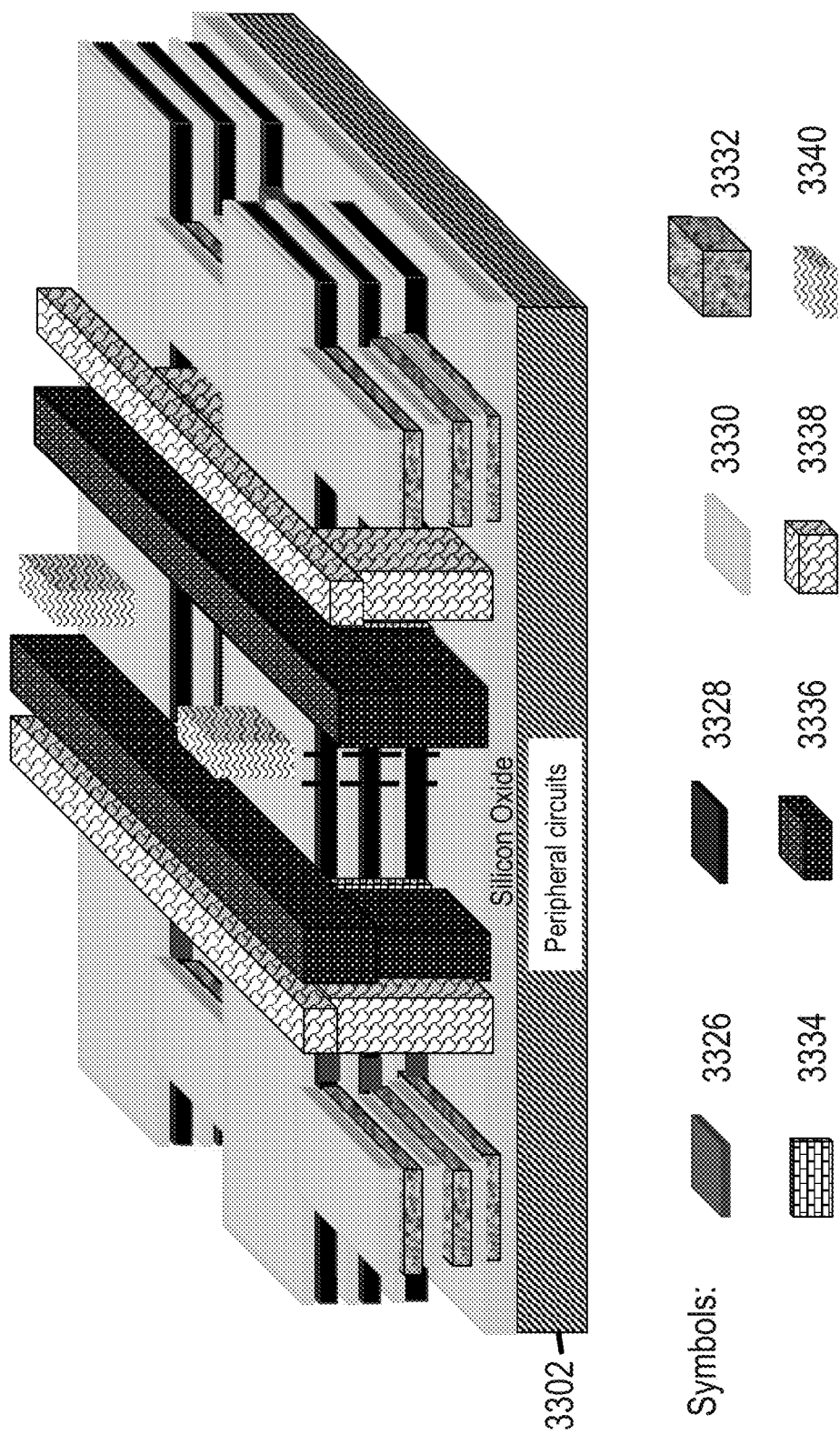

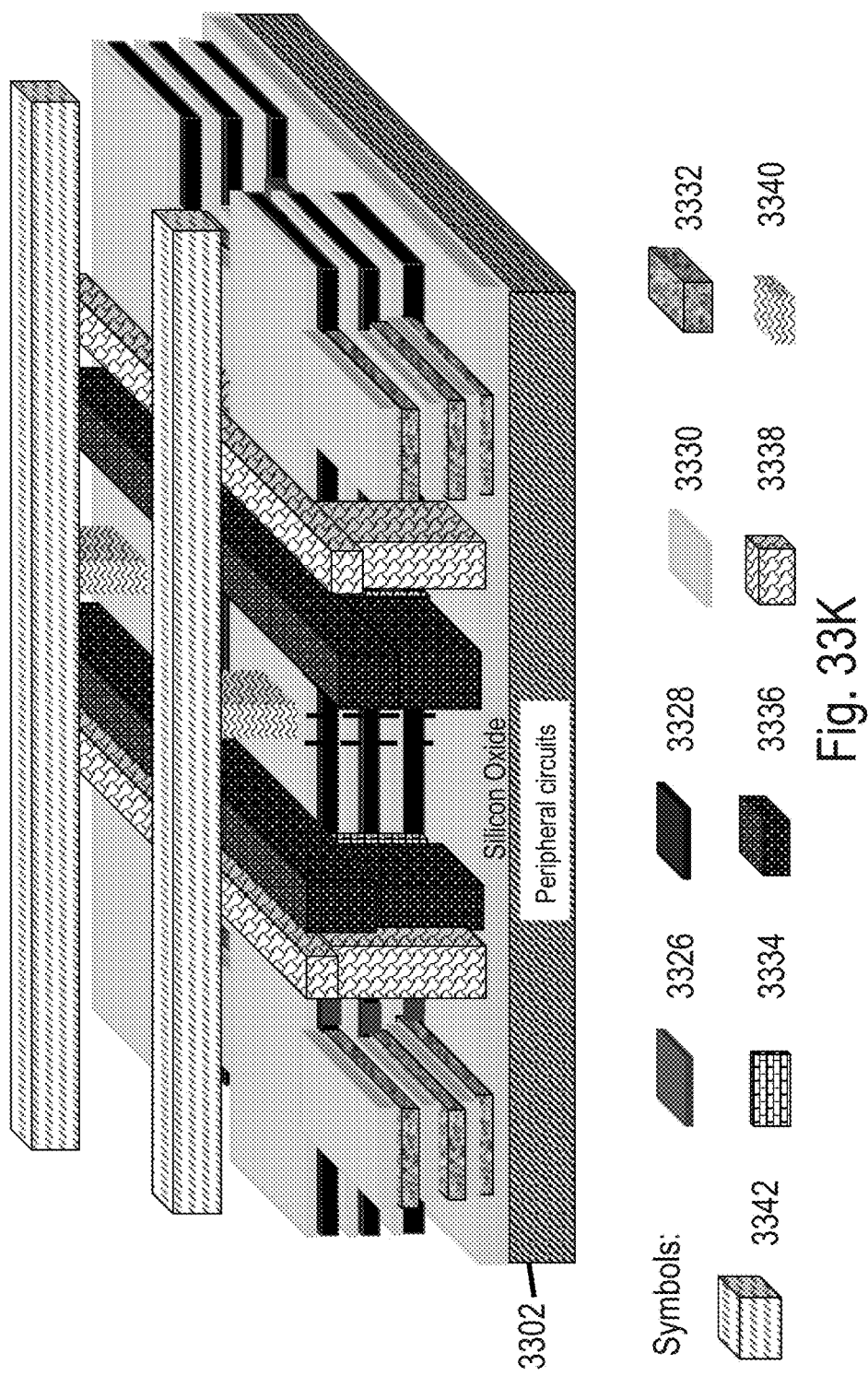

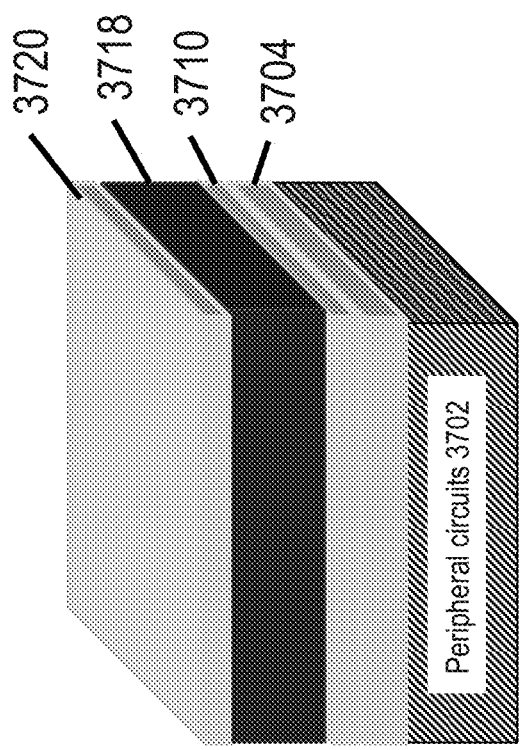
Fig. 37C

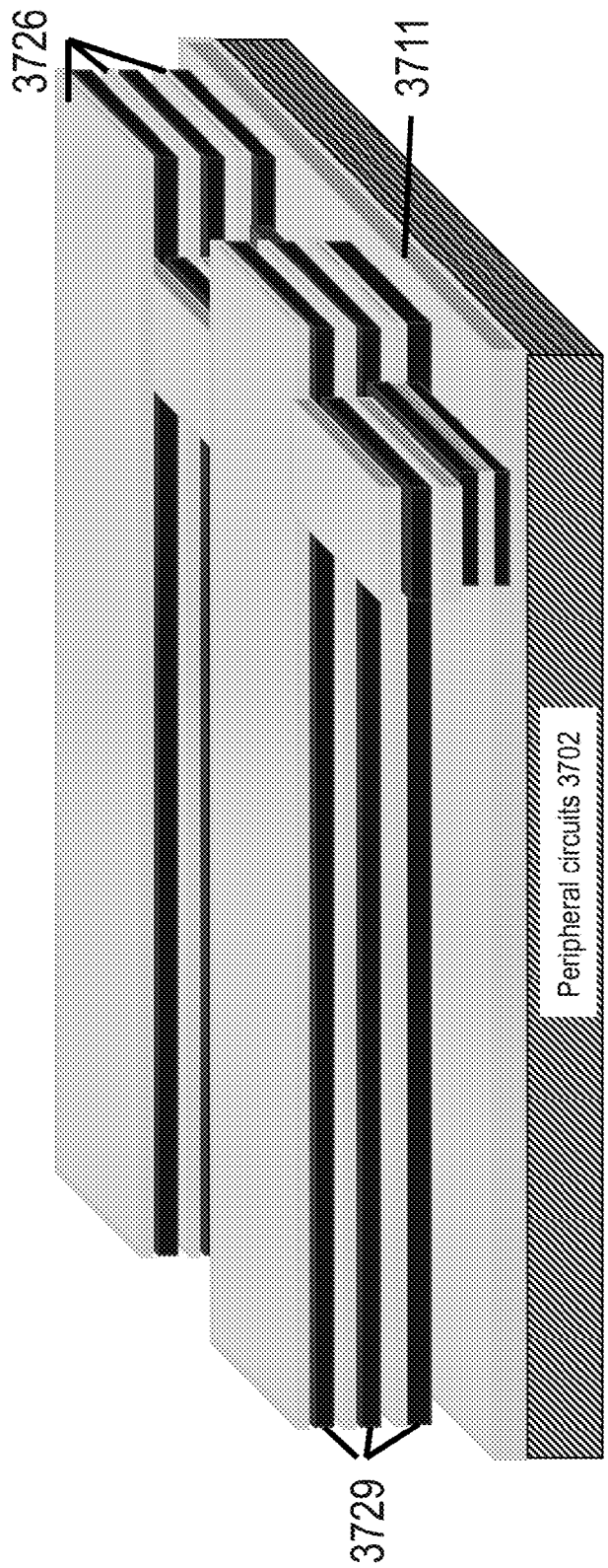
Symbols
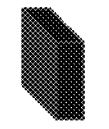 Transistor/programmable resistor structure regions 3729
 3726/3711
Fig. 37H

SEMICONDUCTOR DEVICE AND STRUCTURE

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Logic chips such as microprocessors and Systems-on-Chips (SoCs) typically include a significant amount of on-die memory. This on-die memory can be in the form of Static Random Access Memory (SRAM), Dynamic Random Access Memory (DRAM), Flash Memory and/or another type of memory. In many chips today, as much as 50%-80% of the die area could be consumed by these memory types. Additionally, integrating memories such as DRAM with logic technologies may be difficult, and may add additional costs. Techniques to reduce area overhead of memories embedded on the chip, henceforth referred to as embedded memory, will be useful. Methods to improve performance of embedded memories, reduce power consumption, and reduce integration penalties with logic technologies will also be helpful.

3D stacking of semiconductor chips is one avenue to tackle issues with embedded memories. By arranging transistors in 3 dimensions instead of 2 dimensions (as was the case in the 1990s), embedded memories can be placed in a separate device layer from the logic transistors. This may allow unique optimization of logic and memory transistors and interconnects. However, there may be many barriers to practical implementation of 3D stacked chips. These include:

Constructing transistors in ICs typically require high temperatures (higher than about 700° C.) while wiring levels are constructed at low temperatures (lower than about 400° C.). Copper or Aluminum wiring levels, in fact, can get damaged when exposed to temperatures higher than about 400° C. If transistors were arranged in 3 dimensions along with wires, it may have the challenge described below. For example, consider a 2 layer stack of transistors and wires, i.e. Bottom Transistor Layer, above it Bottom Wiring Layer, above it Top Transistor Layer and above it Top Wiring Layer. When the Top Transistor Layer is constructed using Temperatures higher than about 700° C., it can damage the Bottom Wiring Layer.

Generally due to the above mentioned problem with forming transistor layers above wiring layers at temperatures lower than about 400° C., the semiconductor industry has largely explored alternative architectures for 3D stacking. In these alternative architectures, Bottom Transistor Layers, Bottom Wiring Layers and Contacts to the Top Layer may be constructed on one silicon wafer. Top Transistor Layers, Top Wiring Layers and Contacts to the Bottom Layer may be constructed on another silicon wafer. These two wafers may be bonded to each other and contacts may be aligned, bonded and connected to each other. Unfortunately, the size of Contacts to the other Layer may be large and the number of these Contacts may be small. In fact, prototypes of 3D stacked chips today utilize as few as about 10,000 conductive connections between two layers ('vertical connectivity'), compared to billions of conductive connections within a layer ('horizontal connectivity'). This low connectivity between layers may be because of two reasons: (i) Landing pad size may need to be relatively large due to alignment issues during wafer bonding. These could be due to many reasons, including bowing of wafers to be bonded to each other, thermal expansion differences between the two wafers, and lithographic or placement misalignment. This misalignment between two wafers may potentially limit the minimum contact landing pad area for electrical connection between two layers; (ii) The contact size may need to be relatively large. Forming contacts to another stacked wafer typically may involve having a Through-Silicon Via (TSV) on a chip. Etching deep holes in silicon with small lateral dimensions and filling them with dielectric and metal to form TSVs may not be easy. This may place a restriction on lateral dimensions of TSVs, which in turn may impact TSV density and contact density to another stacked layer. Therefore, connectivity between two the embedded memory and logic transistors may be limited.

U.S. Pat. No. 7,052,941 from Sang-Yun Lee ("S-Y Lee") describes methods to construct embedded memories with vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it may be difficult to convince the industry to move to vertical transistor technology.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,902,663, 8,994,404, 9,021,414, 9,023,688, 9,030,858; US patent publications 2011/0092030 and 2013/0020707; and pending U.S. patent application Ser. Nos. 13/836,080, 62/077,280, 62/042,229, 13/803,437, 61/932,617, 14/607,077, 14/642,724, 62/139,636, 62/149,651, and 62/198,126. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753,913, 8,823,122, and U.S. patent application Ser. Nos. 13/274,161 and 14/461,539. The entire contents of the foregoing patents, publications, and applications are incorporated herein by reference.

It is highly desirable to circumvent these issues and build 3D stacked embedded memories with a reasonable connection density to logic transistors.

SUMMARY

The invention may be directed to multilayer or Three Dimensional Integrated Circuit (3D IC) devices and fabrication methods.

In an aspect, a 3D device, including: a first layer including a first memory including a first transistor; and a second layer including a second memory including a second transistor; where the second transistor is self-aligned to the first transistor, and where the first transistor and the second transistor each being a junction-less transistor.

In another aspect, a 3D device, including: a first layer including a first memory including a first transistor; and a second layer including a second memory including a second transistor; where the second transistor is self-aligned to the first transistor, and where the first transistor source, drain and channel have the same dopant type.

In another aspect, a 3D device, including: a first layer including a first memory including a first transistor; and a second layer including a second memory including a second transistor; where the first transistor and the second transistor include at least one element that was simultaneously processed following a single lithography step, and where the first transistor source, drain and channel have the same dopant type.

The 3D ICs offer many significant potential benefits, including a small footprint—more functionality fits into a small space. This extends Moore's Law and enables a new generation of tiny but powerful devices. The 3D ICs have improved speed—The average wire length becomes much shorter. Because propagation delay may be proportional to the square of the wire length, overall performance increases. The 3D ICs consume low power—Keeping a signal on-chip reduces its power consumption by ten to a hundred times. Shorter wires also reduce power consumption by producing less parasitic capacitance. Reducing the power budget leads to less heat generation, extended battery life, and lower cost of operation. The vertical dimension adds a higher order of connectivity and opens a world of new design possibilities. Partitioning a large chip to be multiple smaller dies with 3D stacking could potentially improve the yield and reduce the fabrication cost. Heterogeneous integration—Circuit layers can be built with different processes, or even on different types of wafers. This means that components can be optimized to a much greater degree than if built together on a single wafer. Components with incompatible manufacturing could be combined in a single device. The stacked structure may hinder attempts to reverse engineer the circuitry. Sensitive circuits may also be divided among the layers in such a way as to obscure the function of each layer. 3D integration may allow large numbers of vertical vias between the layers. This may allow construction of wide bandwidth buses between functional blocks in different layers. A typical example would be a processor and memory 3D stack, with the cache memory stacked on top of the processor. This arrangement may allow a bus much wider than the typical 128 or 256 bits between the cache and processor. Wide buses in turn alleviate the memory wall problem.

BRIEF DESCRIPTION OF THE DRAWINGS

Various embodiments of the invention will be understood and appreciated more fully from the following detailed description, taken in conjunction with the drawings in which:

FIG. 1 illustrates the embedded memory portion of a standard 2D integrated circuit (prior art);

FIG. 2 illustrates the 3D stacking of embedded memory using through-silicon via (TSV) technology (prior art);

FIGS. 4A-4G are exemplary drawing illustrations of a process for monolithic 3D stacking of logic with DRAM produced using multiple memory layers and shared lithography steps;

FIG. 5 is an exemplary drawing illustration of different configurations possible for monolithically stacked embedded memory and logic;

FIG. 6 illustrates a capacitor-based DRAM cell and capacitor-less floating-body RAM cell prior art);

FIGS. 7A-7B are exemplary drawing illustrations of potential challenges associated with high field effects in floating-body RAM;

FIG. 20B is an exemplary drawing illustration of peripheral circuits may be stacked monolithically above or below memory arrays;

FIG. 20C is an exemplary drawing illustration of peripheral circuits may be monolithically stacked above and below memory arrays;

FIG. 21 is an exemplary drawing illustration of a Bipolar Junction Transistor;

FIGS. 22A-22C are exemplary drawing illustrations of the behavior of the embedded BJT during the floating body operation, programming, and erase;

FIG. 23 is an exemplary drawing illustration of energy band alignments;

FIGS. 24A-24B are exemplary drawing illustrations of a double-gated floating body NMOSFET;

FIG. 25 is an exemplary drawing illustration of FinFET floating body structure;

FIG. 26 is an exemplary drawing illustration of back-to-back two-transistor floating body structure;

FIG. 30A is an exemplary drawing illustration of chamfering the custom function etching shape for stress relief;

FIG. 30B is an exemplary drawing illustration of potential depths of custom function etching a continuous array in 3DIC;

FIG. 30C is an exemplary drawing illustration of a method to passivate the edge of a custom function etch of a continuous array in 3DIC;

FIGS. 31A-31J are exemplary drawing illustrations of a process flow for constructing monolithic 3D capacitor-based DRAMs with lithography steps shared among multiple memory layers;

FIGS. 33A-33L are exemplary drawing illustrations of a process flow for constructing monolithic 3D DRAMs with lithography steps shared among multiple memory layers that may not require high electric fields for write;

FIGS. 37A-37J are exemplary drawing illustrations of an alternative 3D NAND R-RAM structure and architecture utilizing junction-less transistors with a formation process flow.

DETAILED DESCRIPTION

Figure 3:
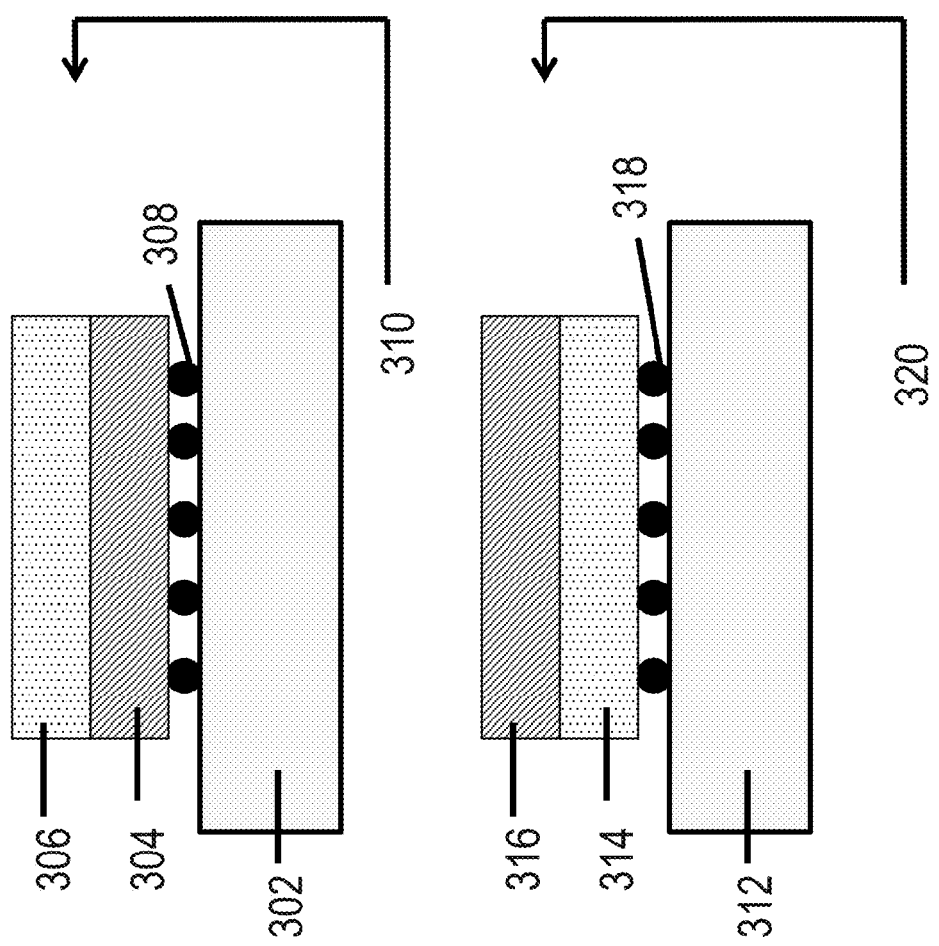
FIG. 3 is an exemplary drawing illustration of the 3D stacking of monolithic 3D DRAM with logic with TSV technology.

Embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing illustration figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates an exemplary top view of a prior art 2D integrated circuit 106 which may have logic circuits 104 (such as, for example, arithmetic logic units, instruction fetch units, and instruction decode units) as well as memory circuits such as SRAM blocks 102. The SRAM blocks 102 may be concentrated in one area of the chip (shown) or there may be significant amounts of SRAM in multiple areas of the chip. Typically, in many 2D integrated circuits, embedded memory blocks such as SRAM may consume a bigger percentage of chip area with every successive technology generation. Furthermore, some chips may use DRAM as an embedded memory in addition to SRAM or in place of SRAM. Hence, substantially all or portions of SRAM blocks 102 may include DRAM memory.

FIG. 2 shows a prior art illustration of embedded memory that may be in a 3D stacked layer above or below a logic chip and may be electrically connected to the logic chip using through-silicon via (TSV) technology. With TSV technology, two chips or wafers or transistor layers may be constructed separately, and then may be attached to each other using bonding and electrical vertical connections between the two chips or wafers or transistor layers may be made with through-silicon vias (TSVs). This type of configuration may allow embedded memory to be built with its own optimized technology and the logic chip to be built with its own optimized technology, thereby potentially improving the system. The embedded memory could be a volatile memory such as DRAM and/or SRAM, or any other type of memory, such as non-volatile memory (NVM). The example illustrated in FIG. 2 may include transistor regions of a top chip 202, interconnect dielectric regions of a top chip 204, metal interconnect regions of a top chip 206, solder bumps of a top chip 208, interconnect dielectric regions of a bottom chip 214, metal interconnect regions of a bottom chip 216, through-silicon via 212, dielectric regions surrounding a through-silicon via 210, solder bumps of a bottom chip 218, transistor regions of a bottom chip 222, and packaging substrate 220. The top chip may be a DRAM chip and the bottom chip may be a logic chip. Alternatively, the top chip may be a logic chip and the bottom chip may be a DRAM chip. Alternatively, SRAM may be used instead of DRAM in these configurations. The embedded memory elements such as DRAM may be built with an optimized for DRAM technology and may have optimized transistors, interconnect layers and other components such as capacitors.

FIG. 3 illustrates an embodiment of the invention, wherein monolithic 3D DRAM constructed with lithography steps shared among multiple memory layers may be stacked above or below a logic chip. DRAM, as well as SRAM and floating body DRAM, may be considered volatile memory, whereby the memory state may be substantially lost when supply power is removed. Monolithic 3D DRAM constructed with lithography steps shared among multiple memory layers (henceforth called M3DDRAM-LSSAMML) could be constructed using techniques, for example, described in co-pending published patent application 2011/0121366 (FIG. 98A-H to FIG. 100A-L). One configuration for 3D stack M3DDRAM-LSSAMML and logic 310 may include logic chip 304, M3DDRAM-LSSAMML chip 306, solder bumps 308, and packaging substrate 302. M3DDRAM-LSSAMML chip 306 may be placed above logic chip 304, and logic chip 304 may be coupled to packaging substrate 302 via solder bumps 308. A portion of or substantially the entirety of the logic chip 304 and the M3DDRAM-LSSAMML chip 306 may be processed separately on different wafers and then stacked atop each other using, for example, through-silicon via (TSV) stacking technology. This stacking may be done at the wafer-level or at the die-level or with a combination. Logic chip 304 and the M3DDRAM-LSSAMML chip 306 may be constructed in a monocrystalline layer or layers respectively.

Another configuration for 3D stack M3DDRAM-LSSAMML and logic 320 may include logic chip 316, M3DDRAM-LSSAMML chip 314, solder bumps 318 and packaging substrate 312. Logic chip 316 may be placed above M3DDRAM-LSSAMML chip 314, and M3DDRAM-LSSAMML chip 314 may be coupled to packaging substrate 312 via solder bumps 318. A portion of or substantially the entirety of the logic chip 316 and the M3DDRAM-LSSAMML chip 314 may be processed separately on different wafers and then stacked atop each other using, for example, through-silicon via (TSV) stacking technology. This stacking may be done at the wafer-level or at the die-level or with a combination. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer may have a thickness of less than about 150 nm.

FIG. 4A-G illustrates an embodiment of the invention, wherein logic circuits and logic regions, which may be constructed in a monocrystalline layer, may be monolithically stacked with monolithic 3D DRAM constructed with lithography steps shared among multiple memory layers (M3DDRAM-LSSAMML), the memory layers or memory regions may be constructed in a monocrystalline layer or layers. The process flow for the silicon chip may include the following steps that may be in sequence from Step (1) to Step (5). When the same reference numbers are used in different drawing figures (among FIG. 4A-G), they may be used to indicate analogous, similar or identical structures to enhance the understanding of the invention by clarifying the relationships between the structures and embodiments presented in the various diagrams—particularly in relating analogous, similar or identical functionality to different physical structures.

Step (1): This may be illustrated with FIG. 4A-C. FIG. 4A illustrates a three-dimensional view of an exemplary M3DDRAM-LSSAMML that may be constructed using techniques described in patent application 2011/0121366 (FIG. 98A-H to FIG. 100A-L). FIG. 4B illustrates a cross-sectional view along the II direction of FIG. 4A while FIG. 4C illustrates a cross-sectional view along the III direction of FIG. 4A. The legend of FIG. 4A-C may include gate dielectric 402, conductive contact 404, silicon dioxide 406 (nearly transparent for illustrative clarity), gate electrode 408, n+ doped silicon 410, silicon dioxide 412, and conductive bit lines 414. The conductive bit lines 414 may include metals, such as copper or aluminum, in their construction. The M3DDRAM-LSSAMML may be built on top of and coupled with vertical connections to peripheral circuits 400 as described in patent application 2011/0092030. The DRAM may operate using the floating body effect. Further details of this constructed M3DDRAM-LSSAMML are provided in patent application 2011/0121366 (FIG. 98A-H to FIG. 100A-L).

Step (2): This may be illustrated with FIG. 4D. Activated p Silicon layer 416 and activated n+ Silicon layer 418 may be transferred atop the structure shown in FIG. 4A using a layer transfer technique, such as, for example, ion-cut. P Silicon layer 416 and n+ Silicon layer 418 may be constructed from monocrystalline silicon. Further details of layer transfer techniques and procedures are provided in patent application 2011/0121366. A transferred monocrystalline layer, such as silicon layer 418, may have a thickness of less than about 150 nm.

Step (3): This may be illustrated with FIG. 4E. The p Silicon layer 416 and the n+ Silicon layer 418 that were shown in FIG. 4D may be lithographically defined and then etched to form monocrystalline semiconductor regions including p Silicon regions 420 and n+ Silicon regions 422. Silicon dioxide 424 (nearly transparent for illustrative clarity) may be deposited and then planarized for dielectric isolation amongst adjacent monocrystalline semiconductor regions.

Figure 4D:
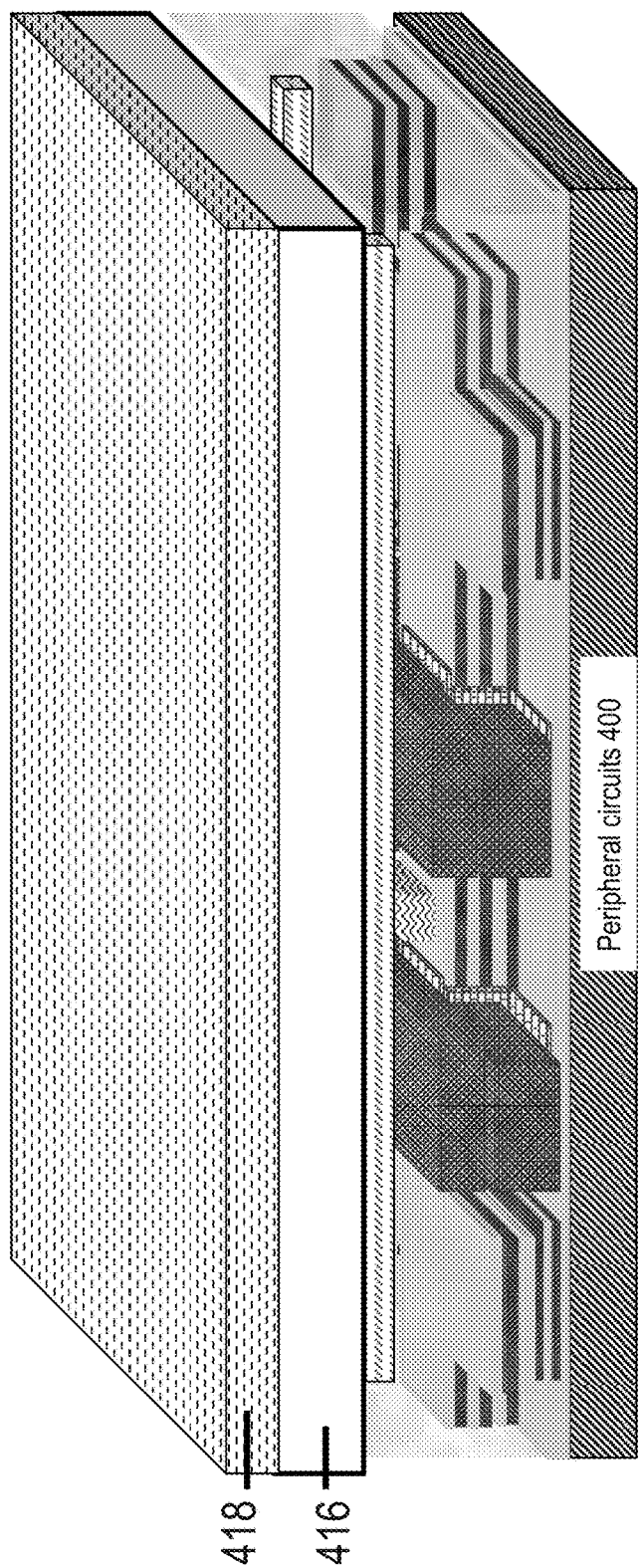
Figure 4E:
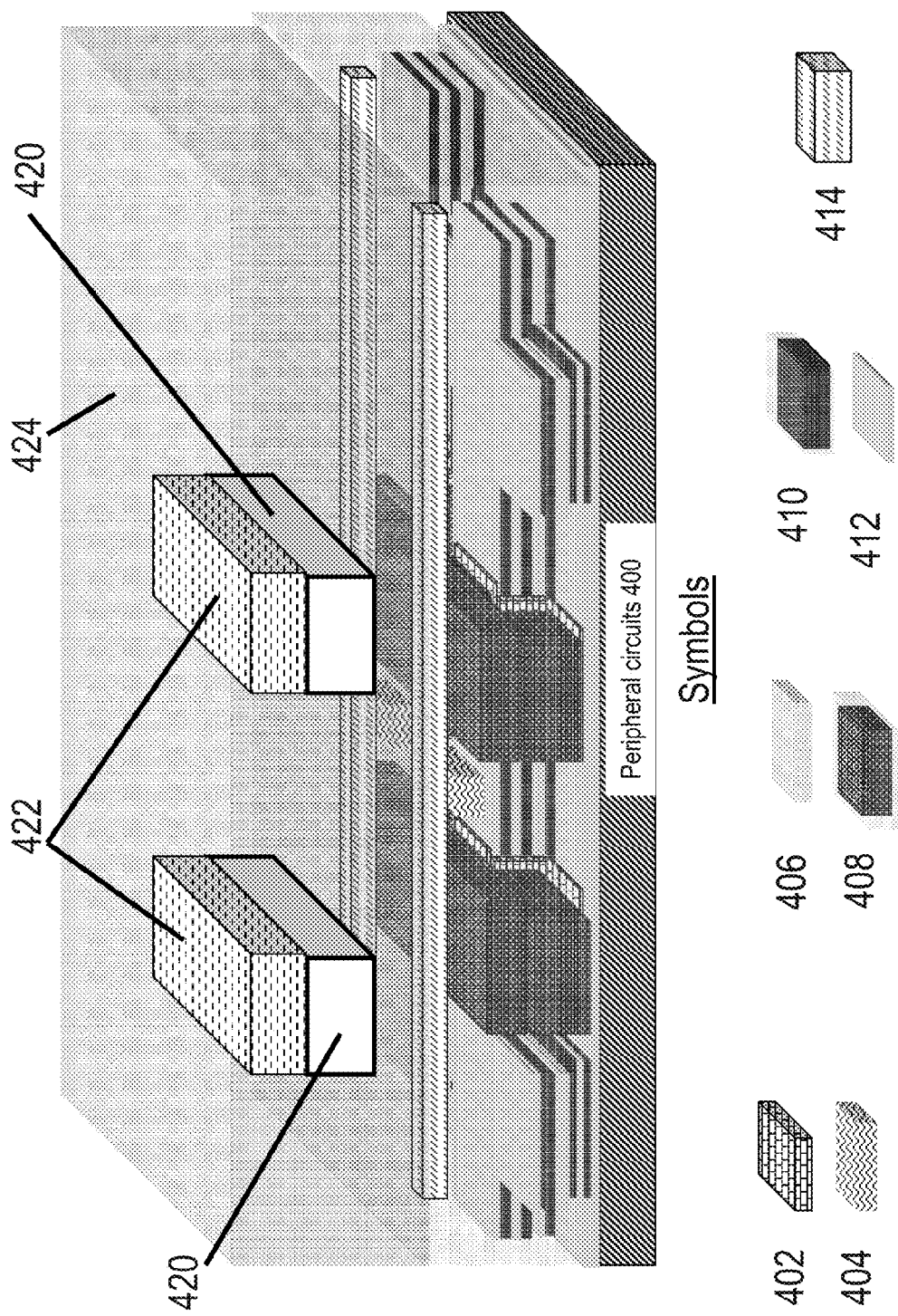
Figure 4F:
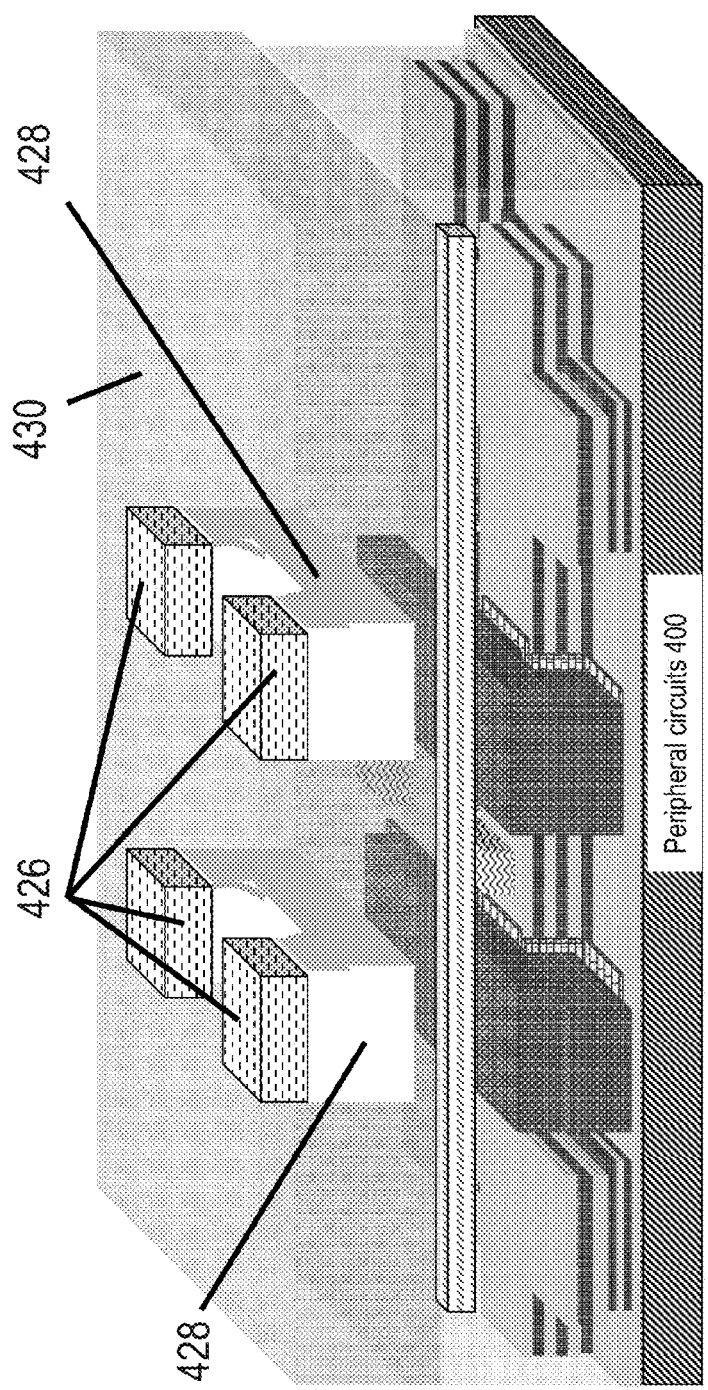
Figure 4G:
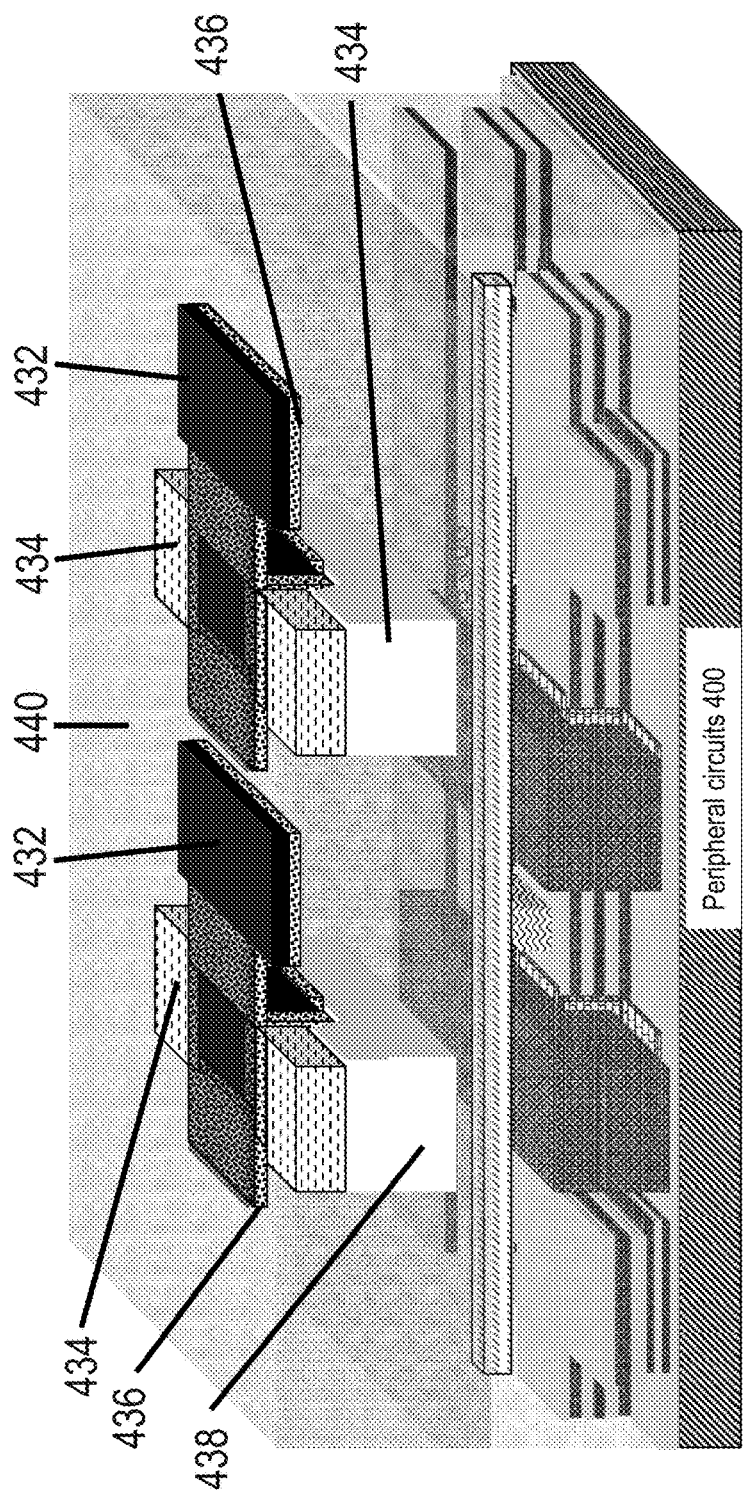

Step (4): This may be illustrated with FIG. 4F. The p Silicon regions 420 and the n+ Silicon regions 422 of FIG. 4E may be lithographically defined and etched with a carefully tuned etch recipe, thus forming a recessed channel structure such as shown in FIG. 4F and may include n+ source and drain Silicon regions 426, p channel Silicon regions 428, and oxide regions 430 (nearly transparent for illustrative clarity). Clean processes may then be used to produce a smooth surface in the recessed channel.

Step (5): This may be illustrated with FIG. 4G. A low temperature (less than about 400° C.) gate dielectric and gate electrode, such as hafnium oxide and TiAlN respectively, may be deposited into the etched regions in FIG. 4F. A chemical mechanical polish process may be used to planarize the top of the gate stack. Then a lithography and etch process may be used to form the pattern shown in FIG. 4G, thus forming recessed channel transistors that may include gate dielectric regions 436, gate electrode regions 432, silicon dioxide regions 440 (nearly transparent for illustrative clarity), n+ Silicon source and drain regions 434, and p Silicon channel and body regions 438.

A recessed channel transistor for logic circuits and logic regions may be formed monolithically atop a M3DDRAM-LSSAMML using the procedure shown in Step (1) to Step (5). The processes described in Step (1) to Step (5) do not expose the M3DDRAM-LSSAMML, and its associated metal bit lines 414, to temperatures greater than about 400° C.

Persons of ordinary skill in the art will appreciate that the illustrations in FIGS. 4A through 4G are exemplary only and are not drawn to scale. Such skilled persons will further appreciate that many variations may be possible such as, for example, the recessed channels etched in FIG. 4F may instead be formed before p Silicon layer 416 and n+ Silicon layer 418 may be etched to form the dielectric isolation and p Silicon regions 420 and n+ Silicon regions 422. Moreover, various types of logic transistors can be stacked atop the M3DDRAM-LSSAMML without exposing the M3DDRAM-LSSAMML to temperatures greater than about 400° C., such as, for example, junction-less transistors, dopant segregated Schottky source-drain transistors, V-groove transistors, and replacement gate transistors. This is possible using procedures described in patent application 2011/0121366 (FIG. 98A-H to FIG. 100A-L). The memory regions may have horizontally oriented transistors and vertical connections between the memory and logic layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 2011/0121366 and Ser. No. 13/099,010, the contents of the foregoing applications are incorporated herein by reference. Many other modifications within the scope of the illustrated embodiments of the invention will suggest themselves to such skilled persons after reading this specification. Thus the invention is to be limited only by the appended claims.

FIG. 5 illustrates an embodiment of the invention wherein different configurations for stacking embedded memory with logic circuits and logic regions may be realized. One stack configuration 510 may include embedded memory solution 506 made in a monocrystalline layer monolithically stacked atop the logic circuits 504 made in a monocrystalline layer using monolithic 3D technologies and vertical connections described in patent applications 2011/0121366 and Ser. No. 13/099,010, the contents of the foregoing applications are incorporated herein by reference. Logic circuits 504 may include metal layer or layers which may include metals such as copper or aluminum. Stack configuration 510 may include input/output interconnect 508, such as, for example, solder bumps and a packaging substrate 502. Another stack configuration 520 may include the logic circuits 516 monolithically stacked atop the embedded memory solution 514 using monolithic 3D technologies described in patent applications 20110121366 and Ser. No. 13/099,010, the contents of the foregoing applications are incorporated herein by reference. Embedded memory solution 514 may include metal layer or layers which may include metals such as copper or aluminum. Stack configuration 520 may include an input/output interconnect 518, such as, for example, solder bumps and a packaging substrate 512. The embedded memory solutions 506 and 514 may be a volatile memory, for example, SRAM. In this case, the transistors in SRAM blocks associated with embedded memory solutions 506 and 514 may be optimized differently than the transistors in logic circuits 504 and 516, and may, for example, have different threshold voltages, channel lengths and/or other parameters. The embedded memory solutions 506 and 514, if constructed, for example, as SRAM, may have, for example, just one device layer with 6 or 8 transistor SRAM. Alternatively, the embedded memory solutions 506 and 514 may have two device layers with pMOS and nMOS transistors of the SRAM constructed in monolithically stacked device layers using techniques described patent applications 20110121366 and Ser. No. 13/099,010, the contents of the foregoing applications are incorporated herein by reference. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as logic circuits 504, may have a thickness of less than about 150 nm.

Persons of ordinary skill in the art will appreciate that the illustrations in FIG. 5 are exemplary only and are not drawn to scale. Such skilled persons will further appreciate that many variations may be possible such as, for example, the embedded memory solutions 506 and 514, if constructed, for example, as SRAM, may be built with three monolithically stacked device layers for the SRAM with architectures similar to "The revolutionary and truly 3-dimensional 25F$^2$ SRAM technology with the smallest S$^3$ (stacked single-crystal Si) cell, 0.16 um$^2$, and SSTFT (stacked single-crystal thin film transistor) for ultra high density SRAM", Symposium on VLSI Technology, 2004 by Soon-Moon Jung, et al. but implemented with technologies described in patent applications 2011/0121366 and Ser. No. 13/099,010, the contents of the foregoing applications are incorporated herein by reference. Moreover, the embedded memory solutions 506 and 514 may be embedded DRAM constructed with stacked capacitors and transistors. Further, the embedded memory solutions 506 and 514 may be embedded DRAM constructed with trench capacitors and transistors. Moreover, the embedded memory solutions 506 and 514 may be capacitor-less floating-body RAM. Further, the embedded memory solutions 506 and 514 may be a resistive memory, such as RRAM, Phase Change Memory or MRAM. Furthermore, the embedded memory solutions 506 and 514 may be a thyristor RAM. Moreover, the embedded memory solutions 506 and 514 may be a flash memory. Furthermore, embedded memory solutions 506 and 514 may have a different number of metal layers and different sizes of metal layers compared to those in logic circuits 504 and 516. This is because memory circuits typically perform well with fewer numbers of metal layers (compared to logic circuits). Many other modifications within the scope of the illustrated embodiments of the invention described herein will suggest themselves to such skilled persons after reading this specification. Thus the invention is to be limited only by the appended claims. Many of the configurations described with FIG. 5 may represent an integrated device that may have a first monocrystalline layer that may have logic circuit layers and/or regions and a second monolithically stacked monocrystalline layer that may have memory regions. The memory regions may have horizontally oriented transistors and vertical connections between the memory and logic layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 2011/0121366 and Ser. No. 13/099,010, the contents of the foregoing applications are incorporated herein by reference.

FIG. 31A-J illustrates an embodiment of the invention, wherein a horizontally-oriented monolithic 3D DRAM array may be constructed and may have a capacitor in series with a transistor selector. No mask may utilized on a "per-memory-layer" basis for the monolithic 3D DRAM shown in FIG. 31A-J, and substantially all other masks may be shared among different layers. The process flow may include the following steps which may be in sequence from Step (A) to Step (H). When the same reference numbers are used in different drawing figures (among FIG. 31A-J), the reference numbers may be used to indicate analogous, similar or identical structures to enhance the understanding of the invention by clarifying the relationships between the structures and embodiments presented in the various diagrams— particularly in relating analogous, similar or identical functionality to different physical structures.

Figure 31A:
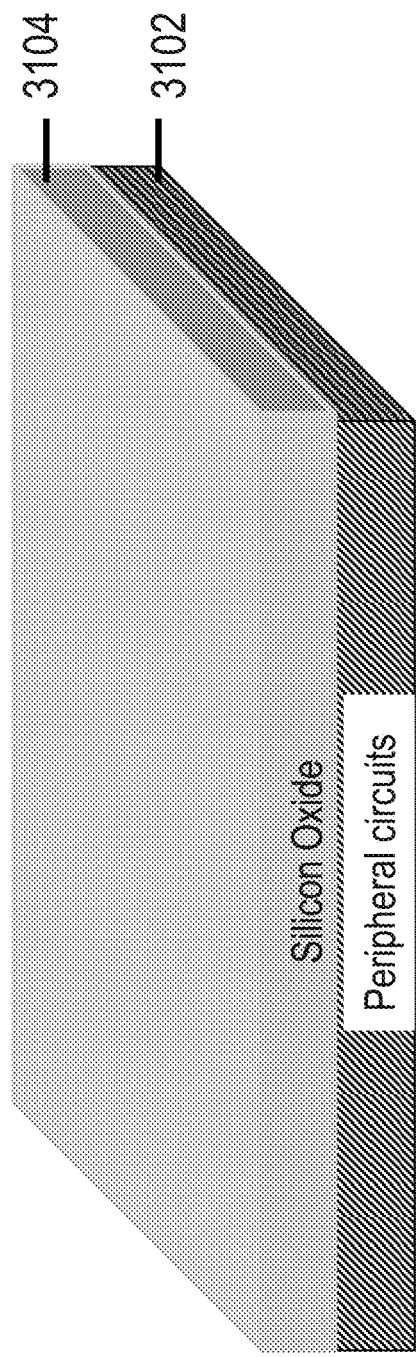

Step (A): Peripheral circuits 3102, which may include high temperature wiring, made with metals such as, for example, tungsten, and may include logic circuit regions, may be constructed. Oxide layer 3104 may be deposited above peripheral circuits 3102. FIG. 31A shows a drawing illustration after Step (A).

Figure 31B:
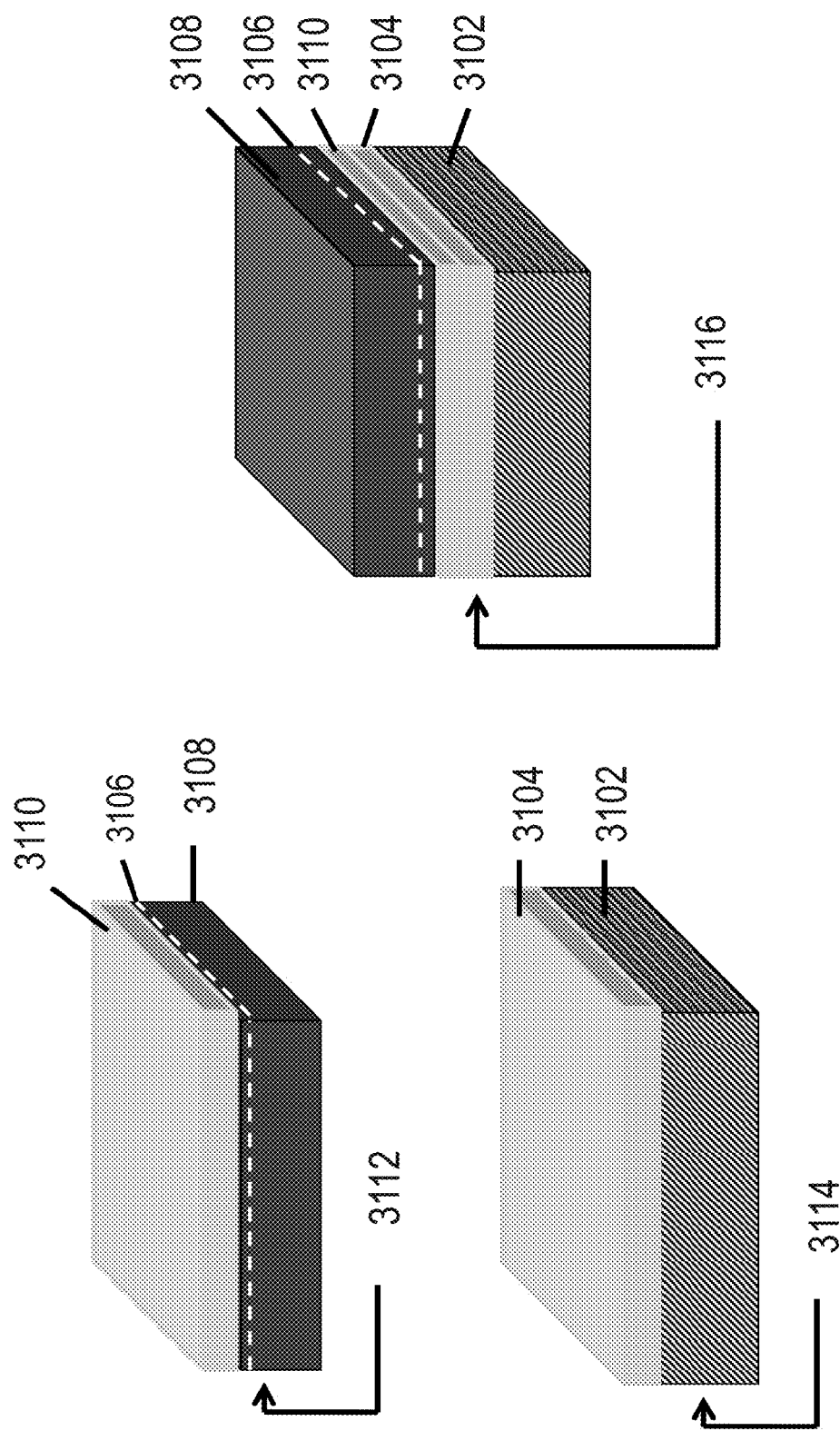

Step (B): FIG. 31B illustrates the structure after Step (B). N+Silicon wafer 3108 may have an oxide layer 3110 grown or deposited above it. Hydrogen may be implanted into the n+ Silicon wafer 3108 to a certain depth indicated by hydrogen plane 3106. Alternatively, some other atomic species, such as Helium, may be (co-)implanted. Thus, top layer 3112 may be formed. The bottom layer 3114 may include the peripheral circuits 3102 with oxide layer 3104. The top layer 3112 may be flipped and bonded to the bottom layer 3114 using oxide-to-oxide bonding to form top and bottom stack 3116.

Figure 31C:
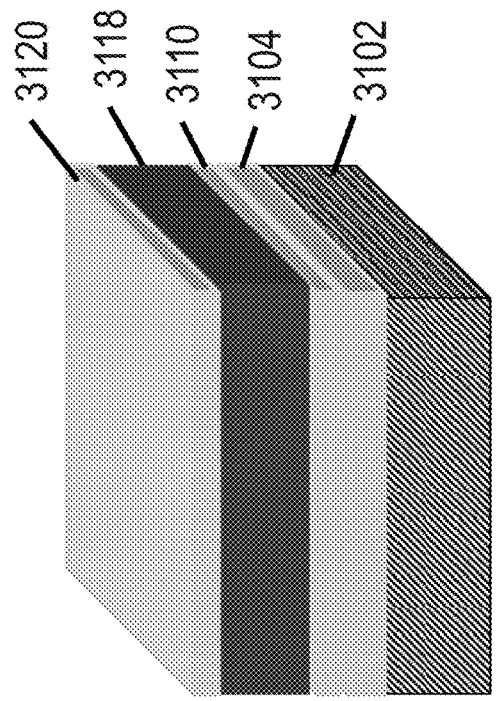

Step (C): FIG. 31C illustrates the structure after Step (C). The top and bottom stack 3116 may be cleaved at the hydrogen plane 3106 using methods including, for example, a thermal anneal or a sideways mechanical force. A CMP process may be conducted. Thus n+ Silicon layer 3118 may be formed. A layer of silicon oxide 3120 may be deposited atop the n+Silicon layer 3118. At the end of this step, a single-crystal n+ Silicon layer 3118 may exist atop the peripheral circuits 3102, and this has been achieved using layer-transfer techniques.

Figure 31D:
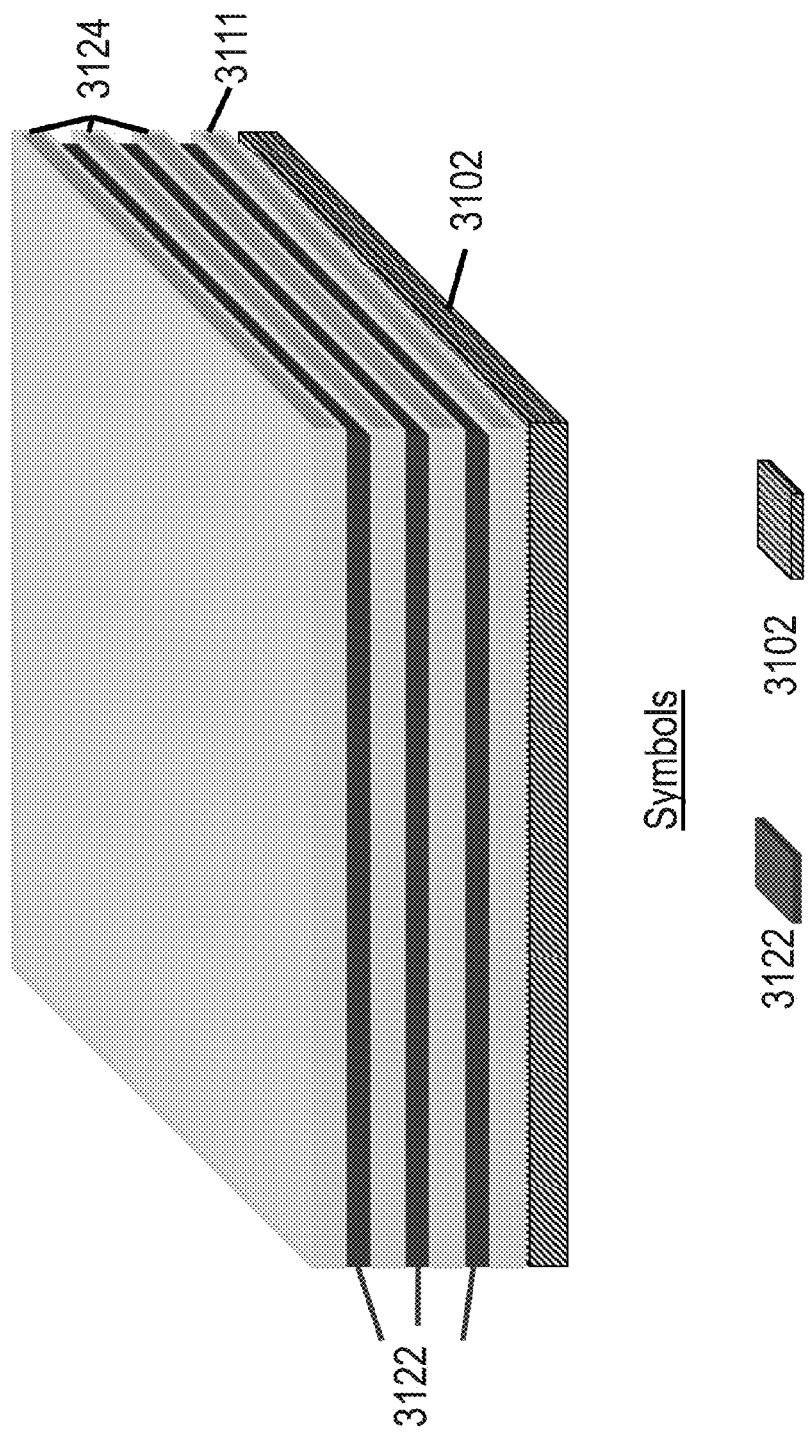

Step (D): FIG. 31D illustrates the structure after Step (D). Using methods similar to Step (B) and (C), multiple n+ silicon layers 3122 (now including n+ Silicon layer 3118) may be formed with associated silicon oxide layers 3124. Oxide layer 3104 and oxide layer 3110, which were previously oxide-oxide bonded, are now illustrated as oxide layer 3111.

Figure 31E:
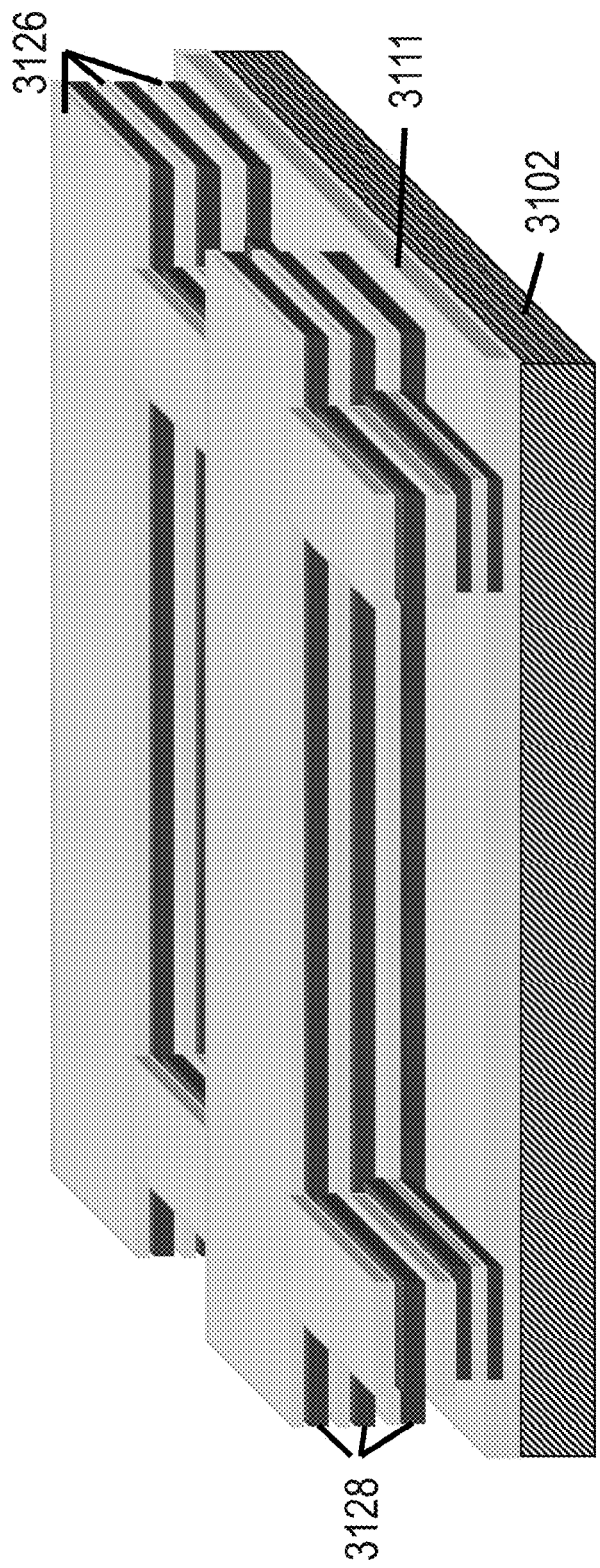

Step (E): FIG. 31E illustrates the structure after Step (E). Lithography and etch processes may then be utilized to make a structure as shown in the figure. The etch of multiple n+ silicon layers 3122 and associated silicon oxide layers 3124 may stop on oxide layer 3111 (shown), or may extend into and etch a portion of oxide layer 3111 (not shown). Thus exemplary patterned oxide regions 3126 and patterned n+ silicon regions 3128 may be formed.

Figure 31F:
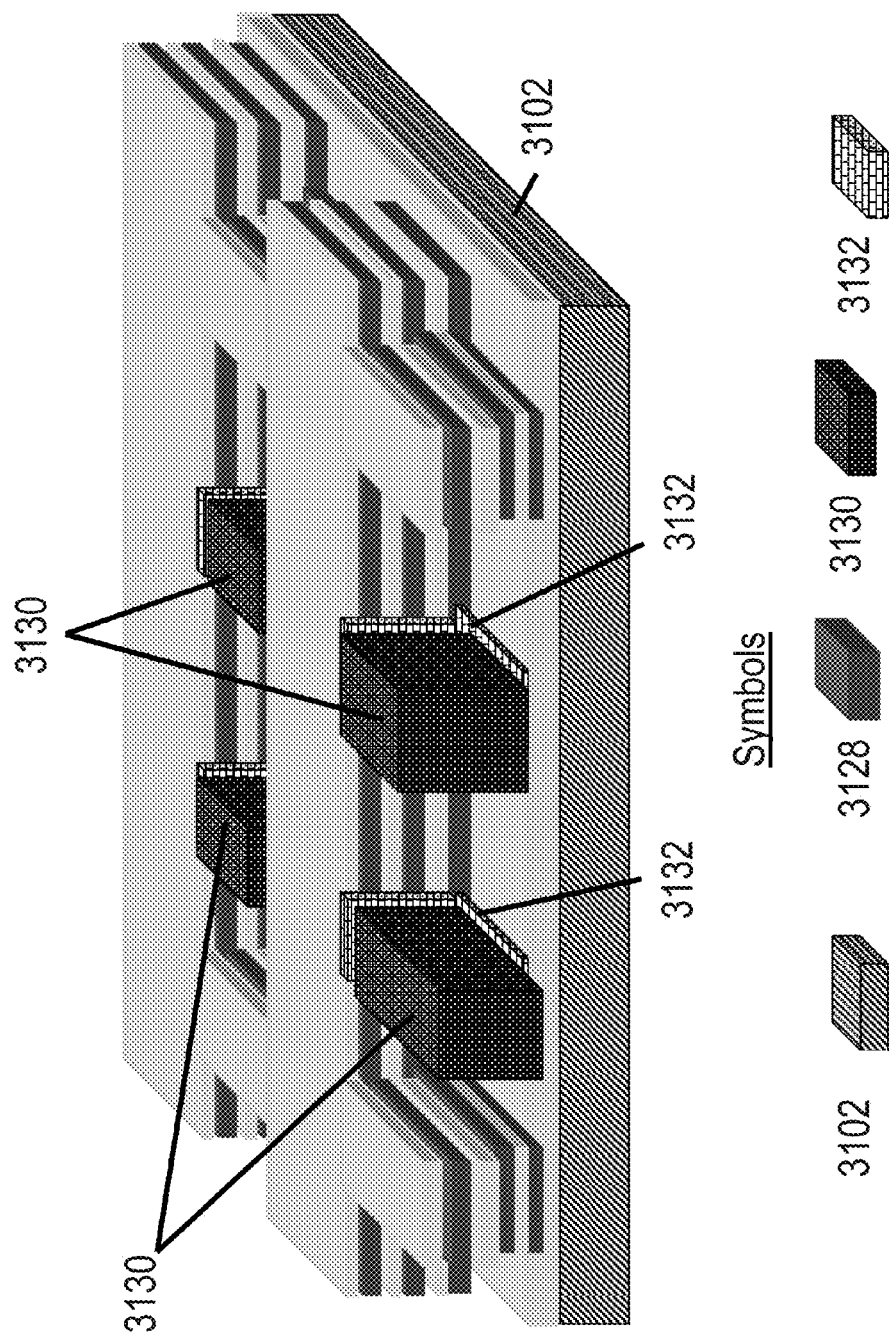

Step (F): FIG. 31F illustrates the structure after Step (F). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 3132 and gate electrode regions 3130 may be formed.

Figure 31G:
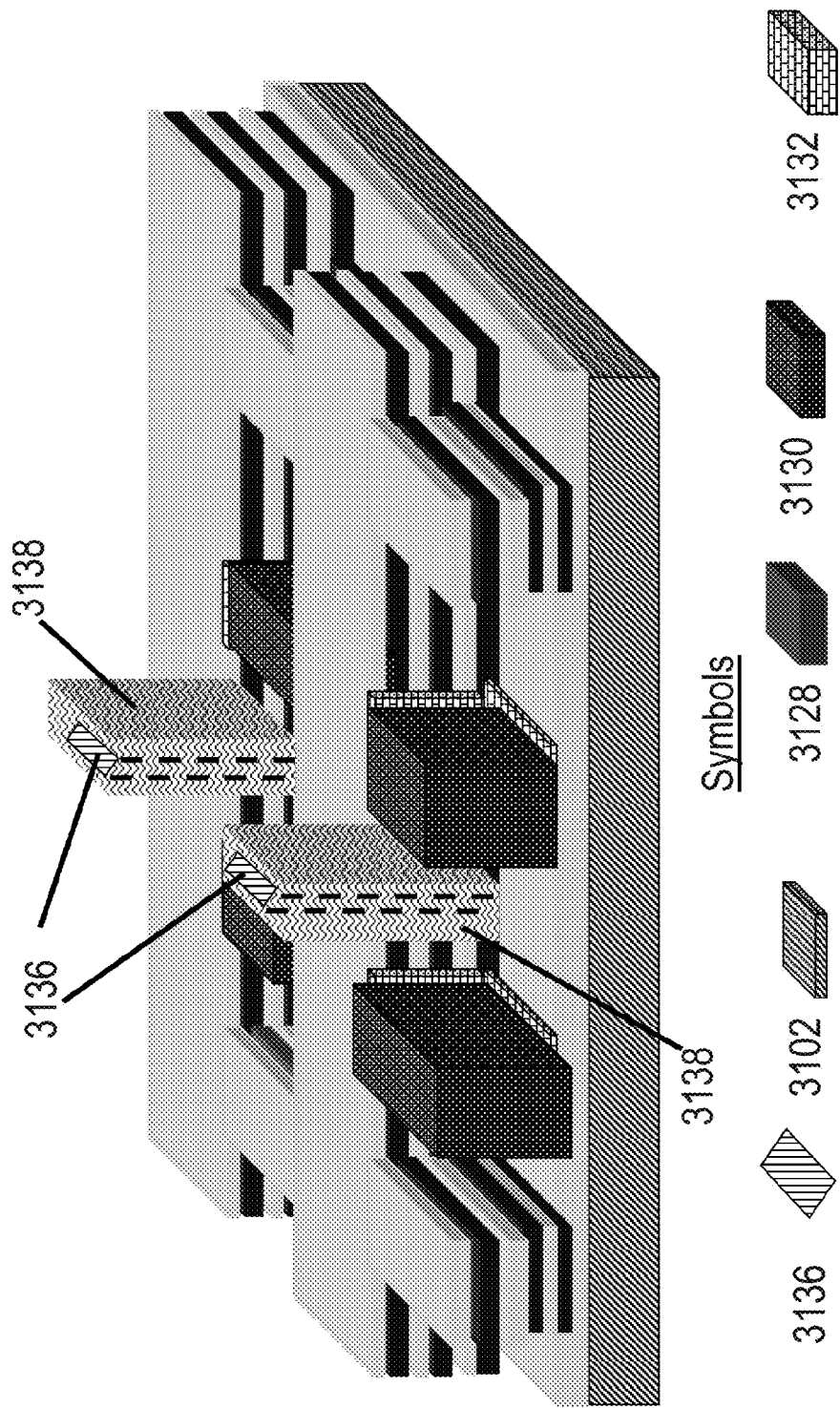

Step (G): FIG. 31G illustrates the structure after Step (G). A trench, for example two of which may be placed as shown in FIG. 31G, may be formed by lithography, etch and clean processes. A high dielectric constant material and then a metal electrode material may be deposited and polished with CMP. The metal electrode material may substantially fill the trenches. Thus high dielectric constant regions 3138 and metal electrode regions 3136 may be formed, which may substantially reside inside the exemplary two trenches. The high dielectric constant regions 3138 may be include materials such as, for example, hafnium oxide, titanium oxide, niobium oxide, zirconium oxide and any number of other possible materials with dielectric constants greater than or equal to 4.

The DRAM capacitors may be defined by having the high dielectric constant regions 3138 in between the surfaces or edges of metal electrode regions 3136 and the associated stacks of n+ silicon regions 3128.

Figure 31H:
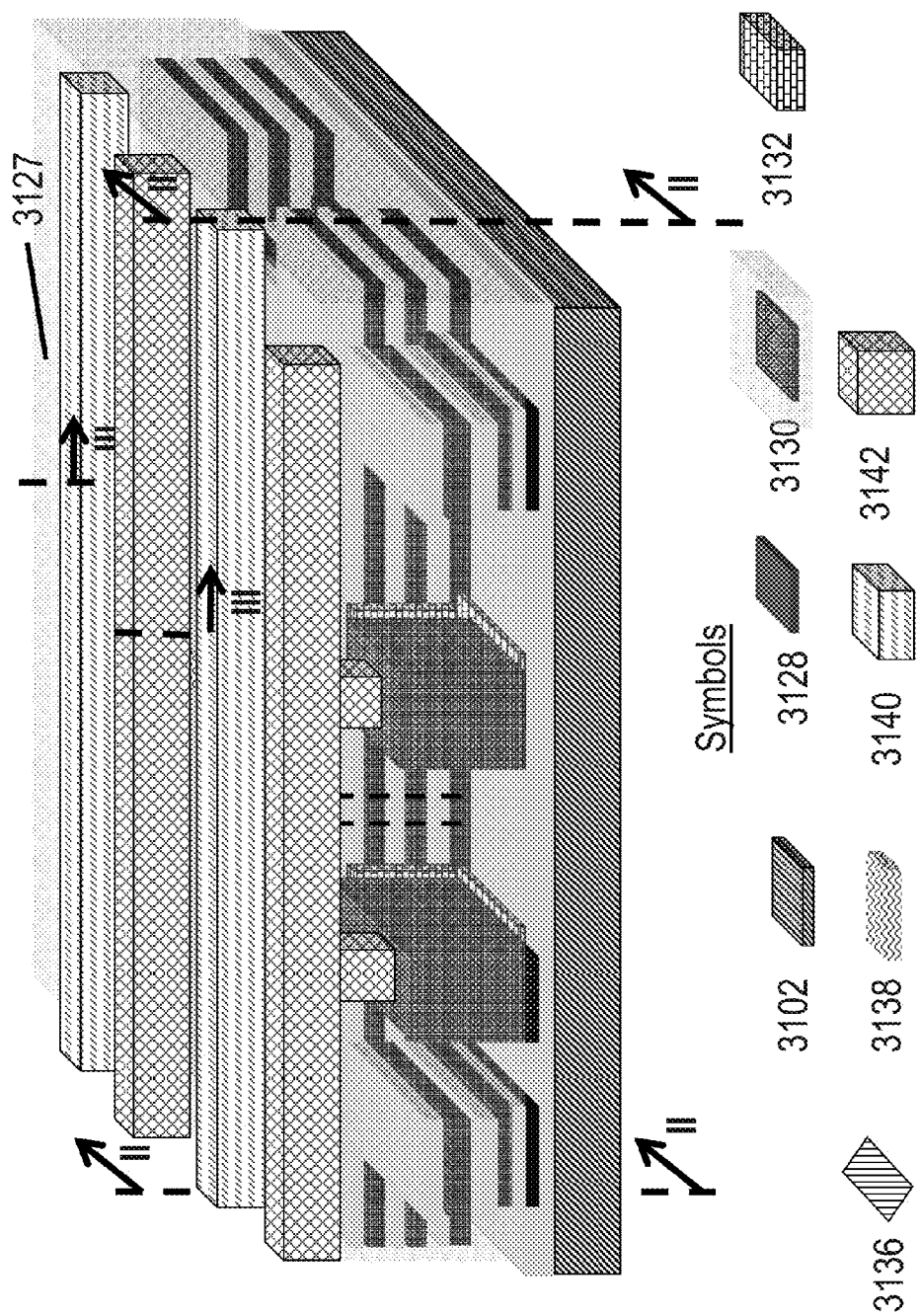

Step (H): FIG. 31H illustrates the structure after Step (H). A silicon oxide layer 3127 may then be deposited and planarized. The silicon oxide layer is shown partially transparent in the figure for clarity. Bit Lines 3140 may then be constructed. Word Lines 3142 may then be constructed. Contacts may then be made to Bit Lines, Word Lines and Source Lines of the memory array at its edges. Source Line contacts can be made into stair-like structures using techniques described in "Bit Cost Scalable Technology with Punch and Plug Process for Ultra High Density Flash Memory," *VLSI Technology,* 2007 *IEEE Symposium on,* vol., no., pp. 14-15, 12-14 Jun. 2007 by Tanaka, H.; Kido, M.; Yahashi, K.; Oomura, M.; et al., or using the staircase methods of "A stacked memory device on logic 3D technology for ultra-high-density data storage," *Nanotechnology,* 22 (2011) 254006 by J. Kim, et al., following which contacts can be constructed to them. Formation of stair-like structures for Source Lines could be done in steps prior to Step (H) as well. Vertical connections may be made to peripheral circuits 602 (not shown).

Figure 31I:
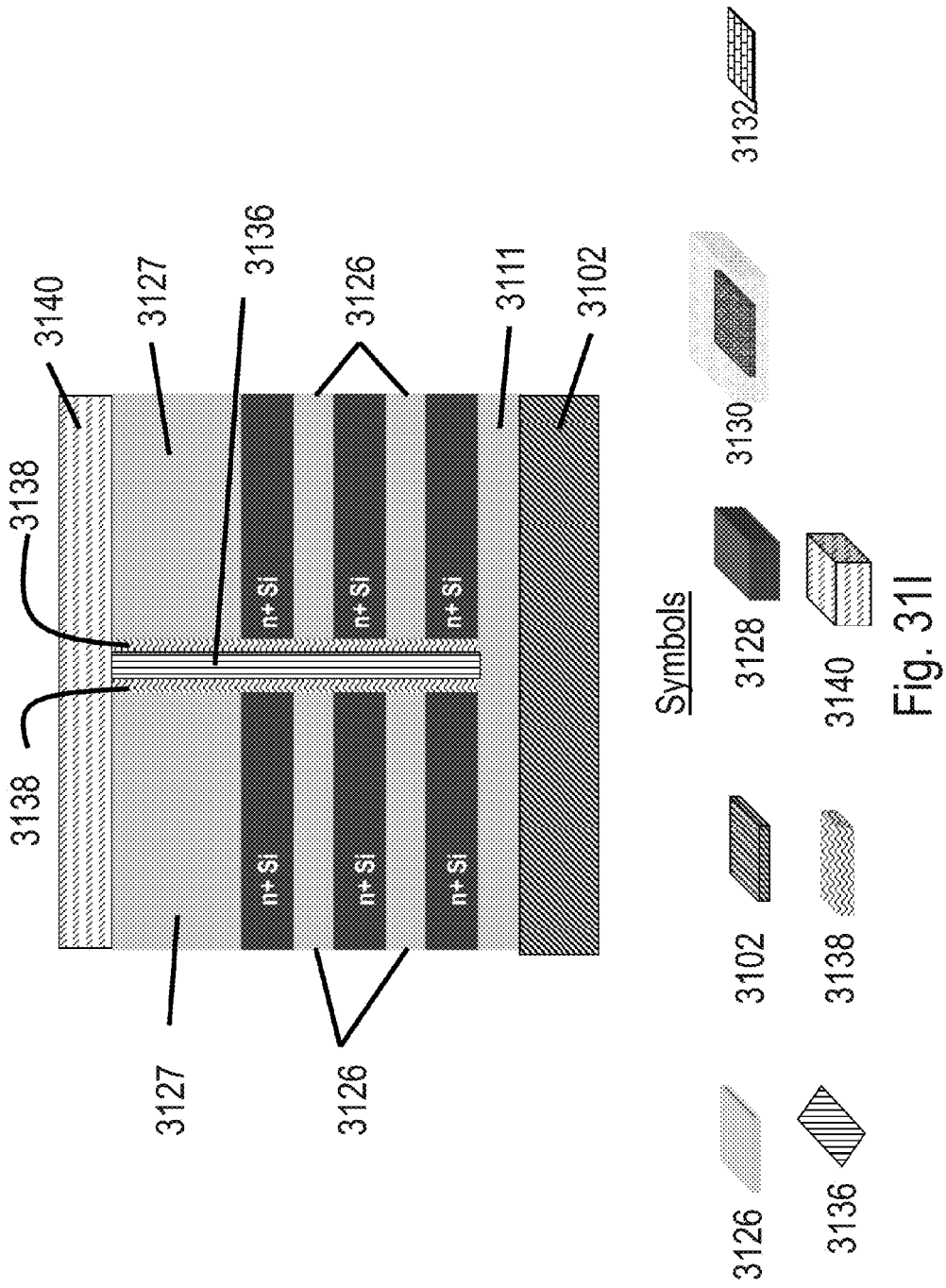

FIG. 31I and FIG. 31J show cross-sectional views of the exemplary memory array along FIG. 31H planes II and III respectively. Multiple junction-less transistors in series with capacitors constructed of high dielectric constant materials such as high dielectric constant regions 3138 can be observed in FIG. 31I.

A procedure for constructing a monolithic 3D DRAM has thus been described, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as n+ Silicon layer 3118, may have a thickness of less than about 150 nm.

Persons of ordinary skill in the art will appreciate that the illustrations in FIGS. 31A through 31J are exemplary only and are not drawn to scale. Such skilled persons will further appreciate that many variations may be possible such as, for example, layer transfer techniques other than the described hydrogen implant and ion-cut may be utilized. Moreover, while FIG. 31A-J described the procedure for forming a monolithic 3D DRAM with substantially all lithography steps shared among multiple memory layers, alternative procedures could be used. For example, procedures similar to those described in FIG. 33A-K, FIG. 34A-L and FIG. 35A-F of patent application Ser. No. 13/099,010, the contents of the foregoing application is incorporated herein by reference, may be used to construct a monolithic 3D DRAM. The technique of making Word Lines perpendicular to the source-lines may be analogously used for flash memories, resistive memories and floating body DRAM with lithography steps shared among multiple memory layers. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Many other modifications within the scope of the illustrated embodiments of the invention described herein will suggest themselves to such skilled persons after reading this specification. Thus the invention is to be limited only by the appended claims.

Circuit and System Techniques for Managing a Floating-Body RAM Array

Over the past few years, the semiconductor industry has been actively pursuing floating-body RAM technologies as a replacement for conventional capacitor-based DRAM or as a replacement for embedded DRAM/SRAM. In these technologies, charge may be stored in the body region of a transistor instead of having a separate capacitor. This could have several potential advantages, including lower cost due to the lack of a capacitor, easier manufacturing and potentially scalability. There are many device structures, process technologies and operation modes possible for capacitor-less floating-body RAM. Some of these are included in "Floating-body SOI Memory: The Scaling Tournament", Book Chapter of Semiconductor-On-Insulator Materials for Nanoelectronics Applications, pp. 393-421, Springer Publishers, 2011 by M. Bawedin, S. Cristoloveanu, A. Hubert, K. H. Park and F. Martinez ("Bawedin").

FIG. 6 shows a prior art illustration of capacitor-based DRAM and capacitor-less floating-body RAM. A capacitor-based DRAM cell 606 may be schematically illustrated and may include transistor 602 coupled in series with capacitor 604. The transistor 602 may serve as a switch for the capacitor 604, and may be ON while storing or reading charge in the capacitor 604, but may be OFF while not performing these operations. One illustrative example capacitor-less floating-body RAM cell 618 may include transistor source and drain regions 612, gate dielectric 610, gate electrode 608, buried oxide 616 and silicon region 614. Charge may be stored in the transistor body region 620. Various other structures and configurations of floating-body RAM may be possible, and are not illustrated in FIG. 6. In many configurations of floating-body RAM, a high (electric) field mechanism such as impact ionization, tunneling or some other phenomenon may be used while writing data to the memory cell. High-field mechanisms may be used while reading data from the memory cell. The capacitor-based DRAM cell 606 may often operate at much lower electric fields compared to the floating-body RAM cell 618.

Figure 7B:
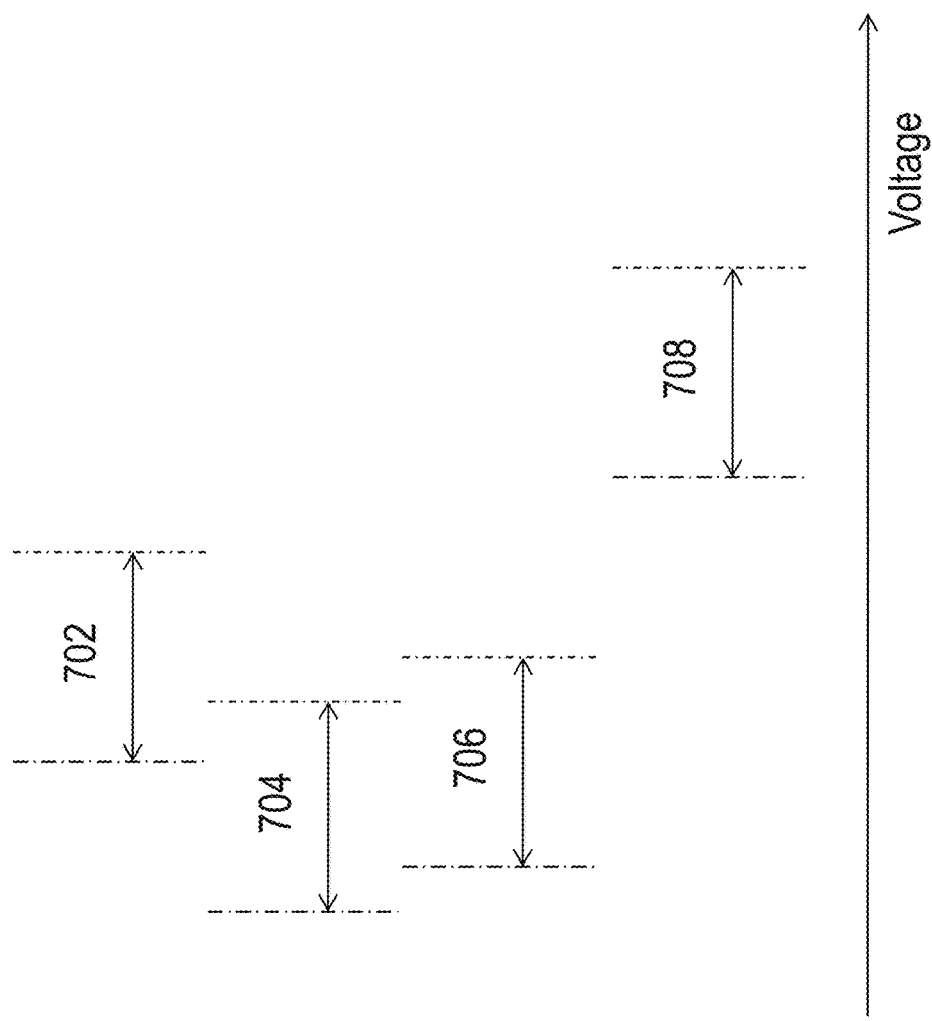

FIG. 7A-7B illustrates some of the potential challenges associated with possible high field effects in floating-body RAM. The Y axis of the graph shown in FIG. 7A may indicate current flowing through the cell during the write operation, which may, for example, consist substantially of impact ionization current. While impact ionization may be illustrated as the high field effect in FIG. 7A, some other high field effect may alternatively be present. The X axis of the graph shown in FIG. 7B may indicate some voltage applied to the memory cell. While using high field effects to write to the cell, some challenges may arise. At low voltages 720, not enough impact ionization current may be generated while at high voltages 722, the current generated may be exponentially higher and may damage the cell. The device may therefore work only at a narrow range of voltages 724.

A challenge of having a device work across a narrow range of voltages is illustrated with FIG. 7B. In a memory array, for example, there may be millions or billions of memory cells, and each memory individual cell may have its own range of voltages between which it operates safely. Due to variations across a die or across a wafer, it may not be possible to find a single voltage that works well for substantially all members of a memory array. In the plot shown in FIG. 7B, four different memory cells may have their own range of "safe" operating voltages 702, 704, 706 and 708. Thus, it may not be possible to define a single voltage that can be used for writing substantially all cells in a memory array. While this example described the scenario with write operation, high field effects may make it potentially difficult to define and utilize a single voltage for reading substantially all cells in a memory array. This situation may be unique to floating-body RAM and may not be generally present in capacitor-based DRAM. Solutions to this potential problem may be required.

Figure 8:
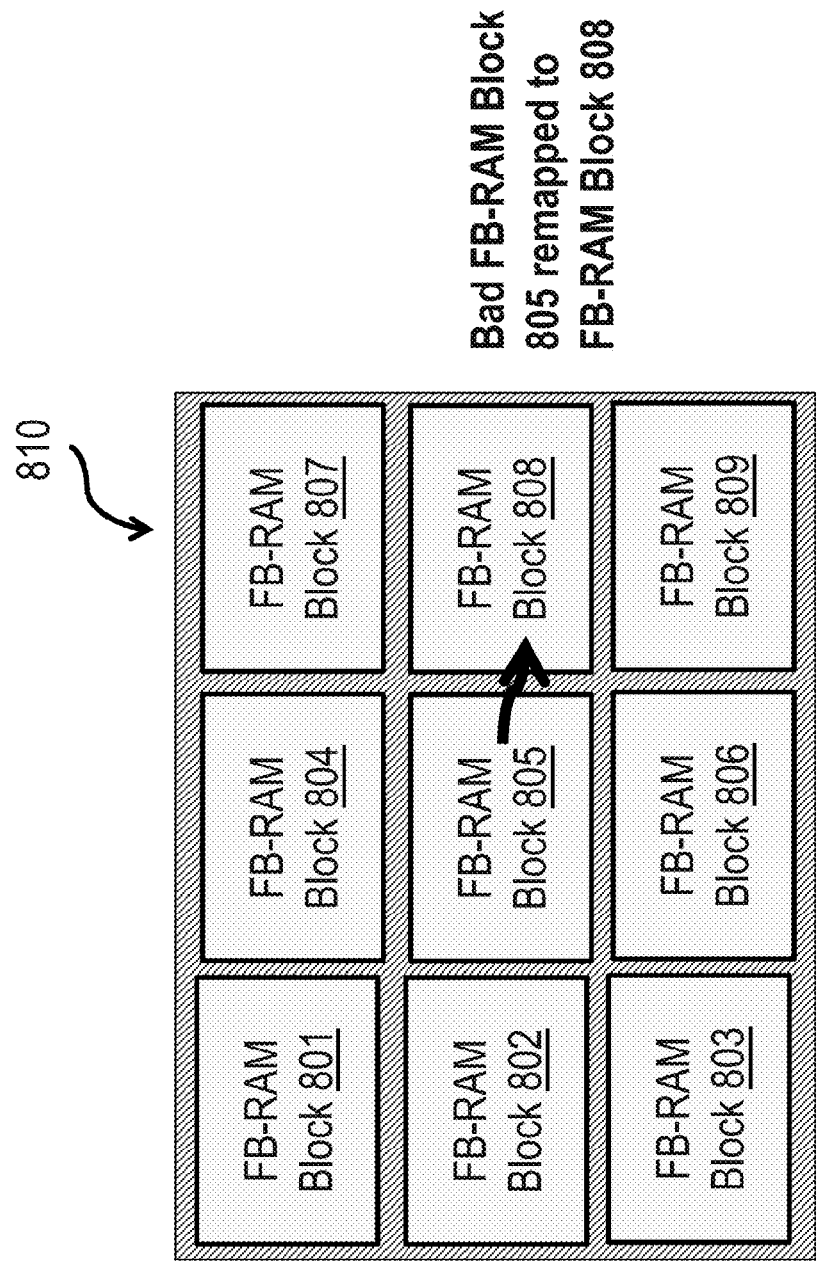
FIG. 8 is an exemplary drawing illustration of how a floating-body RAM chip may be managed when some memory cells may have been damaged.

FIG. 8 illustrates an embodiment of the invention that describes how floating-body RAM chip 810 may be managed wherein some memory cells within floating-body RAM chip 810 may have been damaged due to mechanisms, such as, for example, high-field effects after multiple write or read cycles. For example, a cell rewritten a billion times may have been damaged more by high field effects than a cell rewritten a million times. As an illustrative example, floating-body RAM chip 810 may include nine floating-body RAM blocks, 801, 802, 803, 804, 805, 806, 807, 808 and 809. If it is detected, for example, that memory cells in floating-body RAM block 805 may have degraded due to high-field effects and that redundancy and error control coding schemes may be unable to correct the error, the data within floating-body RAM block 805 may be remapped in part or substantially in its entirety to floating-body RAM block 808. Floating-body RAM block 805 may not be used after this remapping event.

Figure 9:
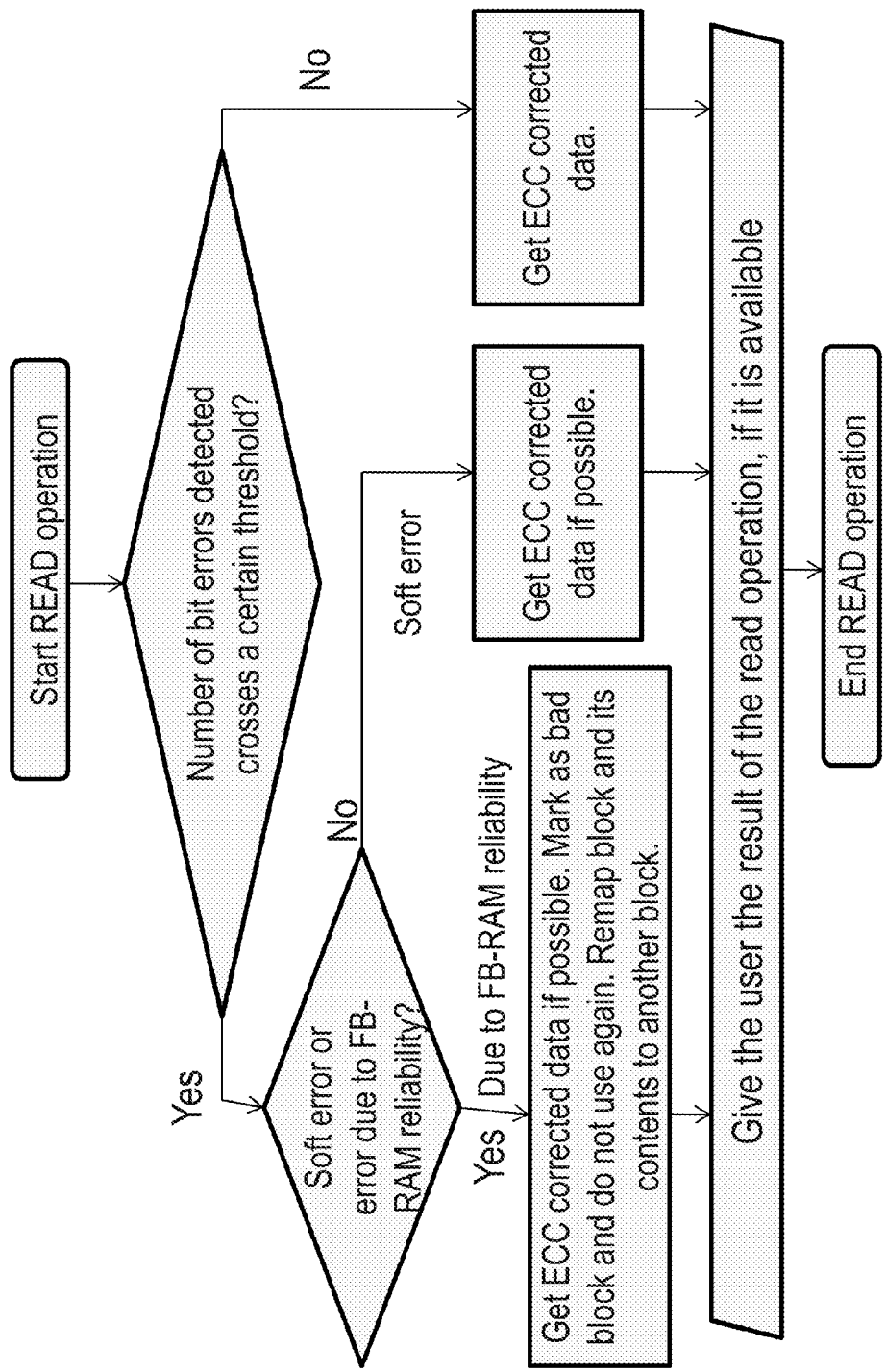
FIG. 9 is an exemplary drawing illustration of a methodology for implementing the bad block management scheme described with respect to FIG. 8.

FIG. 9 illustrates an embodiment of the invention of an exemplary methodology for implementing the bad block management scheme described with respect to FIG. 8. For example, during a read operation, if the number of errors increases beyond a certain threshold, an algorithm may be activated. The first step of this algorithm may be to check or analyze the causation or some characteristic of the errors, for example, if the errors may be due to soft-errors or due to reliability issues because of high-field effects. Soft-errors may be transient errors and may not occur again and again in the field, while reliability issues due to high-field effects may occur again and again (in multiple conditions), and may occur in the same field or cell. Testing circuits may be present on the die, or on another die, which may be able to differentiate between soft errors and reliability issues in the field by utilizing the phenomenon or characteristic of the error in the previous sentence or by some other method. If the error may result from floating-body RAM reliability, the contents of the block may be mapped and transferred to another block as described with respect to FIG. 8 and this block may not be reused again. Alternatively, the bad block management scheme may use error control coding to correct the bad data and may provide the user data about the error and correction. The read operation may end.

Figure 10:
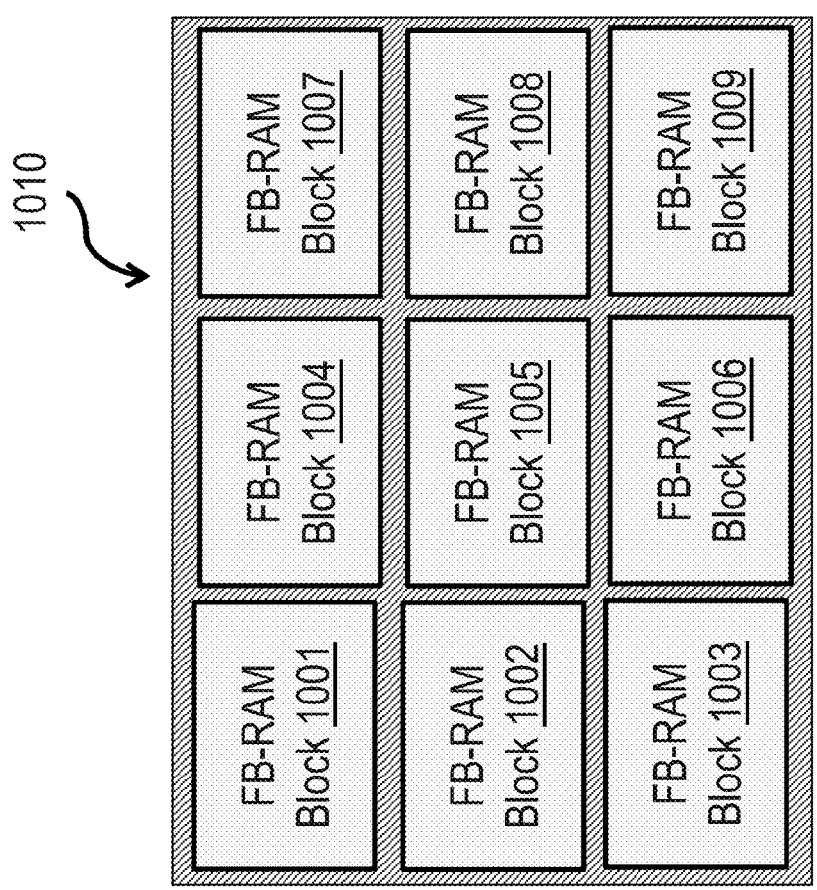
FIG. 10 is an exemplary drawing illustration of wear leveling techniques and methodology utilized in floating body RAM.

FIG. 10 illustrates an embodiment of the invention wherein wear leveling techniques and methodology may be utilized in floating body RAM. As an illustrative example, floating-body RAM chip 1010 may include nine floating-body RAM blocks 1001, 1002, 1003, 1004, 1005, 1006, 1007, 1008 and 1009. While writing data to floating-body RAM chip 1010, the writes may be controlled and mapped by circuits that may be present on the die, or on another die, such that substantially all floating-body RAM blocks, such as 1001-1009, may be exposed to an approximately similar number of write cycles. The leveling metric may utilize the programming voltage, total programming time, or read and disturb stresses to accomplish wear leveling, and the wear leveling may be applied at the cell level, or at a super-block (groups of blocks) level. This wear leveling may avoid the potential problem wherein some blocks may be accessed more frequently than others. This potential problem typically limits the number of times the chip can be written. There are several algorithms used in flash memories and hard disk drives that perform wear leveling. These techniques could be applied to floating-body RAM due to the high field effects which may be involved. Using these wear leveling procedures, the number of times a floating body RAM chip can be rewritten (i.e. its endurance) may improve.

Figure 11:
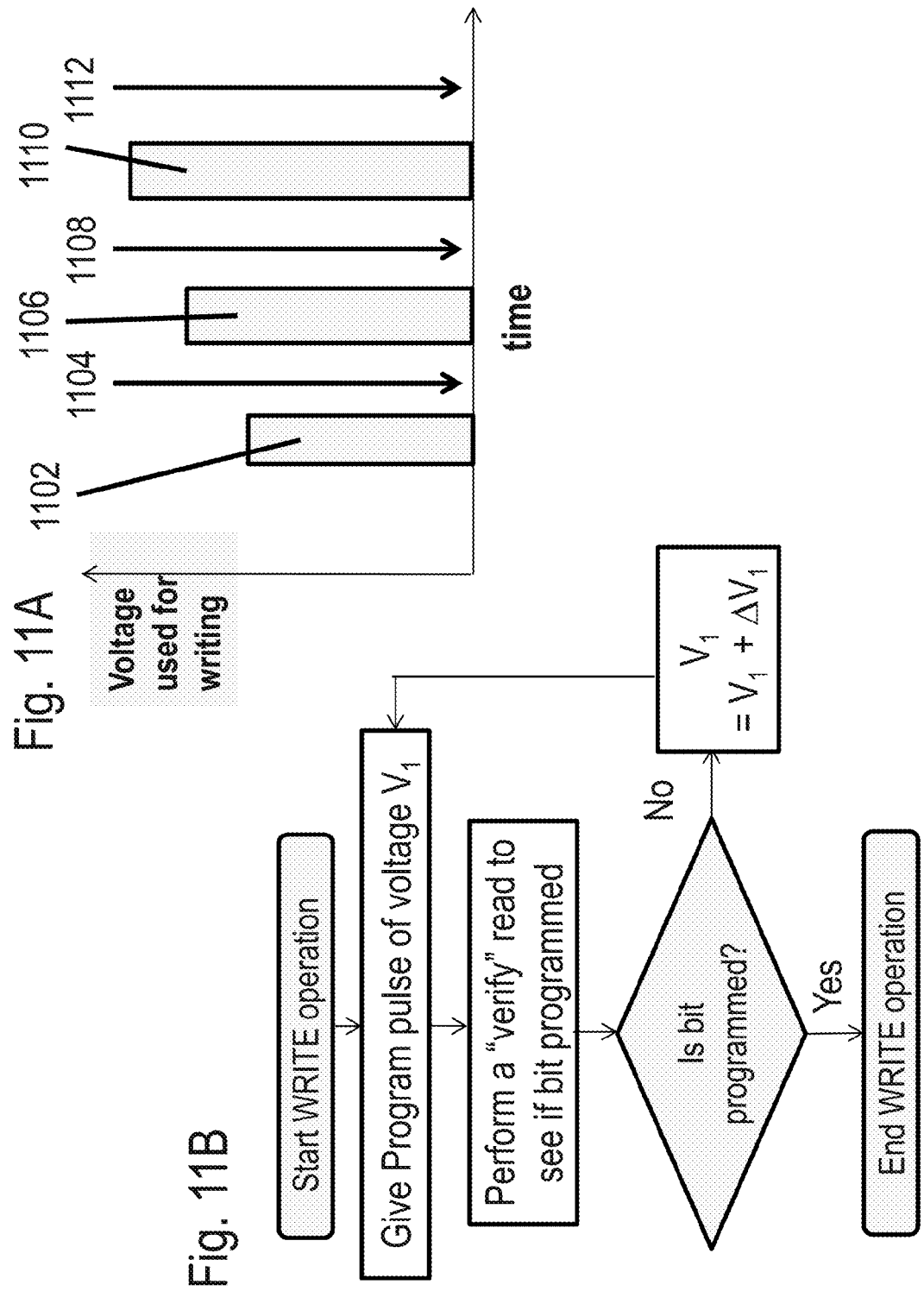
FIGS. 11A-11B are exemplary drawing illustrations of incremental step pulse programming techniques and methodology utilized for floating-body RAM.

FIGS. 11A-11B illustrates an embodiment of the invention wherein incremental step pulse programming techniques and methodology may be utilized for floating-body RAM. The Y axis of the graph shown in FIG. 11A may indicate the voltage used for writing the floating-body RAM cell or array and the X axis of the graph shown in FIG. 11A may indicate time during the writing of a floating-body RAM cell or array. Instead of using a single pulse voltage for writing a floating-body RAM cell or array, multiple write voltage pulses, such as, initial write pulse 1102, second write pulse 1106 and third write pulse 1110, may be applied to a floating-body RAM cell or array. Write voltage pulses such as, initial write pulse 1102, second write pulse 1106 and third write pulse 1110, may have differing voltage levels and time durations ('pulse width'), or they may be similar. A "verify" read may be conducted after every write voltage pulse to detect if the memory cell has been successfully written with the previous write voltage pulse. A "verify" read operation may include voltage pulses and current reads. For example, after initial write pulse 1102, a "verify" read operation 1104 may be conducted. If the "verify" read operation 1104 has determined that the floating-body RAM cell or array has not finished storing the data, a second write pulse 1106 may be given followed by a second "verify" read operation 1108. Second write pulse 1106 may be of a higher voltage and/or time duration (shown) than that of initial write pulse 1102. If the second "verify" read operation 1108 has determined that the floating-body RAM cell or array has not finished storing the data, a third write pulse 1110 may be given followed by a third "verify" read operation 1112. Third write pulse 1110 may be of a higher voltage and/or time duration (shown) than that of initial write pulse 1102 or second write pulse 1106. This could continue until a combination of write pulse and verify operations indicate that the bit storage is substantially complete. The potential advantage of incremental step pulse programming schemes may be similar to those described with respect to FIG. 6 and FIGS. 7A-7B as they may tackle the cell variability and other issues, such as effective versus applied write voltages.

FIG. 11B illustrates an embodiment of the invention of an exemplary methodology for implementing a write operation using incremental step pulse programming scheme described with respect to FIG. 11A. Although FIG. 11B illustrates an incremental step pulse programming scheme where subsequent write pulses may have higher voltages, the flow may be general and may apply to cases, for example, wherein subsequent write pulses may have higher time durations. Starting a write operation, a write voltage pulse of voltage $V_1$ may be applied to the floating-body RAM cell or array, following which a verify read operation may be conducted. If the verify read indicates that the bit of the floating-body RAM cell or array has been written satisfactorily, the write operation substantially completes. Otherwise, the write voltage pulse magnitude may be increased ($+\Delta V_1$ shown) and further write pulses and verify read pulses may be given to the memory cell. This process may repeat until the bit is written satisfactorily.

Persons of ordinary skill in the art will appreciate that the illustrations in FIGS. 11A through 11B are exemplary only and are not drawn to scale. Such skilled persons will further appreciate that many variations may be possible such as, for example, pulses may utilize delivered current rather than measured or effective voltage, or some combination thereof. Moreover, multiple write pulses before a read verify operation may be done. Further, write pulses may have more complex shapes in voltage and time, such as, for example, ramped voltages, soaks or holds, or differing pulse widths. Furthermore, the write pulse may be of positive or negative voltage magnitude and there may be a mixture of unipolar or bipolar pulses within each pulse train. The write pulse or pulses may be between read verify operations. Further, $\Delta V_1$ may be of polarity to decrease the write program pulse voltage $V_1$ magnitude. Moreover, an additional 'safety' write pulse may be utilized after the last successful read operation. Further, the verify read operation may utilize a read voltage pulse that may be of differing voltage and time shape than the write pulse, and may have a different polarity than the write pulse. Furthermore, the write pulse may be utilized for verify read purposes. Many other modifications within the scope of the illustrated embodiments of the invention described herein will suggest themselves to such skilled persons after reading this specification. Thus the invention is to be limited only by the appended claims.

Figure 12:
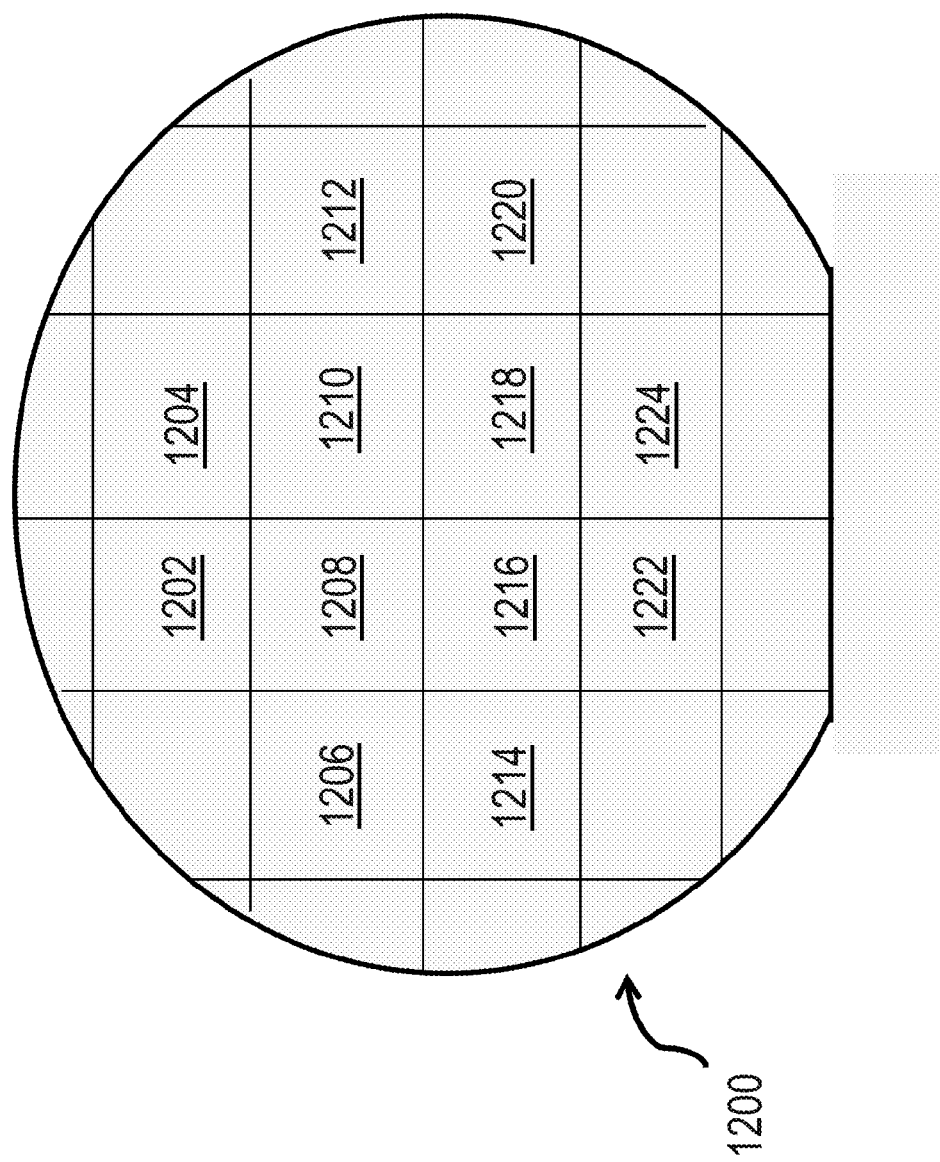
FIG. 12 is an exemplary drawing illustration of different write voltages utilized for different dice across a wafer.

FIG. 12 illustrates an embodiment of the invention wherein optimized and possibly different write voltages may be utilized for different dice across a wafer. As an illustrative example, wafer 1200 may include dice 1202, 1204, 1206, 1208, 1210, 1212, 1214, 1216, 1218, 1220, 1222 and 1224. Due to variations in process and device parameters across wafer 1200, which may be induced by, for example, manufacturing issues, each die, for example die 1202, on wafer 1200 may suitably operate at its own optimized write voltage. The optimized write voltage for die 1202 may be different than the optimized write voltage for die 1204, and so forth. During, for example, the test phase of wafer 1200 or individual dice, such as, for example, die 1202, tests may be conducted to determine the optimal write voltage for each die. This optimal write voltage may be stored on the floating body RAM die, such as die 1202, by using some type of non-volatile memory, such as, for example, metal or oxide fuse-able links, or intentional damage programming of floating-body RAM bits, or may be stored off-die, for example, on a different die within wafer 1200. Using an optimal write voltage for each die on a wafer may allow higher-speed, lower-power and more reliable floating-body RAM chips.

Persons of ordinary skill in the art will appreciate that the illustrations in FIG. 12 are exemplary only and are not drawn to scale. Such skilled persons will further appreciate that many variations may be possible such as, for example, while FIG. 12 discussed using optimal write voltages for each die on the wafer, each wafer in a wafer lot may have its own optimal write voltage that may be determined, for example, by tests conducted on circuits built on scribe lines of wafer 1200, a 'dummy' mini-array on wafer 1200, or a sample of floating-body RAM dice on wafer 1200. Moreover, interpolation or extrapolation of the test results from, such as, for example, scribe line built circuits or floating-body RAM dice, may be utilized to calculate and set the optimized programming voltage for untested dice. For example, optimized write voltages may be determined by testing and measurement of die 1202 and die 1222, and values of write voltages for die 1208 and die 1216 may be an interpolation calculation, such as, for example, to a linear scale. Many other modifications within the scope of the illustrated embodiments of the invention described herein will suggest themselves to such skilled persons after reading this specification. Thus the invention is to be limited only by the appended claims.

Figure 13:
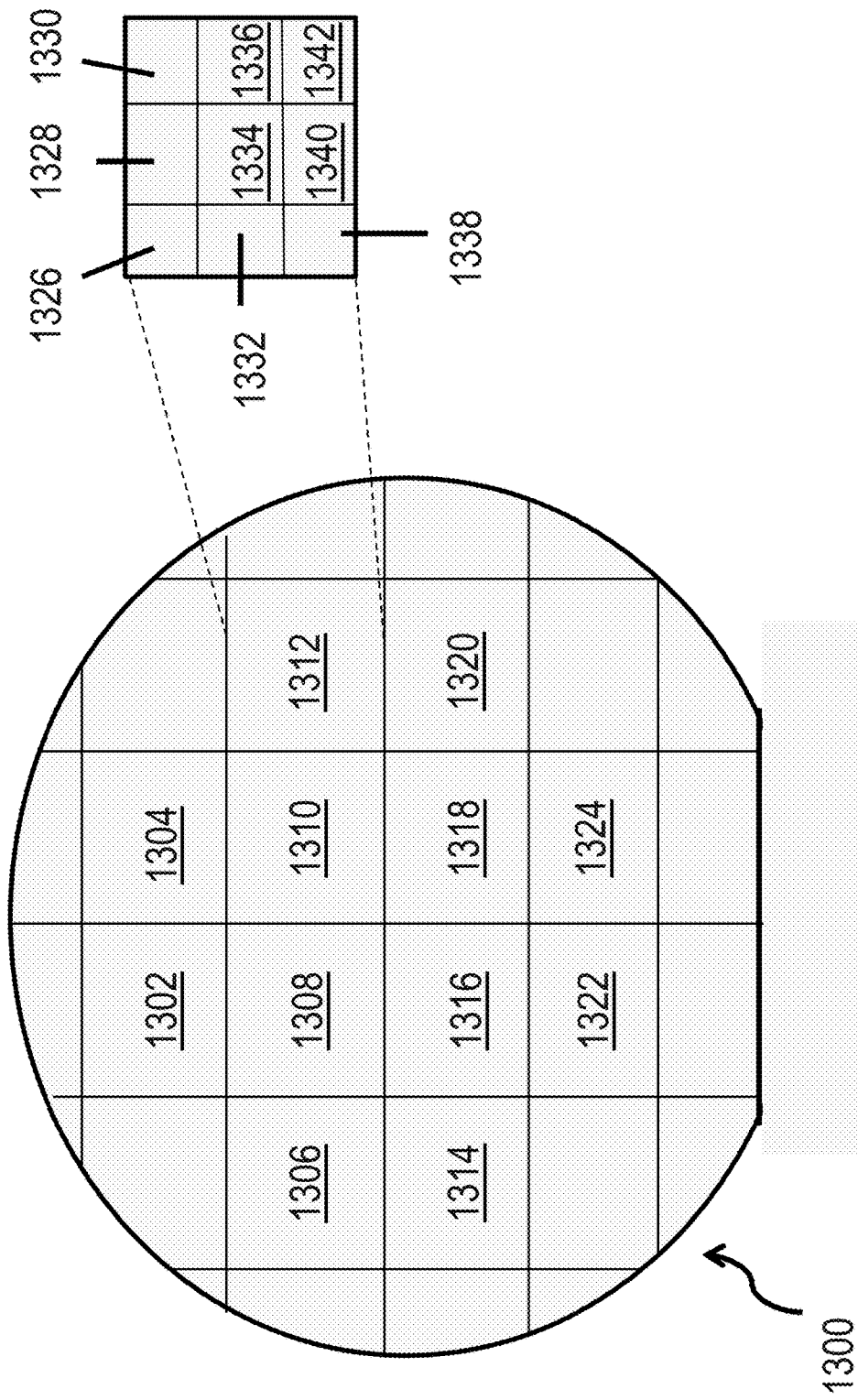
FIG. 13 is an exemplary drawing illustration of different write voltages utilized for different parts of a chip (or die)

FIG. 13 illustrates an embodiment of the invention wherein optimized for different parts of a chip (or die) write voltages may be utilized. As an illustrative example, wafer 1300 may include chips 1302, 1304, 1306, 1308, 1310, 1312, 1314, 1316, 1318, 1320, 1322 and 1324. Each chip, such as, for example, chip 1312, may include a number of different parts or blocks, such as, for example, blocks 1326, 1328, 1330, 1332, 1334, 1336, 1338, 1340 and 1342. Each of these different parts or blocks may have its own optimized write voltage that may be determined by measurement of test circuits which may, for example, be built onto the memory die, within each block, or on another die. This optimal write voltage may be stored on the floating body RAM die, such as die 1302, by using some type of non-volatile memory, such as, for example, metal or oxide fuse-able links, or intentional damage programming of floating-body RAM bits, or may be stored off-die, for example, on a different die within wafer 1300, or may be stored within a block, such as block 1326.

Figure 14:
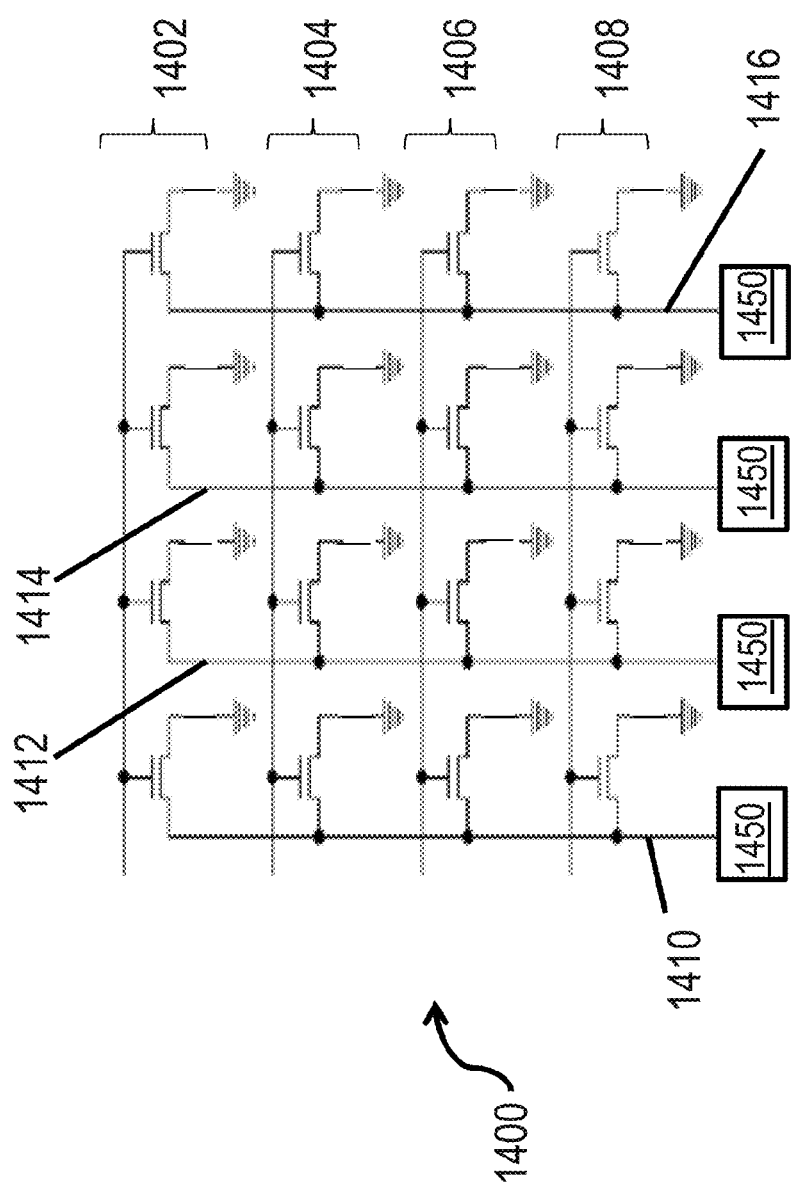
FIG. 14 is an exemplary drawing illustration of write voltages for floating-body RAM cells may be based on the distance of the memory cell from its write circuits.

FIG. 14 illustrates an embodiment of the invention wherein write voltages for floating-body RAM cells may be substantially or partly based on the distance of the memory cell from its write circuits. As an illustrative example, memory array portion 1400 may include bit-lines 1410, 1412, 1414 and 1416 and may include memory rows 1402, 1404, 1406 and 1408, and may include write driver circuits 1450. The memory row 1402 with memory cells may be farthest away from the write driver circuits 1450, and so, due to the large currents of floating-body RAM operation, may suffer a large IR drop along the wires. The memory row 1408 with memory cells may be closest to the write driver circuits 1450 and may have a low IR drop. Due to the IR drops, the voltage delivered to each memory cell of a row may not be the same, and may be significantly different. To tackle this issue, write voltages delivered to memory cells may be adjusted based on the distance from the write driver circuits. When the IR drop value may be known to be higher, which may be the scenario for memory cells farther away from the write driver circuits, higher write voltages may be used. When the IR drop may be lower, which may be the scenario for memory cells closer to the write driver circuits, lower write voltages may be used.

Write voltages may be tuned based on temperature at which a floating body RAM chip may be operating. This temperature based adjustment of write voltages may be useful since required write currents may be a function of the temperature at which a floating body RAM device may be operating. Furthermore, different portions of the chip or die may operate at different temperatures in, for example, an embedded memory application. Another embodiment of the invention may involve modulating the write voltage for different parts of a floating body RAM chip based on the temperatures at which the different parts of a floating body RAM chip operate. Refresh can be performed more frequently or less frequently for the floating body RAM by using its temperature history. This temperature history may be obtained by many methods, including, for example, by having reference cells and monitoring charge loss rates in these reference cells. These reference cells may be additional cells placed in memory arrays that may be written with known data. These reference cells may then be read periodically to monitor charge loss and thereby determine temperature history.

Figure 15A:
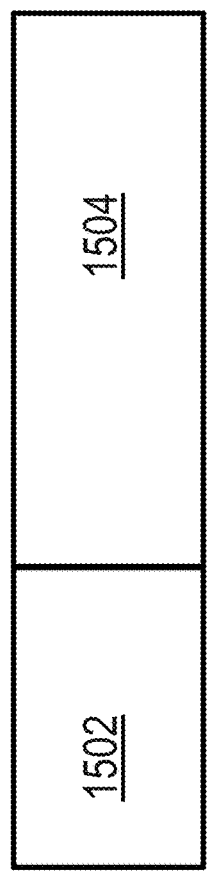
FIGS. 15A-15C are exemplary drawing illustrations of configurations useful for controller functions.
Figure 15B:
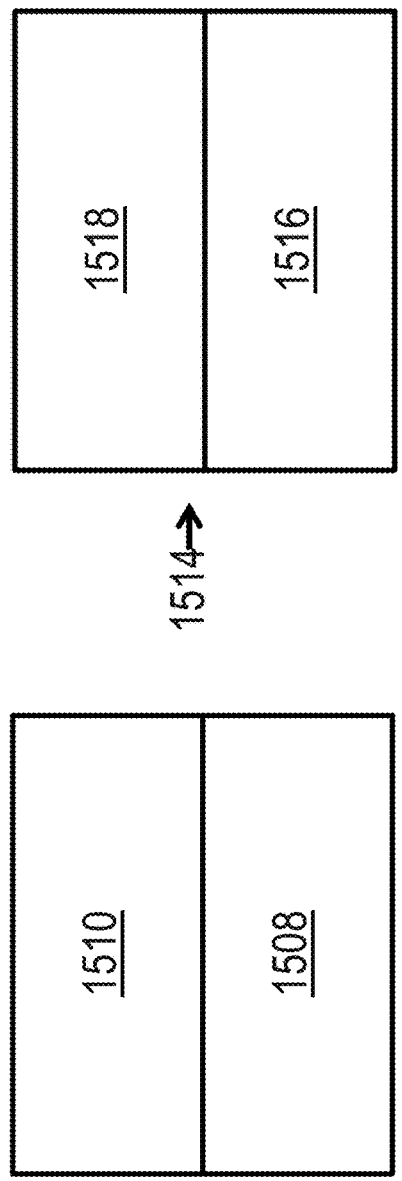
Figure 15C:
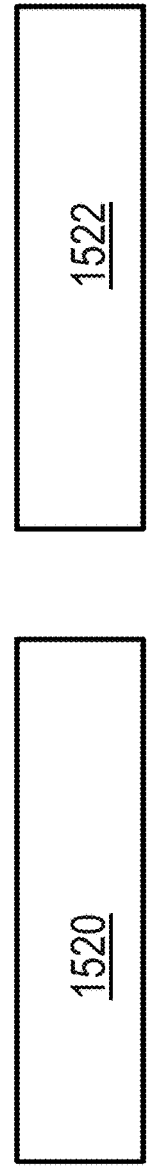

In FIG. 8 to FIG. 14, various techniques to improve floating-body RAM were described. Many of these techniques may involve addition of additional circuit functionality which may increase control of the memory arrays. This additional circuit functionality may be henceforth referred to as 'controller circuits' for the floating-body RAM array, or any other memory management type or memory regions described herein. FIGS. 15A-C illustrates an embodiment of the invention where various configurations useful for controller functions are outlined. FIG. 15A illustrates a configuration wherein the controller circuits 1502 may be on the same chip 1506 as the memory arrays 1504. FIG. 15B illustrates a 3D configuration 1512 wherein the controller circuits may be present in a logic layer 1508 that may be stacked below the floating-body RAM layer 1510. As well, FIG. 15B illustrates an alternative 3D configuration 1514 wherein the controller circuits may be present in a logic layer 1518 that may be stacked above a floating-body RAM array 1516. 3D configuration 1512 and alternative 3D configuration 1514 may be constructed with 3D stacking techniques and methodologies, including, for example, monolithic or TSV. FIG. 15C illustrates yet another alternative configuration wherein the controller circuits may be present in a separate chip 1520 while the memory arrays may be present in floating-body chip 1522. The configurations described in FIGS. 15A-C may include input-output interface circuits in the same chip or layer as the controller circuits. Alternatively, the input-output interface circuits may be present on the chip with floating-body memory arrays. The controller circuits in, for example, FIG. 15, may include memory management circuits that may extend the useable endurance of said memory, memory management circuits that may extend the proper functionality of said memory, memory management circuits that may control two independent memory blocks, memory management circuits that may modify the voltage of a write operation, and/or memory management circuits that may perform error correction and so on. Memory management circuits may include hardwired or soft coded algorithms.

Figure 16A:
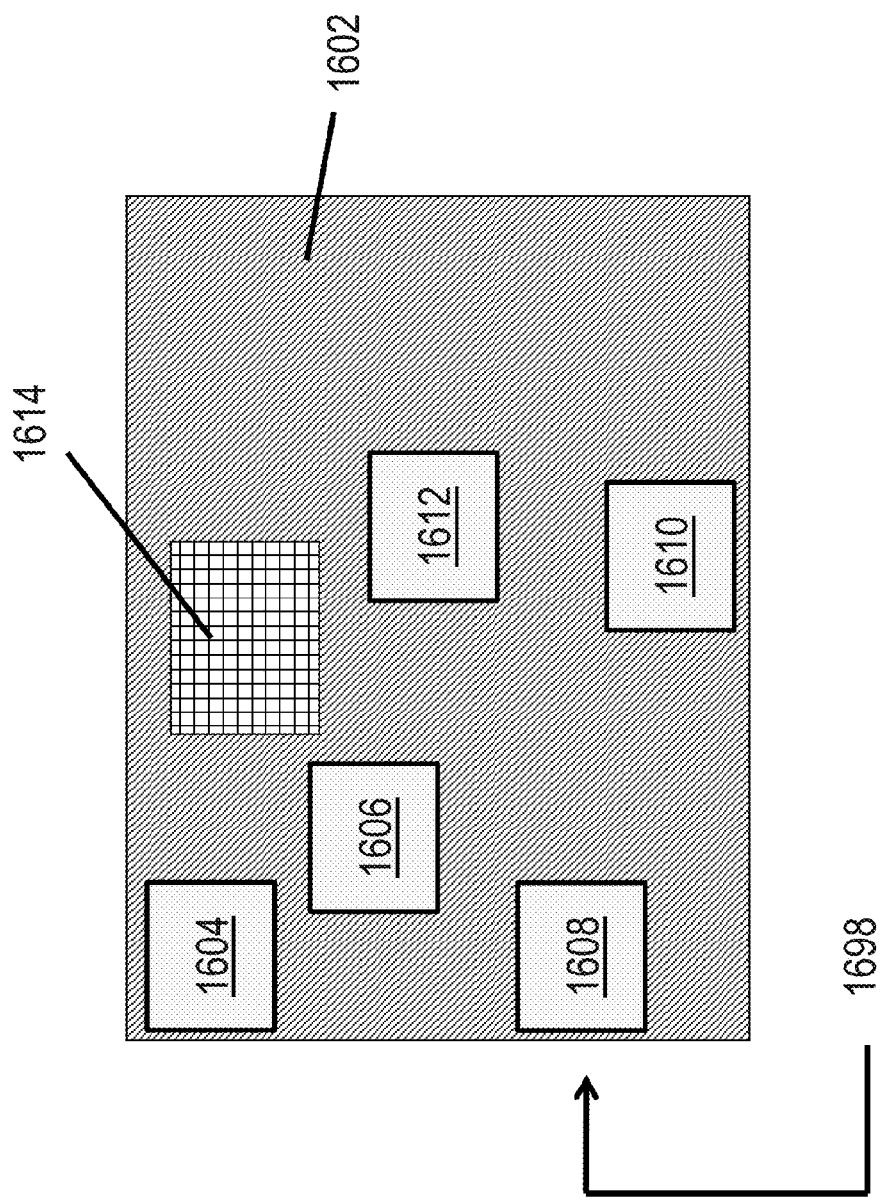
FIGS. 16A-16B are exemplary drawing illustrations of controller functionality and architecture applied to applications.
Figure 16B:
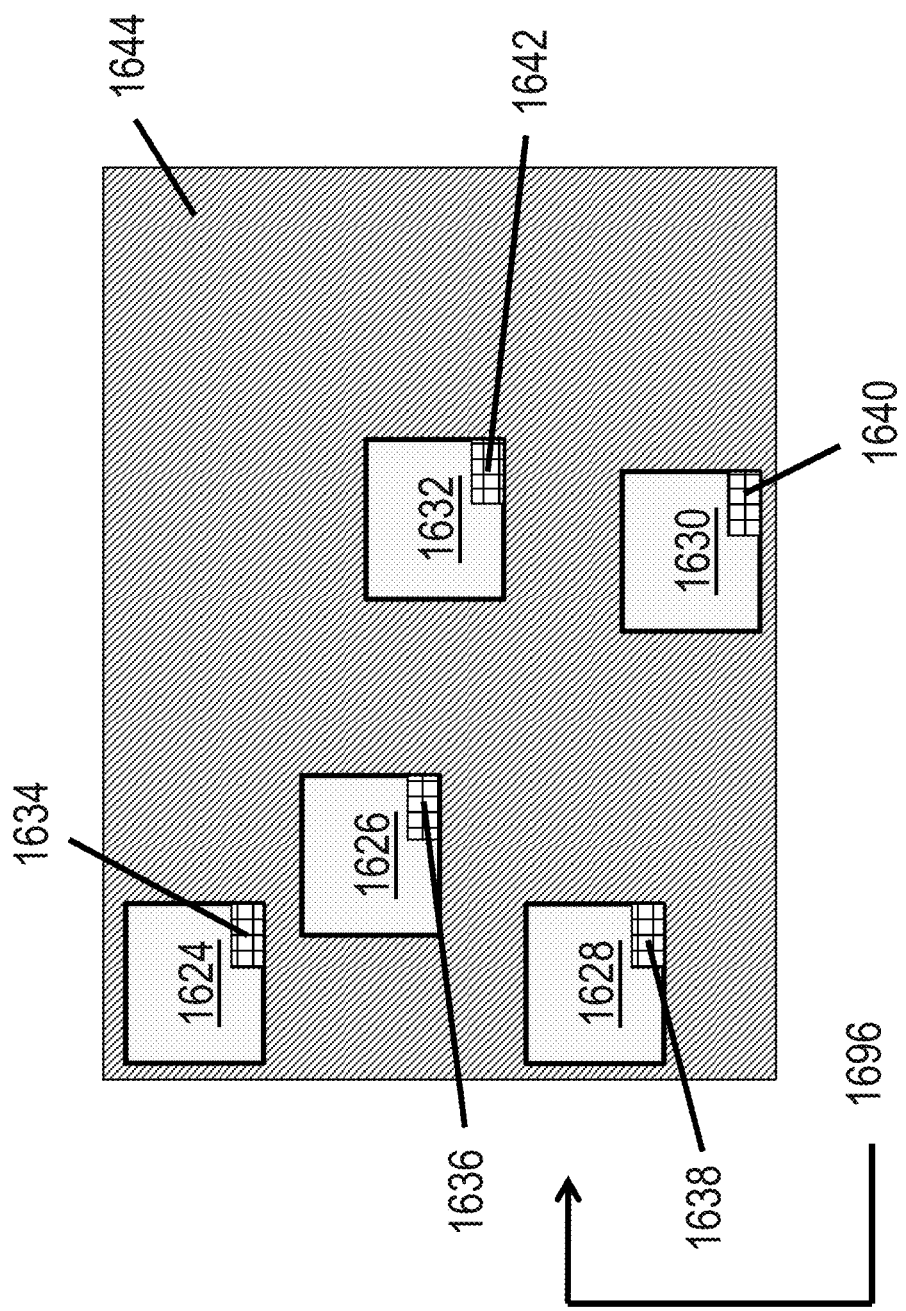

FIGS. 16A-B illustrates an embodiment of the invention wherein controller functionality and architecture may be applied to applications including, for example, embedded memory. As an illustrated in FIG. 16A, embedded memory application die 1698 may include floating-body RAM blocks 1604, 1606, 1608, 1610 and 1612 spread across embedded memory application die 1698 and logic circuits or logic regions 1602. In an embodiment of the invention, the floating-body RAM blocks 1604, 1606, 1608, 1610 and 1612 may be coupled to and controlled by a central controller 1614. As illustrated in FIG. 16B, embedded memory application die 1696 may include floating-body RAM blocks 1624, 1626, 1628, 1630 and 1632 and associated memory controller circuits 1634, 1636, 1638, 1640 and 1642 respectively, and logic circuits or logic regions 1644. In an embodiment of the invention, the floating-body RAM blocks 1624, 1626, 1628, 1630 and 1632 may be coupled to and controlled by associated memory controller circuits 1634, 1636, 1638, 1640 and 1642 respectively.

Figure 17:
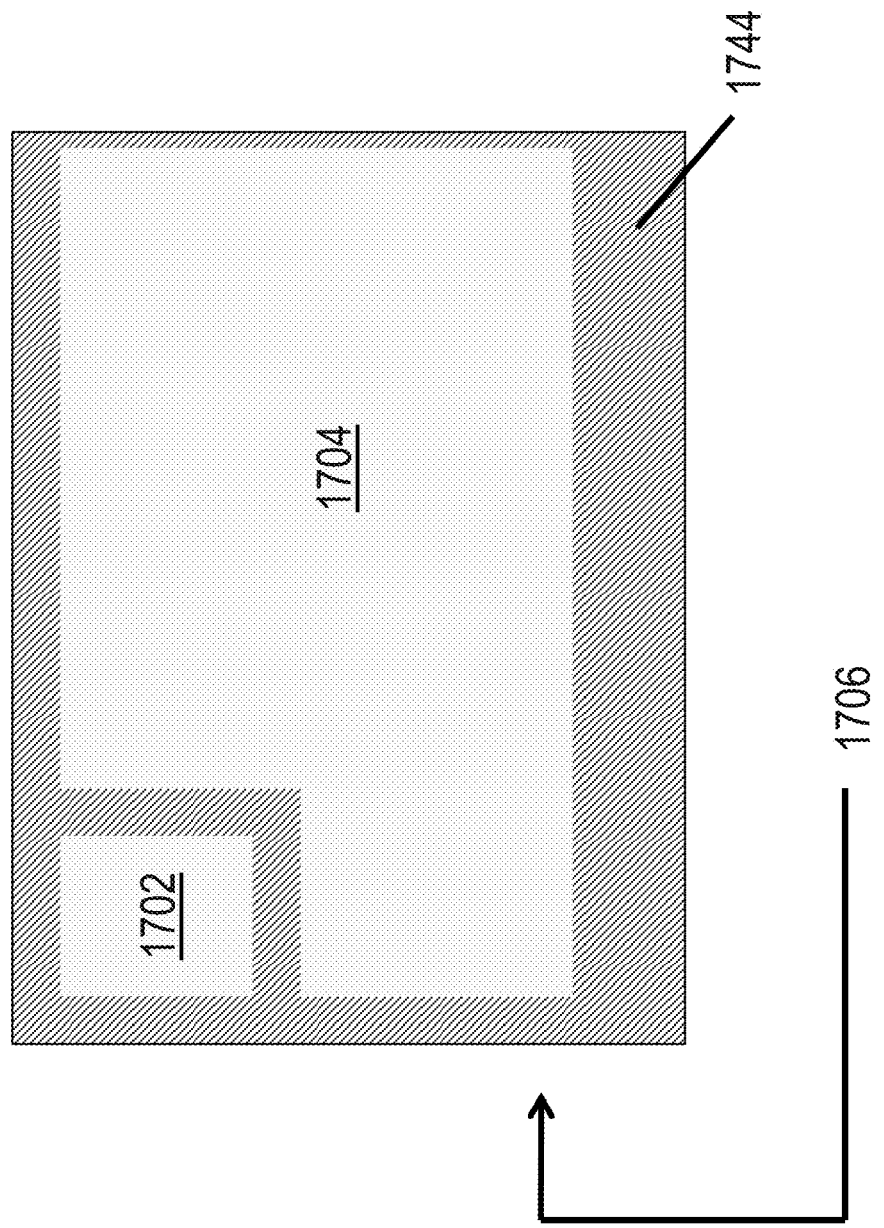
FIG. 17 is an exemplary drawing illustration of a cache structure in a floating body RAM chip.

FIG. 17 illustrates an embodiment of the invention wherein cache structure 1702 may be utilized in floating body RAM chip 1706 which may have logic circuits or logic regions 1744. The cache structure 1702 may have shorter block sizes and may be optimized to be faster than the floating-body RAM blocks 1704. For example, cache structure 1702 may be optimized for faster speed by the use of faster transistors with lower threshold voltages and channel lengths. Furthermore, cache structure 1702 may be optimized for faster speed by using different voltages and operating conditions for cache structure 1702 than for the floating-body RAM blocks 1704.

Persons of ordinary skill in the art will appreciate that the illustrations in FIGS. 8 through 17 are exemplary only and are not drawn to scale. Such skilled persons will further appreciate that many variations may be possible such as, for example, many types of floating body RAM may be utilized and the invention may not be limited to any one particular configuration or type. For example, monolithic 3D floating-body RAM chips, 2D floating-body RAM chips, and floating-body RAM chips that might be 3D stacked with through-silicon via (TSV) technology may utilize the techniques illustrated with FIG. 8 to FIG. 17. Many other modifications within the scope of the illustrated embodiments of the invention described herein will suggest themselves to such skilled persons after reading this specification. Thus the invention is to be limited only by the appended claims.

Figure 32:
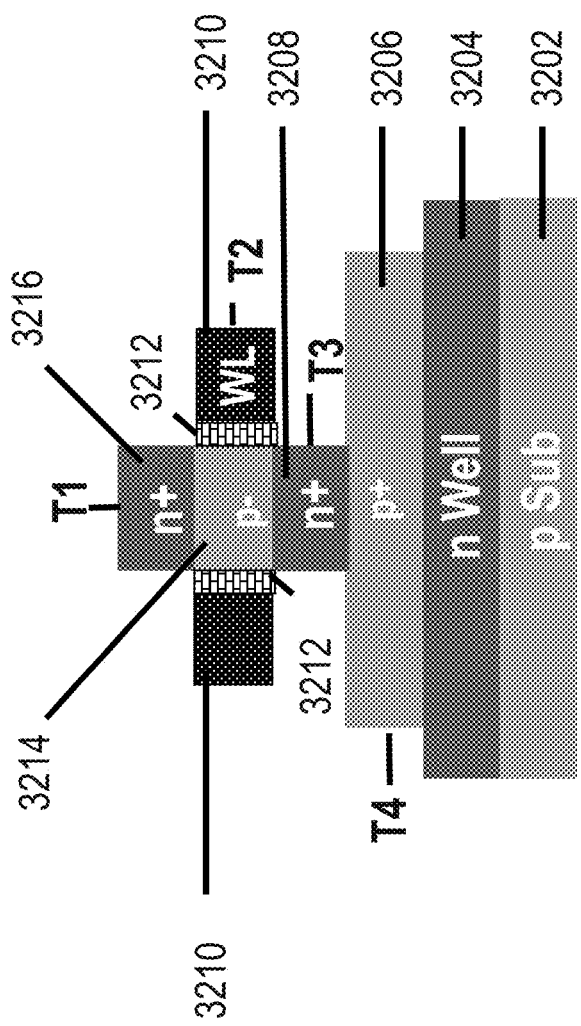
FIG. 32 is an exemplary drawing illustration of a floating body RAM that may not require high electric fields for write.

FIG. 32 illustrates a floating-body RAM cell that may require lower voltages than previous cells and may operate without the use of high-field effects. In FIG. 32, 3202 may be a p-type substrate, 3204 may be an n-well region, 3206 may be a p+ region, 3208 may be an n+ region, 3210 may be a word-line, 3212 may be a gate dielectric, 3214 may be a p type region and 3216 may be a second n+ region. The device may be controlled with four terminals, represented by T1, T2, T3 and T4. Several bias schemes may be used with a device such as this one. Further details of this floating-body RAM cell and its bias schemes may be described in pending patent application 2011/0019482.

FIGS. 33A-L illustrates an embodiment of the invention, wherein a horizontally-oriented monolithic 3D Floating-Body RAM array may be constructed that may not require high-field effects for write operations. One mask may utilized on a "per-memory-layer" basis for the monolithic 3D DRAM shown in FIGS. 33A-L, and all other masks may be shared between different layers. The process flow may include the following steps which may be in sequence from Step (A) to Step (K). When the same reference numbers are used in different drawing figures (among FIGS. 33A-K), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 33A:
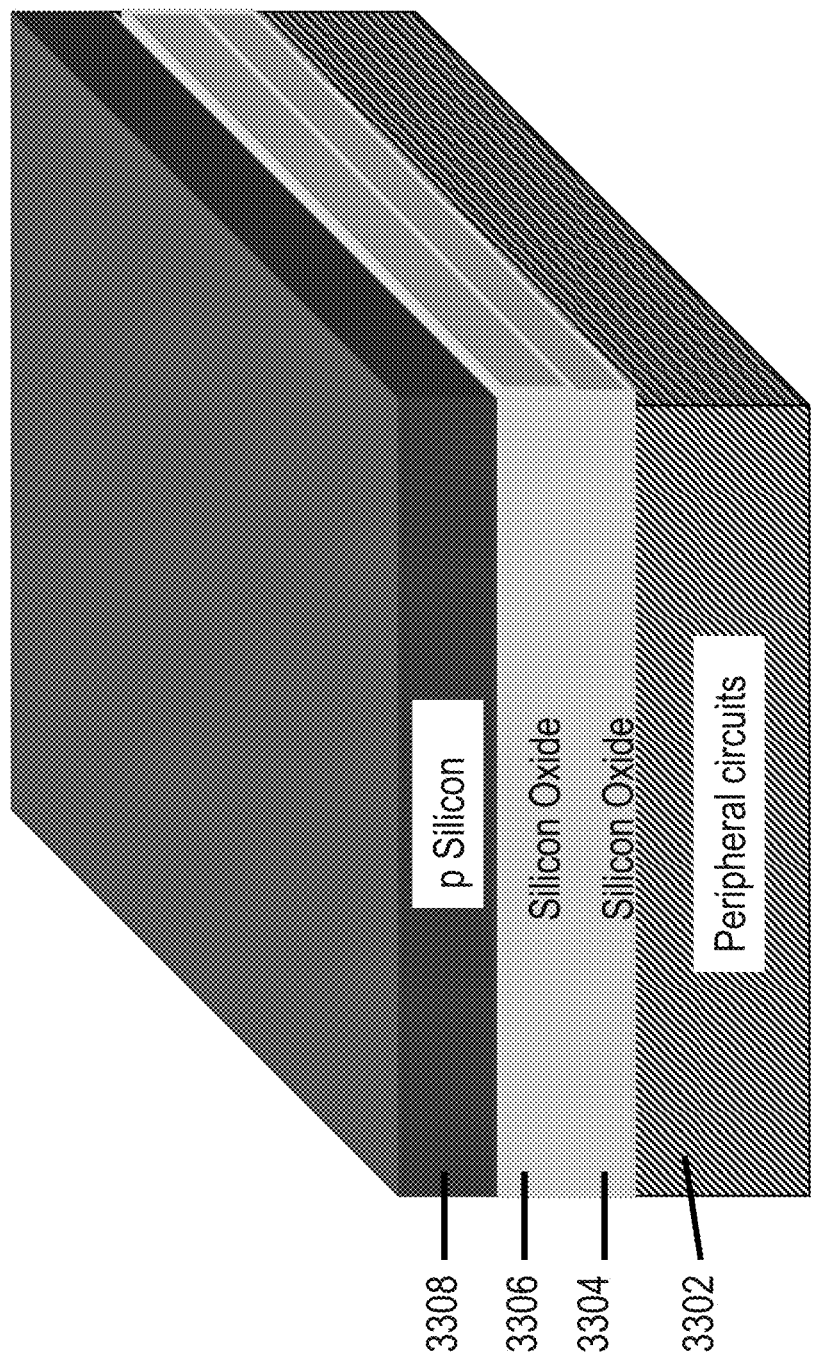

Step (A): FIG. 33A illustrates the structure after Step (A). Using procedures similar to those described in FIGS. 31A-31C, a monocrystalline p Silicon layer 3308 may be layer transferred atop peripheral circuits 3302. Peripheral circuits 3302 may utilize high temperature wiring (interconnect metal layers), made with metals, such as, for example, tungsten, and may include logic circuit regions. Oxide-to-oxide bonding between oxide layers 3304 and 3306 may be utilized for this transfer, in combination with ion-cut processes.

Step (B): FIG. 33B illustrates the structure after Step (B). Using a lithography step, implant processes and other process steps, n+ silicon regions 3312 may be formed. Thus p-silicon regions 3310 may be formed.

Step (C): FIG. 33C illustrates the structure after Step (C). An oxide layer 3314 may be deposited atop the structure shown in FIG. 33B.

Figure 33D:
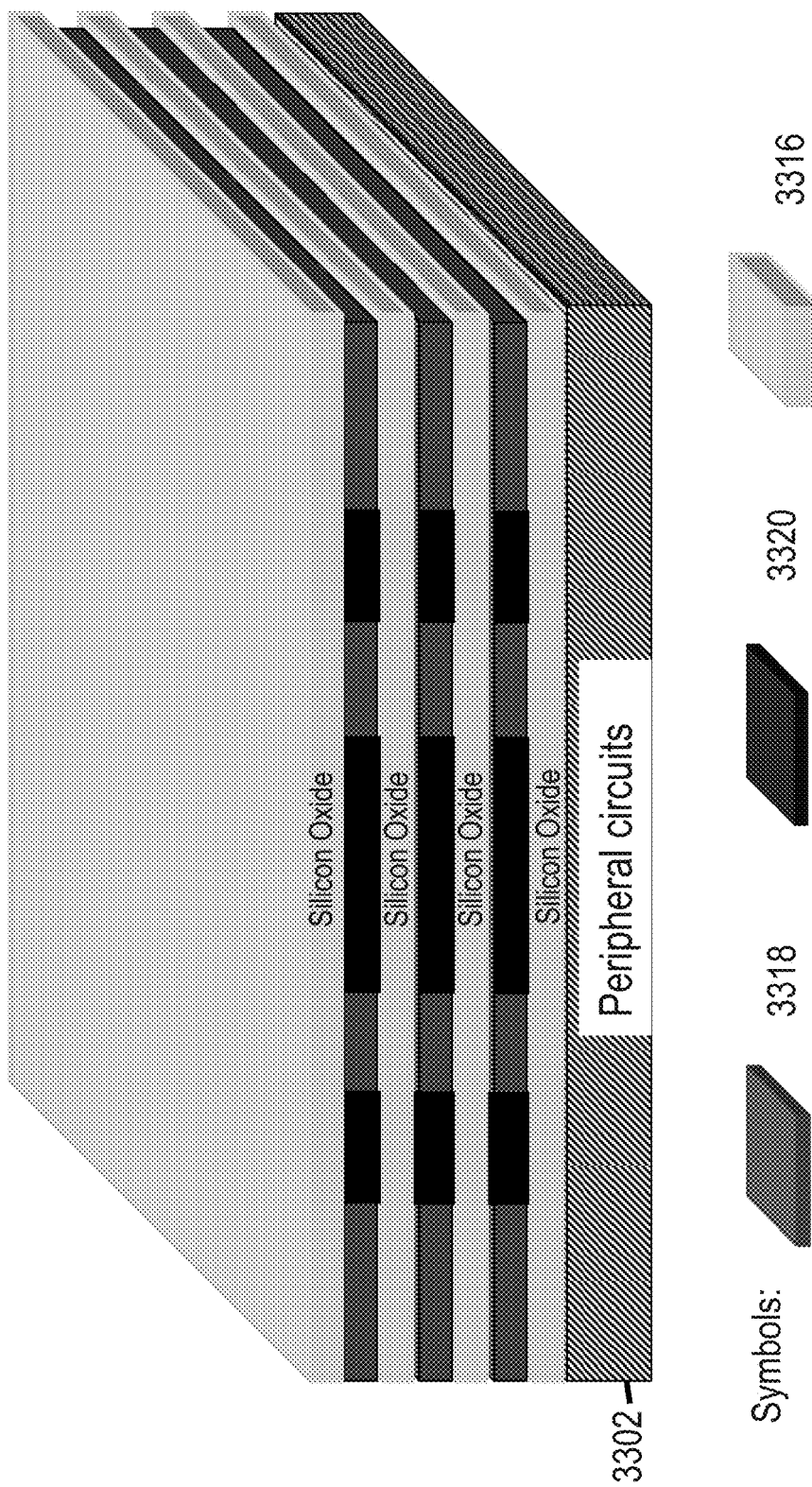

Step (D): FIG. 33D illustrates the structure after Step (D). Using methods similar to Steps (A), (B) and (C), multiple silicon layers having n+ silicon regions 3320 and p silicon regions 3318 may be formed with associated silicon oxide layers 3316. Oxide layer 3304 and oxide layer 3306, which were previously oxide-oxide bonded, are now illustrated as oxide layer 3316.

Figure 33E:
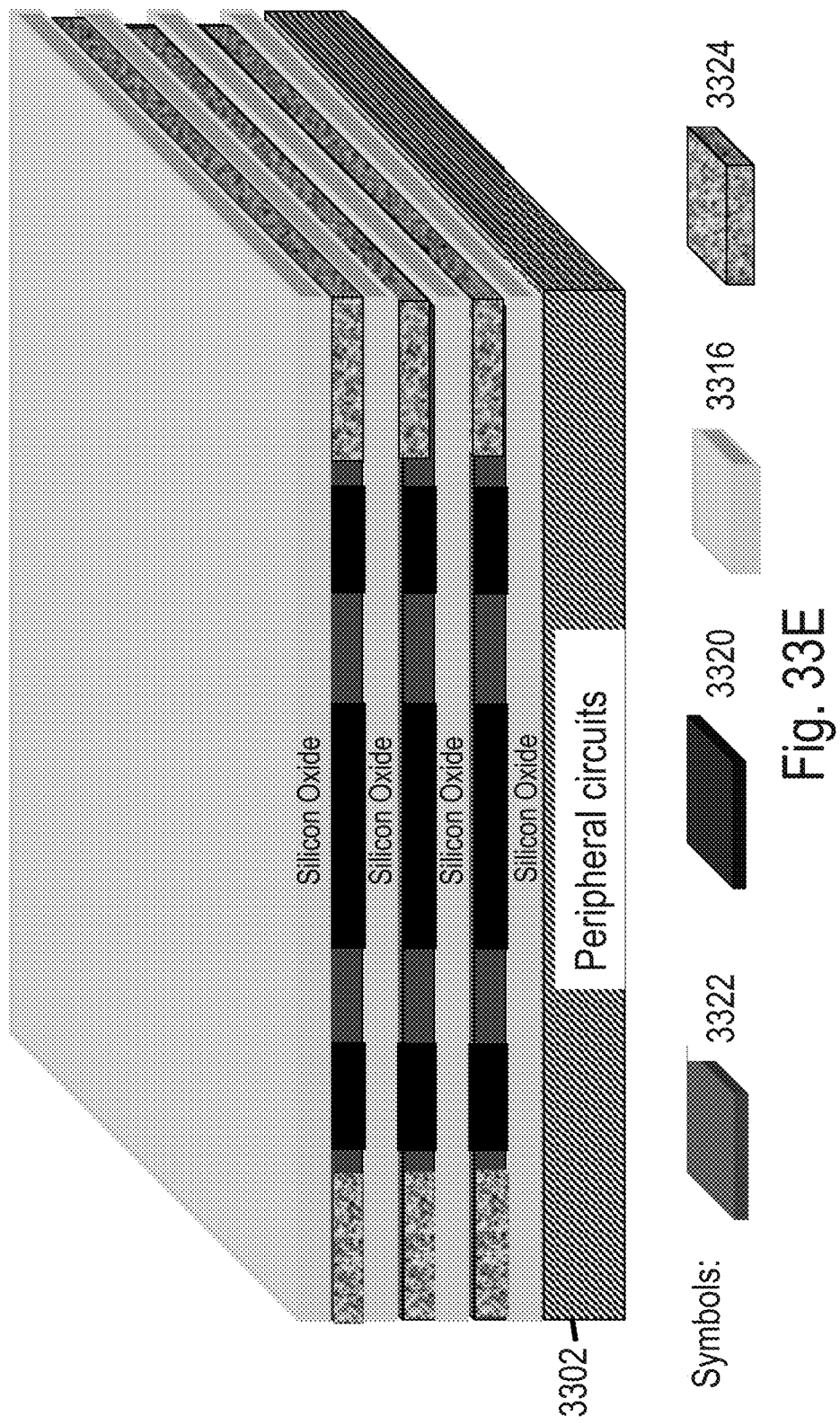

Step (E): FIG. 33E illustrates the structure after Step (E). Using lithography, multiple implant processes, and other steps such as resist strip, p+ silicon regions 3324 may be formed in multiple layers. 3322 may represent p silicon regions, 3320 may indicate n+ silicon regions and silicon oxide layers 3316. A Rapid Thermal Anneal (RTA) may be conducted to activate dopants in all layers. The multiple implant steps for forming p+ silicon regions 3324 may have different energies when doping each of the multiple silicon layers.

Step (F): FIG. 33F illustrates the structure after Step (F). Lithography and etch processes may then be utilized to make a structure as shown in the figure. The etch of multiple silicon layers and associated silicon oxide layers may stop on oxide layer 3386 (shown), or may extend into and etch a portion of oxide layer 3386 (not shown). Thus exemplary patterned oxide regions 3330 and patterned regions of n+ silicon 3328, p silicon 3326 and p+ silicon 3332 may be formed.

Step (G): FIG. 33G illustrates the structure after Step (G). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 3334 and gate electrode regions 3336 may be formed.

Figure 33H:
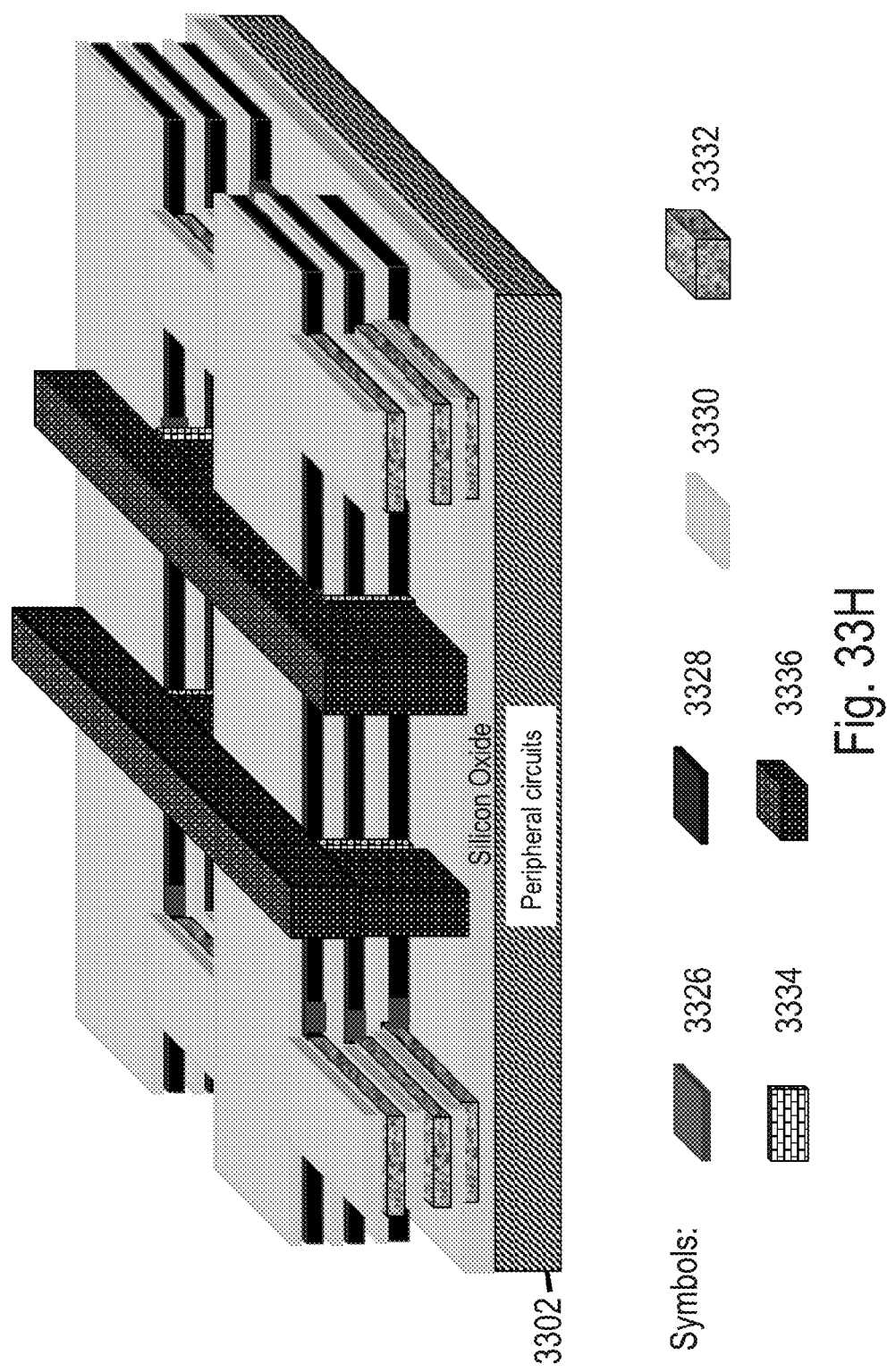

Step (H): FIG. 33H illustrates the structure after Step (H). Silicon dioxide (not shown) may be deposited and then planarized. In FIG. 33H and subsequent steps in the process flow, the overlying silicon dioxide regions may not be shown for clarity.

Figure 33I:
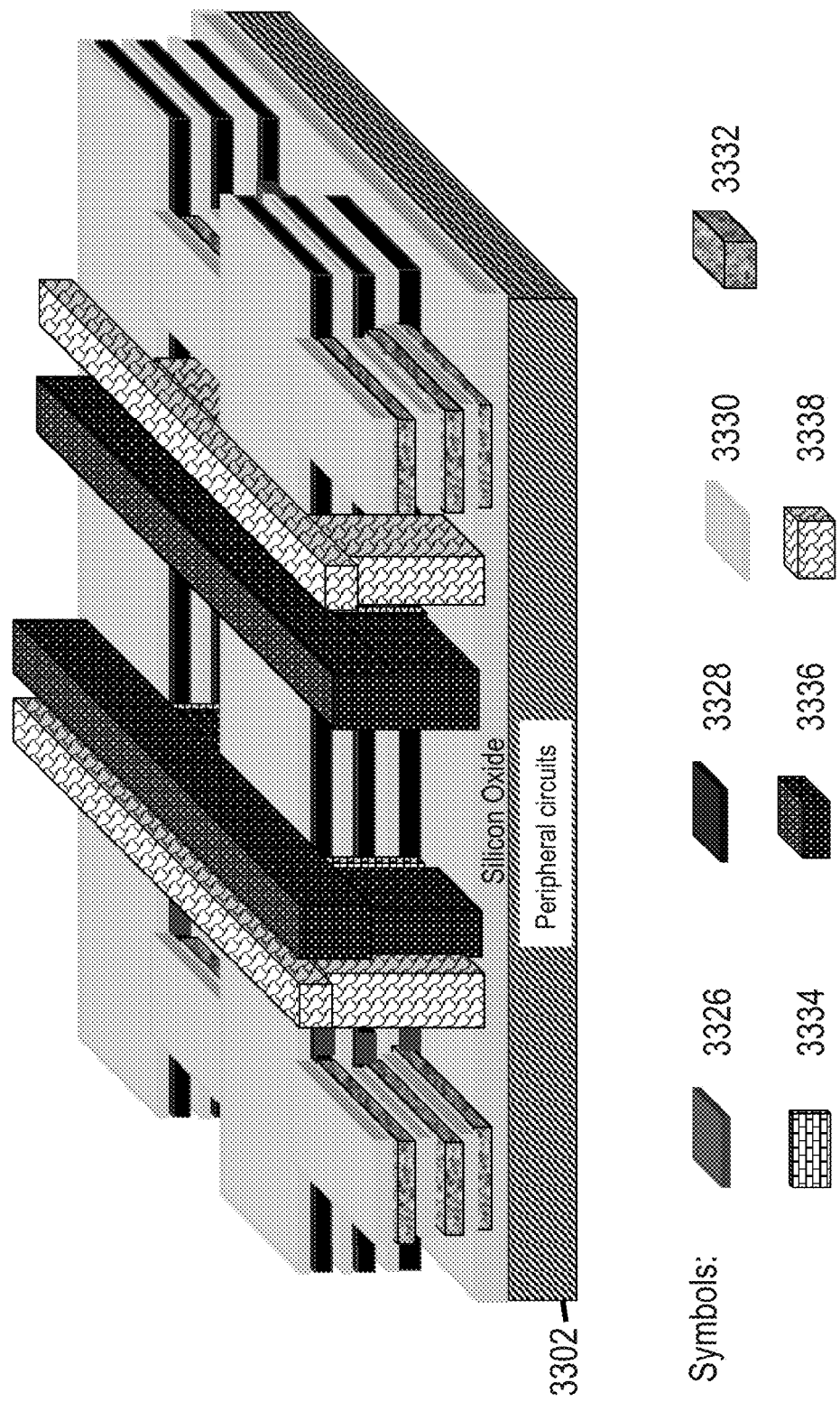

Step (I): FIG. 33I illustrates the structure after Step (I). Openings may be created within the (transparent) silicon oxide regions utilizing lithography and etch steps and other processes such as resist and residue cleaning. A contact material which may include, such as, for example, metal silicide, may be formed in these openings following which a chemical mechanical polish step may be conducted to form conductive regions 3338.

Step (J): FIG. 33J illustrates the structure after Step (J). A trench, for example two of which may be placed as shown in FIG. 33J, may be formed by lithography, etch and clean processes. The trench etch may etch multiple silicon layers and associated silicon oxide layers and may stop on oxide layer 3386 or may extend into and etch a portion of oxide layer 3386. A conductive contact material, such as aluminum, copper, tungsten and associated barrier metals, such as Ti/TiN, may then be filled in the trenches, thus forming conductive contact regions 3340.

Step (K): FIG. 33K illustrates the structure after Step (K). Wiring 3342 may be formed. The terminals of memory cells may include conductive regions 3338, gate electrode regions 3336, p+ silicon regions 3332 and conductive contact regions 3340. Contacts may then be made to terminals of the memory array at its edges. Contacts to regions 3332 at the edges of the array can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., or using the staircase methods of "A stacked memory device on logic 3D technology for ultra-high-density data storage," *Nanotechnology*, 22 (2011) 254006 by J. Kim, et al., following which contacts can be constructed to them. Formation of stair-like structures for regions 3332 at the edges of the array could be done in steps prior to Step (K) as well.

Figure 33L:
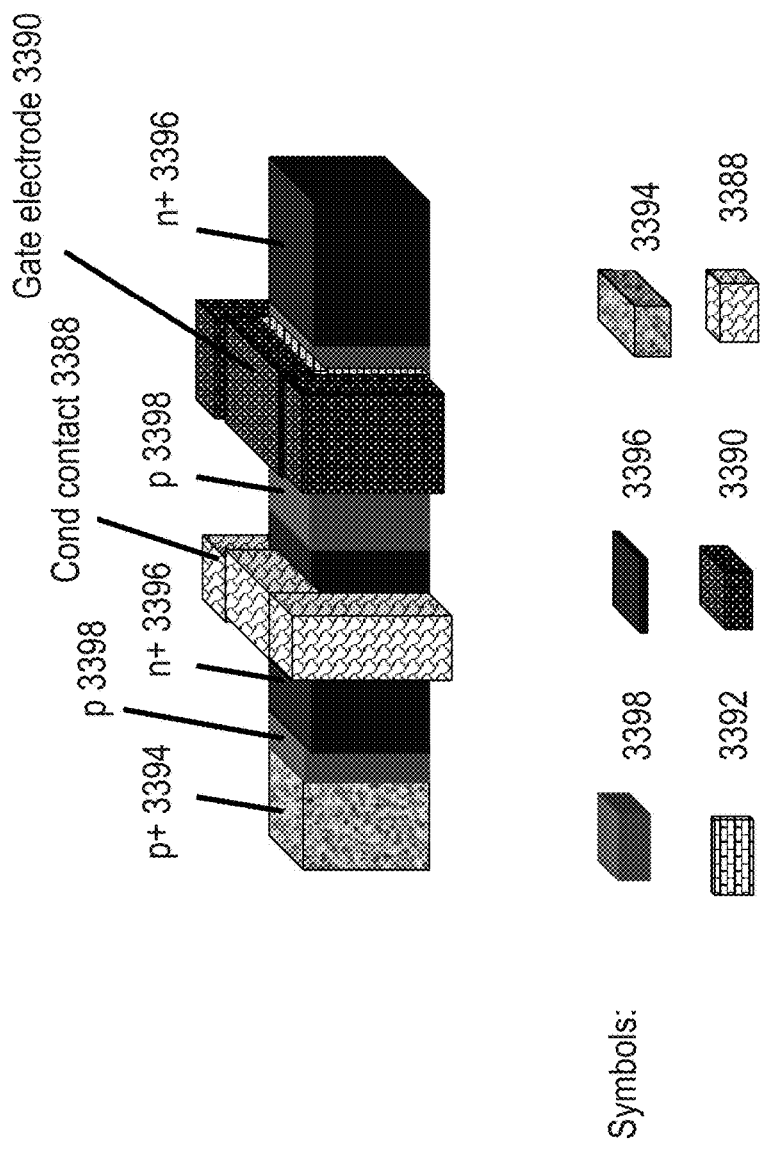

FIG. 33L illustrates a single cell of the memory array. p+ regions 3394, p regions 3398, n+ silicon regions 3396, gate dielectric regions 3392, gate electrode regions 3390 and conductive contact regions 3388 may be parts of the memory cell. This cell may be operated using bias schemes described in pending patent application 2011/0019482. Alternatively, some other bias scheme may be used.

A procedure for constructing a monolithic 3D DRAM has thus been described, with (1) horizontally-oriented transistors—i.e. current flowing in substantially the horizontal direction in transistor channels, (2) some of the memory cell control lines may be constructed of heavily doped silicon and embedded in the memory cell layer, (3) side gates simultaneously deposited over multiple memory layers for transistors, (4) monocrystalline (or single-crystal) silicon layers obtained by layer transfer techniques such as ion-cut, and (5) high-field effects may not be required for write operations. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as p Silicon layer 3308, may have a thickness of less than about 150 nm.

Persons of ordinary skill in the art will appreciate that the illustrations in FIGS. 33A through 33L are exemplary only and are not drawn to scale. Such skilled persons will further appreciate that many variations may be possible such as, for example, layer transfer techniques other than the described hydrogen implant and ion-cut may be utilized. Moreover, while FIGS. 33A-L described the procedure for forming a monolithic 3D DRAM with one mask per memory layer and all other masks may be shared among multiple memory layers, alternative procedures could be used. For example, p+ regions 3332 may be formed by using an additional lithography step on a "per-layer" basis that may not be shared among all memory layers. Alternatively, both p+ regions 3332 and n+ regions 3328 may be formed with multiple energy implants and masks shared among all memory layers. Alternatively, procedures similar to those described in patent application Ser. No. 13/099,010, the contents of the foregoing application is incorporated herein by reference, may be used to construct the monolithic 3D DRAM. Alternatively, the directions of some or all of the wiring/terminals of the array may be perpendicular to the directions shown in FIGS. 33A-33K to enable easier biasing. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic/periphery circuit regions within one monocrystalline layer to memory regions within another monocrystalline layer. Additional (e.g. third or fourth) monocrystalline layers that may have memory regions may be added to the stack. Decoders and other driver circuits of said memory may be part of the stacked logic circuit layer or logic circuit regions. Many other modifications within the scope of the illustrated embodiments of the invention will suggest themselves to such skilled persons after reading this specification. Thus the invention is to be limited only by the appended claims.

Refresh Schemes for DRAMs and Floating Body RAM Arrays

Refresh may be a key constraint with conventional capacitor-based DRAM. Floating-body RAM arrays may require better refresh schemes than capacitor-based DRAM due to the lower amount of charge they may store. Furthermore, with an auto-refresh scheme, floating-body RAM may be used in place of SRAM for many applications, in addition to being used as an embedded DRAM or standalone DRAM replacement.

Figure 18:
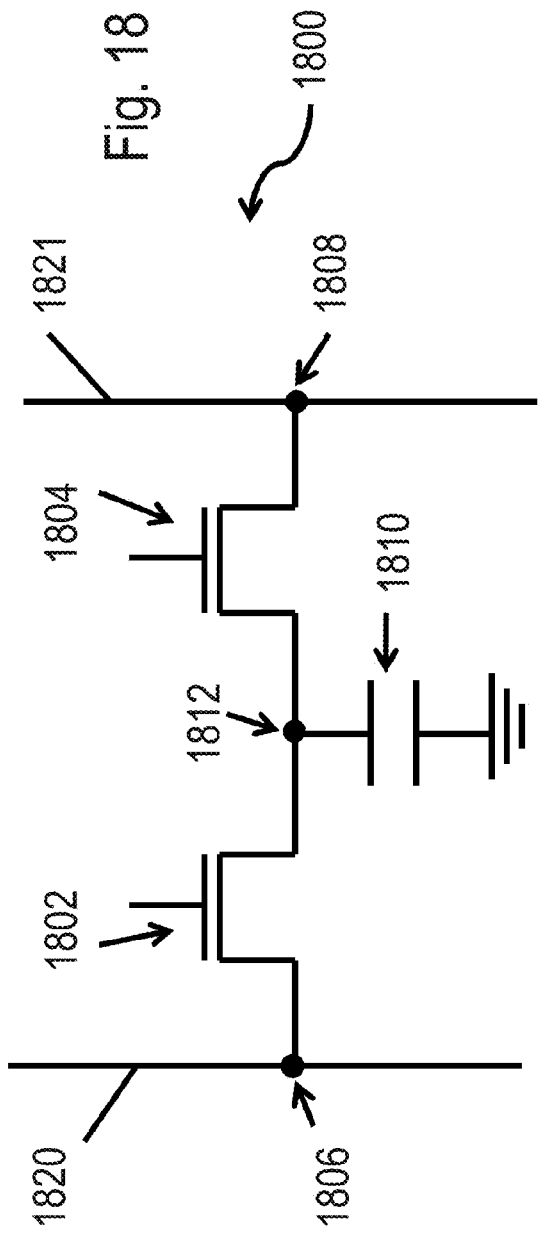
FIG. 18 is an exemplary drawing illustration of a dual-port refresh scheme for capacitor-based DRAM.

FIG. 18 illustrates an embodiment of the invention wherein a dual-port refresh scheme may be utilized for capacitor-based DRAM. A capacitor-based DRAM cell 1800 may include capacitor 1810, select transistor 1802, and select transistor 1804. Select transistor 1802 may be coupled to bit-line 1820 at node 1806 and may be coupled to capacitor 1810 at node 1812. Select transistor 1804 may be coupled to bit-line 1821 at node 1808 and may be coupled to capacitor 1810 at node 1812. Refresh of the capacitor-based DRAM cell 1800 may be performed using the bit-line 1821 connected to node 1808, for example, and leaving the bit-line 1820 connected to node 1806 available for read or write, i.e, normal operation. This may tackle the key challenge that some memory arrays may be inaccessible for read or write during refresh operations. Circuits required for refresh logic may be placed on a logic region located either on the same layer as the memory, or on a stacked layer in the 3DIC. The refresh logic may include an access monitoring circuit that may allow refresh to be conducted while avoiding interference with the memory operation. The memory or memory regions may, for example, be partitioned such that one portion of the memory may be refreshed while another portion may be accessed for normal operation. The memory or memory regions may include a multiplicity of memory cells such as, for example, capacitor-based DRAM cell 1800.

Persons of ordinary skill in the art will appreciate that the illustrations in FIG. 18 are exemplary only and are not drawn to scale. Such skilled persons will further appreciate that many variations may be possible such as, for example, a dual-port refresh scheme may be used for standalone capacitor based DRAM, embedded capacitor based DRAM that may be on the same chip or on a stacked chip, and monolithic 3D DRAM with capacitors. Moreover, refresh of the capacitor-based DRAM cell 1800 may be performed using the bit-line 1820 connected to node 1806 and leaving the bit-line 1821 connected to node 1808 available for read or write. Many other modifications within the scope of the illustrated embodiments of the invention described herein will suggest themselves to such skilled persons after reading this specification. Thus the invention is to be limited only by the appended claims.

Other refresh schemes may be used for monolithic 3D DRAMs and for monolithic 3D floating-body RAMs similar to those described in US patent application 2011/0121366 and in FIG. 6A-J of patent application Ser. No. 13/836,080. For example, refresh schemes similar to those described in "The ideal SoC memory: 1T-SRAM™," *Proceedings of the ASIC/SOC Conference*, pp. 32-36, 2000 by Wingyu Leung, Fu-Chieh Hsu and Jones, M.-E may be used for any type of floating-body RAM. Alternatively, these types of refresh schemes may be used for monolithic 3D DRAMs and for monolithic 3D floating body RAMs similar to those described in US patent application 2011/0121366 and in FIG. 6A-J of this patent application. Refresh schemes similar to those described in "Autonomous refresh of floating body cells", Proceedings of the Intl. Electron Devices Meeting, 2008 by Ohsawa, T.; Fukuda, R.; Higashi, T.; et al. may be used for monolithic 3D DRAMs and for monolithic 3D floating body RAMs similar to those described in US patent application 2011/0121366 and in FIG. 6A-J of patent application Ser. No. 13/836,080.

Figure 19:
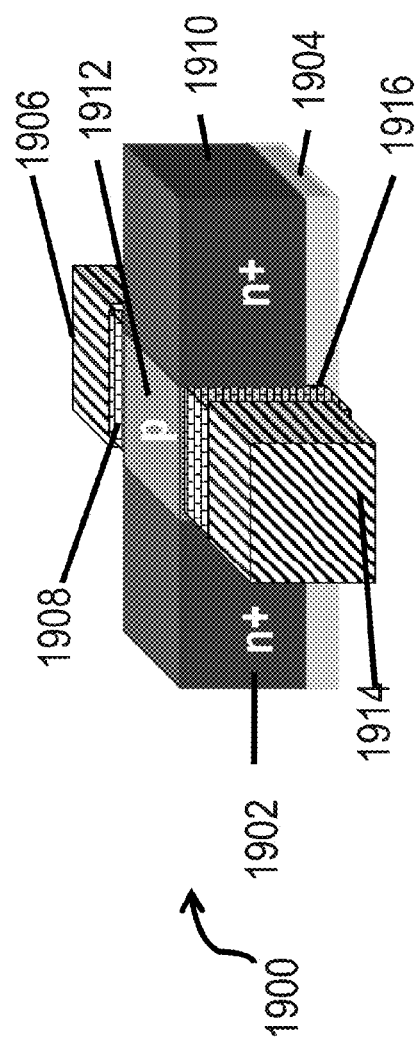
FIG. 19 is an exemplary drawing illustration of a double gate device used for monolithic 3D floating-body RAM.

FIG. 19 illustrates an embodiment of the invention in which a double gate device may be used for monolithic 3D floating-body RAM wherein one of the gates may utilize tunneling for write operations and the other gate may be biased to behave like a switch. As an illustrative example, nMOS double-gate DRAM cell 1900 may include n+ region 1902, n+ region 1910, oxide regions 1904 (partially shown for illustrative clarity), gate dielectric region 1908 and associated gate electrode region 1906, gate dielectric region 1916 and associated gate electrode region 1914, and p-type channel region 1912. nMOS double-gate DRAM cell 1900 may be formed utilizing the methods described in FIG. 6A-J of this patent application. For example, the gate stack including gate electrode region 1906 and gate dielectric region 1908 may be designed and electrically biased during write operations to allow tunneling into the p-type channel region 1912. The gate dielectric region 1908 thickness may be thinner than the mean free path for trapping, so that trapping phenomena may be reduced or eliminated.

Persons of ordinary skill in the art will appreciate that the illustrations in FIG. 19 are exemplary only and are not drawn to scale. Such skilled persons will further appreciate that many variations may be possible such as, for example, a pMOS transistor may be used in place of or in complement to nMOS double gate DRAM cell 1900. Moreover, nMOS double gate DRAM cell 1900 may be used such that one gate may be used for refresh operations while the other gate may be used for standard write and read operations. Furthermore, nMOS double-gate DRAM cell 1900 may be formed by method such as described in US patent application 2011/0121366. Many other modifications within the scope of the illustrated embodiments of the invention described herein will suggest themselves to such skilled persons after reading this specification. Thus the invention is to be limited only by the appended claims.

Figure 20A:
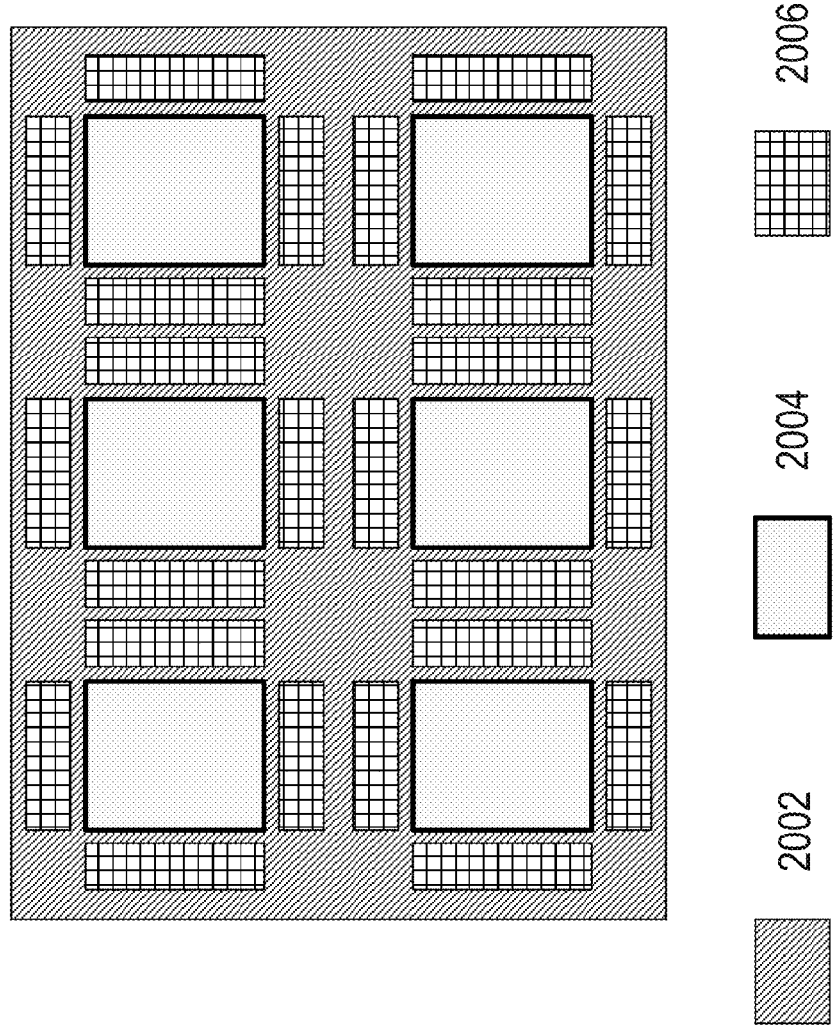
FIG. 20A is an exemplary drawing illustration of a 2D chip with memory, peripheral circuits, and logic circuits.

FIG. 20A illustrates a conventional chip with memory wherein peripheral circuits 2006 may substantially surround memory arrays 2004, and logic circuits or logic regions 2002 may be present on the die. Memory arrays 2004 may need to be organized to have long bit-lines and word-lines so that peripheral circuits 2006 may be small and the chip's array efficiency may be high. Due to the long bit-lines and word-lines, the energy and time needed for refresh operations may often be unacceptably high.

FIG. 20B illustrates an embodiment of the invention wherein peripheral circuits may be stacked monolithically above or below memory arrays using techniques described in patent application 2011/0121366, such as, for example, monolithic 3D stacking of memory and logic layers. Memory array stack 2022 may include memory array layer 2008 which may be monolithically stacked above peripheral circuit layer 2010. Memory array stack 2024 may include peripheral circuits 2012 which may be monolithically stacked above memory array layer 2014. Memory array stack 2022 and Memory array stack 2024 may have shorter bit-lines and word-lines than the configuration shown in FIG. 20A since reducing memory array size may not increase die size appreciably (since peripheral circuits may be located underneath the memory arrays). This may allow reduction in the time and energy needed for refresh.

FIG. 20C illustrates an embodiment of the invention wherein peripheral circuits may be monolithically stacked above and below memory array layer 2018 using techniques described in US patent application 2011/0121366, such as, for example, monolithic 3D stacking of memory and logic layers including vertical connections. 3D IC stack 2000 may include peripheral circuit layer 2020, peripheral circuit layer 2016, and memory array layer 2018. Memory array layer 2018 may be monolithically stacked on top of peripheral circuit layer 2016 and then peripheral circuit layer 2020 may then be monolithically stacked on top of memory array layer 2018. This configuration may have shorter bit-lines and word-lines than the configuration shown in FIG. 20A and may allow shorter bit-lines and word-lines than the configuration shown in FIG. 20B. 3D IC stack 2000 may allow reduction in the time and energy needed for refresh. A transferred monocrystalline layer, such as, for example, memory array layer 2018 and peripheral circuit layer 2020, may have a thickness of less than about 150 nm.

Persons of ordinary skill in the art will appreciate that the illustrations in FIGS. 20A through 20C are exemplary only and are not drawn to scale. Such skilled persons will further appreciate that many variations may be possible such as, for example, 3D IC stack may include, for example, two memory layers as well as two logic layers. Many other modifications within the scope of the illustrated embodiments of the invention described herein will suggest themselves to such skilled persons after reading this specification. Thus the invention is to be limited only by the appended claims.

FIG. 21 illustrates the cross-section of a floating body with embedded n layer NMOSFET 2100 with n+ source region 2104, n+ drain region 2106, p-well body 2108, gate metal and gate dielectric stack 2102, n layer 2110, and p substrate 2112. The n+ source region 2104, n+ drain region 2106, and p-well body 2108 may be of typical NMOSFET doping. As an embodiment of the invention, n layer 2110 may be formed by dopant ion implantation and dopant activation or by layer transfer below the p-well body 2108 of the floating body NMOSFET. Thus an NPN Bipolar Junction Transistor (BJT), referred hereafter as the embedded BJT, may be formed using the n+ source region 2104 as the emitter, the p-well body 2108 (floating) as the base, and the underlying n layer 2110 as the collector.

Figure 22A:
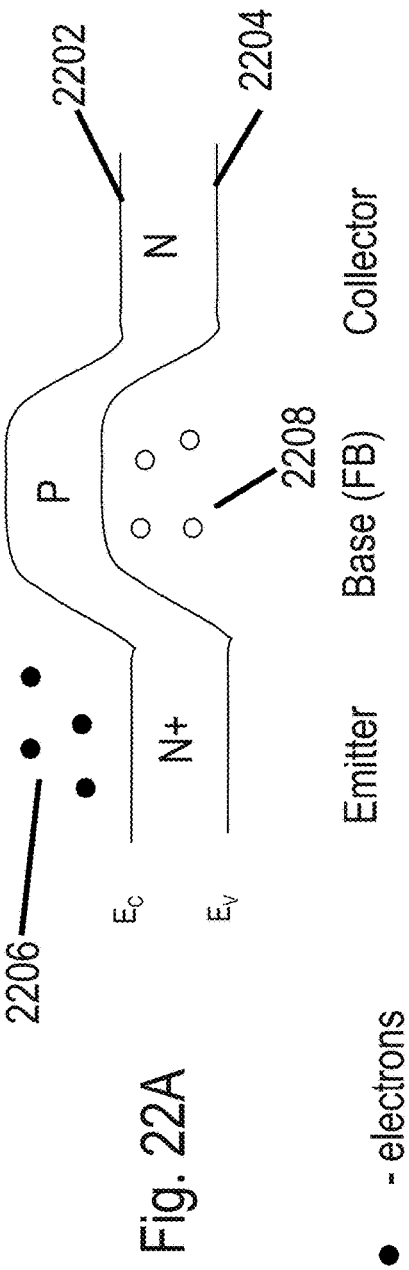
Figure 22B:
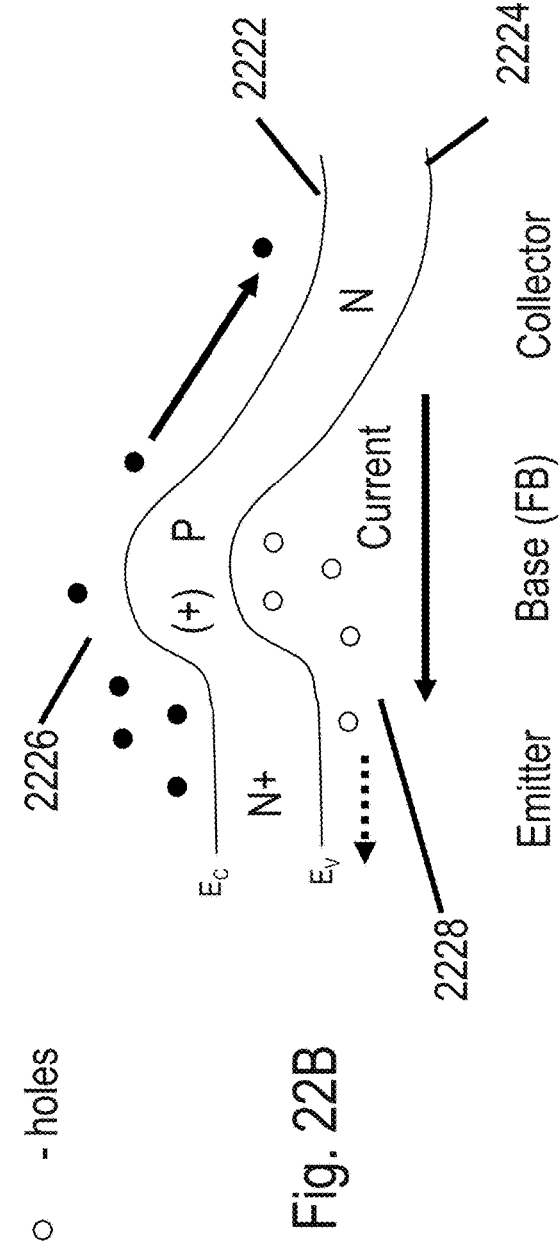

FIGS. 22A-22C illustrate the behavior of the embedded BJT during the floating body operation, programming, and erase. The horizontal direction may indicate position within the transistor and the vertical direction may indicate the energy level of the electrons and holes and energy bands.

"Emitter" in FIG. 22A-22C may represent n+ source region 2104, "Base (FB)" in FIG. 22A-22C may represent p-well body 2108 (floating), and "Collector" in FIG. 22A-22C may represent n layer region 2110.

FIG. 22A illustrates the electronic band diagram of the embedded BJT when there may be only a small concentration of holes in the p-well body 2108. The conduction band 2202, valence band 2204, electrons 2206, and holes in p-well body 2208 are shown under this condition where there may be low hole concentration in the p-well body 2208, and the embedded BJT may remain turned off, with no current flowing through the BJT, regardless of collector bias.

FIG. 22B illustrates the electronic band diagram of the embedded BJT when there may be a significant concentration of holes in the p base region that may be enough to turn on the p-n diode formed by the p-well body 2208 and the emitter n+ source region 2204. The conduction band 2222, valence band 2224, electrons 2226, and holes 2228 are shown under this condition where there may be significant concentration of holes in the p-well body 2208, and the embedded BJT may turn on. The p-base region potential may allow electrons to flow from the emitter to the base, and the holes to flow from the base to the emitter. The electrons that arrive at the base and do not recombine may continue on to the collector and may then be swept towards the collector terminal by the collector reverse bias.

FIG. 22C illustrates the BJT band diagram with the impact ionization process 2246 which may create electron-hole pairs in the collector region given high enough collector bias to generate a field of at least approximately 1E6 V/cm in the said region. The BJT band diagram includes conduction band 2242, valence band 2244. The newly generated electrons flow in the direction of the collector terminal 2248, together with the original electrons, while the newly generated holes flow in the opposite direction towards the base/floating body 2250. This flow of holes into the base/floating body region acts to refresh the floating body such that they add to the hole population in the base/floating body 2250. Henceforth, this refresh scheme may be referred to as the "embedded BJT floating body refresh scheme".

In order to give favorable conditions for impact ionization to occur in the collector region, it may be desired to keep the BJT gain $\beta=I_C/I_B$ as high as possible. Thus, the p-base/p-well body 2108 among the two n regions n+ source region 2104 and n+ drain region 2106 may be designed to be about 50 nm or thinner, and the p base/p-well body 2108 and collector n layer 2110 may be highly doped with a value greater than approximately $1E18/cm^3$ for providing a high electric field favorable to the impact ionization process.

Moreover, a heterostructure bipolar transistor (HBT) may be utilized in the floating body structure by using silicon for the emitter region material, such as n+ source region 2104 in FIG. 21, and SiGe for the base and collector regions, such as p-well body 2108 and the underlying n layer 2110 respectively, as shown in FIG. 21, thus giving a higher beta than a regular BJT.

FIG. 23 illustrates the energy band alignments of Silicon 2302 with bandgap of 1.1 eV, Si conduction band 2310, Si valence band 2312, and Germanium 2304 with bandgap of 0.7 eV, Ge conduction band 2320, Ge valence band 2322. The offset between the Si conduction band 2310 and the Ge conduction band 2320 may be −0.14 eV, and the offset between the Si Si valence band 2312 and the Ge valence band 2322 may be −0.26 eV. Persons of ordinary skill in the art will recognize that SiGe will have band offsets in its conduction and valence bands in linear proportion to the molar ratio of its Silicon and Germanium components. Thus, the HBT will have most of its band alignment offset in the valence band, thereby providing favorable conditions in terms of a valence band potential well for collecting and retaining holes.

Double-Gated Floating Body:

FIG. 24A illustrates the cross-section of a floating body NMOSFET 2400 with top gate metal and dielectric stack 2402 and bottom gate metal and dielectric stack 2414, source/emitter n+ region 2404, n+ drain region 2406, p floating body 2408, n collector region 2410, and second n collector region 2412.

As an embodiment of the invention, n collector region 2410 and second n collector region 2412 may be formed by dopant ion implantation and dopant activation, using the same mask (self-aligned) as for the source region 2404 and drain region 2406, but with higher implant energies.

The embedded BJT structure formed by source/emitter n+ region 2404, p floating body 2408, n collector region 2410 can be used for the embedded BJT floating body refreshing scheme as discussed above. The bottom gate metal and dielectric stack 2414 may be biased with a negative voltage to increase hole retention. The second n collector region 2412 may be utilized to further optimize hole generation, by acting together with n+ drain region 2406 and p floating body 2408 as another BJT substructure utilizing the embedded BJT floating body refresh scheme above. The bottom gate metal and dielectric stack 2414 can be used with the bottom MOSFET structure, including n collector region 2410, p floating body 2408, second n collector region 2412, and bottom gate and dielectric stack 2414, for hole generation.

FIG. 24B illustrates the top view of an embodiment of the invention, the device 2450 including gate metal and dielectric stack 2452 formed on a side of the p floating body 2458, and second gate metal and dielectric stack 2464 formed on the opposite side of the p floating body 2458, source/emitter n+ region 2454, n+ drain region 2456, n collector region 2460, and second n collector region 2462.

The source/emitter n+ region 2454, n+ drain region 2456, n collector region 2460, and second n collector region 2462 may be formed via dopant ion implantation and dopant activation with the geometry defined using a lithographic mask.

The embedded BJT structure formed by source/emitter n+ region 2454, p floating body 2458, n collector region 2460 may be used for the embedded BJT floating body refresh scheme as discussed above. The second gate metal and dielectric stack 2464 may be biased with a negative voltage to increase hole retention. The second n collector region 2462 may be utilized to further optimize hole generation, by acting together with n+ drain region 2456 and p floating body 2458 as another BJT substructure utilizing the embedded BJT floating body refresh scheme above. The second gate metal and dielectric stack 2464 may be used with the second MOSFET substructure, which may include n collector region 2460, p floating body 2458, second n collector region 2462, and second gate and dielectric stack 2464, for hole generation.

FinFET Floating Body:

FIG. 25 illustrates the cross-section of a FinFET floating body structure 2500 with surrounding gate dielectrics 2502 on three sides of the channel (only the top gate stack is shown), n+ source region 2504, n+ drain region 2506, p floating body 2508, and n collector region 2514 on the bottom side of the floating body 2508 insulated from the source and drain regions by oxide regions 2510 and 2512. A spacer patterning technology using a sacrificial layer and a chemical vapor deposition spacer layer developed by Y-K Choi et al (IEEE TED vol. 49 no. 3 2002) may be used to pattern the Silicon fin for the FinFET. As an embodiment of the invention, n collector region 2514 may be formed by dopant ion implantation and dopant activation, and oxide regions 2510 and 2512 may be formed by ion implantation of oxygen which, upon thermal anneal, may react with silicon to form the oxide.

The embedded BJT structure formed by n+ source region 2504 as emitter, p floating body 2508 as base, n collector region 2514 may be used for the embedded BJT floating body refresh scheme as discussed above.

Back-to-Back Transistor Structure:

FIG. 26 illustrates a back-to-back two-transistor configuration 2600 where n+ drain region 2606, n+ source/emitter region 2608, p floating body region 2612 and gate metal and dielectric stack 2602 may form a NMOSFET transistor used for the reading and programming p floating body region 2612 N+ source/emitter region 2608 as emitter, p floating body region 2612 as base, and n+ collector region 2610 may form a BJT transistor which may be used for the embedded BJT floating body refreshing scheme described above. The dummy gate and dielectric stack 2604 may remain unbiased, and the source/emitter region 2608 may be tied to ground during device operation. Using a conventional CMOS planar 2D flow, n+ drain region 2606, n+ source/emitter region 2608, and n+ collector region 2610 may be formed by a self-aligned to gate dopant ion implantation and thermal anneal, and the gate dielectrics of gate metal and dielectric stack 2602 and dummy gate metal and dielectric stack 2604 may be formed by oxide growth and/or deposition.

3D R-RAM with NAND like Architecture

The following description is taken from Wikipedia: Resistive random-access memory (RRAM or ReRAM) is a non-volatile memory type under development by a number of different companies, some of which have patented versions of ReRAM. The technology bears some similarities to CBRAM and phase change memory. Different forms of ReRAM have been disclosed, based on different dielectric materials, spanning from perovskites to transition metal oxides to chalcogenides. Even silicon dioxide has been shown to exhibit resistive switching as early as 1967, and has recently been revisited. Leon Chua, who is considered to be the father of non-linear circuit theory, has argued that all 2-terminal non-volatile memory devices including ReRAM should be considered memristors.

The basic idea is that a dielectric, which is normally insulating, can be made to conduct through a filament or conduction path formed after application of a sufficiently high voltage. The conduction path formation can arise from different mechanisms, including defects, metal migration, etc. Once the filament is formed, it may be reset (broken, resulting in high resistance) or set (re-formed, resulting in lower resistance) by an appropriately applied voltage. Recent data suggests that many current paths, rather than a single filament, are probably involved.

A memory cell can be deduced from the basic memory cell in three different ways. In the simplest approach, the pure memory element can be used as a basic memory cell, resulting in a configuration where parallel bitlines are crossed by perpendicular wordlines with the switching material placed between wordline and bitline at every cross-point. This configuration is called a cross-point cell. Since this architecture will lead to a large "sneak" parasitic current flowing through non selected memory cells via neighboring cells, the cross-point array has a very slow read access. A selection element can be added to improve the situation, but this selection element consumes extra voltage and power. A series connection of a diode in every cross-point allows one to reverse bias, zero bias, or at least partially bias non-selected cells, leading to negligible sneak currents. This can be arranged in a similar compact manner as the basic cross-point cell. Finally a transistor device (ideally an MOS Transistor) can be added which makes the selection of a cell very easy and therefore gives the best random access time, but comes at the price of increased area consumption.

For random access type memories, a transistor type architecture is preferred while the cross-point architecture and the diode architecture open the path toward stacking memory layers on top of each other and therefore may be ideally suited for mass storage devices. The switching mechanism itself can be classified in different aspects. First there are effects where the polarity between switching from the low to the high resistance level (reset operation) is reversed compared to the switching between the high and the low resistance level (set operation). These effects are called bipolar switching effects. On the contrary, there are also unipolar switching effects where both set and reset operations require the same polarity, but different voltage magnitude.

In U.S. Pat. No. 8,026,521, which is incorporated by reference herein its entirety, a 3D architecture is presented for R-RAM. In U.S. Pat. No. 7,843,718, which is incorporated by reference herein its entirety, another 3D architecture has been presented utilizing a vertical structure of what one skilled in the art would call a NAND architecture for RRAM. In a NAND architecture only two diffusion contacts are required to access an R-RAM structure that is serially connected, sometimes called a NAND string or chain.

The RRAM or memeristors may include transition metal oxides, polymeric memristor, ferroelectric memristor, spintronic memristor, spin transfer torque, phase-change structure, programmable metallization structure, conductive-bridging structure, magnetoresistive structure, chalcogenide structure. Typical RRAM materials may include transition metal oxides such as TiOx, NiOx, HFOx, WoX, TaOx, VoX, CuOx, SrToOx, CuSiOx, SiOx, TiON, and electrodes may include Pt, TiN/Ti, TiN, Ru, Ni, W, TaN, Ir, Au. STT-MRAM materials may include Ir, PtMn, CoFe, Ru, CoFeB, MgO, CoFeB, Ta.

Figure 34:
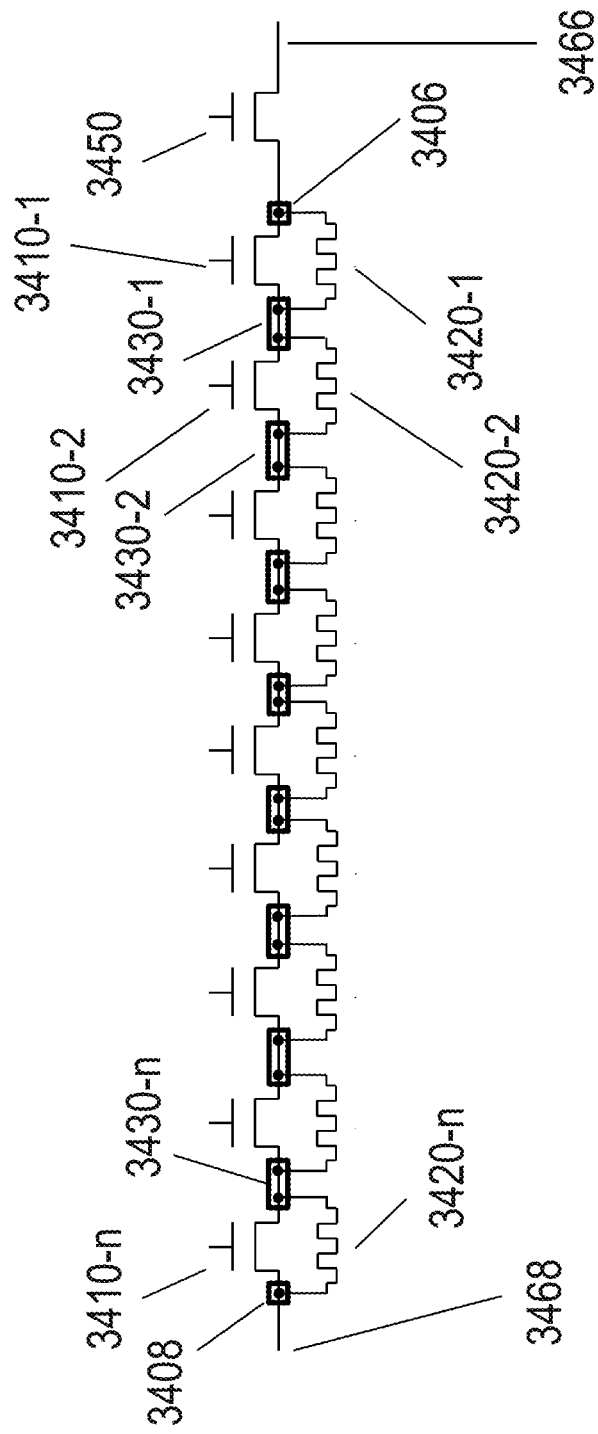
FIG. 34 is an exemplary drawing illustration of a schematic illustration of a NAND architecture string for memory such as R-RAM.

As illustrated in FIG. 34, an exemplary schematic illustration of a NAND architecture string for R-RAM may include string select transistor 3450, select string end diffusion with contact 3406, string end diffusion with contact 3408, first shared diffusion 3430-1, second shared diffusion 3430-2, up to n shared diffusions 3430-$n$, first memory transistor 3410-1, second memory transistor 3410-2, up to n memory transistors 3410-$n$, first memory element 3420-1, second memory element 3420-2, up to n memory element 3420-$n$, select string end 3466 and string end 3468. First memory element 3420-1, second memory element 3420-2, and up to n memory element 3420-$n$ may be an R-RAM or memristor, comprising such materials and devices as described above, and connected in parallel to their respective memory transistor, such parallel connection may be made at each of the respective shared diffusions. For example, the source and drain of first memory transistor 3410-1 may be connected to select string end diffusion with contact 3406 and first shared diffusion 3430-1 respectively, and the two ends of first memory element 3420-1 may be connected to select string end diffusion with contact 3406 and first shared diffusion 3430-1 respectively. Moreover, the source and drain of second memory transistor 3410-2 may be connected to first shared diffusion 3430-1 and second shared diffusion 3430-2 respectively, and the two ends of second memory element 3420-2 may be connected to first shared diffusion 3430-1 and second shared diffusion 3430-2 respectively. And so on to n memory element 3420-n, n shared diffusions 3430-n, and n memory transistors 3410-n. The n memory element and n memory transistor may share the string end diffusion with contact 3408 on one end of each as well as share a connection on the other end thru n shared diffusions 3430-n, which may be connected to the next set of paralleled memory transistor and memory element. Thus the R-RAM or the memristor elements may be each connected in parallel to their respective memory transistor and tied electrically as a serial string of parallel pairs (the parallel pair including a memory transistor and its associated memory element). Additionally, string select transistor 3450 may share a connection thru select string end diffusion with contact 3406 to one end of each of first memory element 3420-1 and first memory transistor 3410-1. By turning to 'on' all the memory transistors other than a selected memory transistor, which may be biased to be kept in the 'off' condition, a memory peripheral circuit can write or read the memory element of the selected off memory transistor by applying a current (or voltage as required) through the select string end 3466 and string end 3468 provided that the select transistor 3450 is on. These NAND strings may be formed as a multiplicity in the horizontal direction (such as for a 2D device structure on the same layer on a plane) or many further be formed as a multiplicity of the horizontally placed multiplicity in the vertical direction, wherein a NAND string may be on top of another NAND string, to form a 3D device structure with multiple layers or strata. A memory transistor on one layer or strata may overlay the memory transistor of a second layer or strata, and so forth. A memory transistor on one layer or strata may be considered to be a horizontally oriented transistor and may include a mono-crystalline material, such as for example, mono-crystalline silicon. A memory element, such as for example first memory element 3420-1, may be called and functionally act as a programmable resistor. An additional select transistor may be formed to connect to string end diffusion with contact 3408, thus enabling a select switch on each end of the NAND string.

The presented NAND R-RAM architecture could provide a higher density than other architectures as less area is consumed for contacts than with a ROM architecture. An additional advantage of this architecture is that a 3D structure could be constructed with a reduced number of critical lithography steps which would reduce the cost of the end product.

Figure 35A:
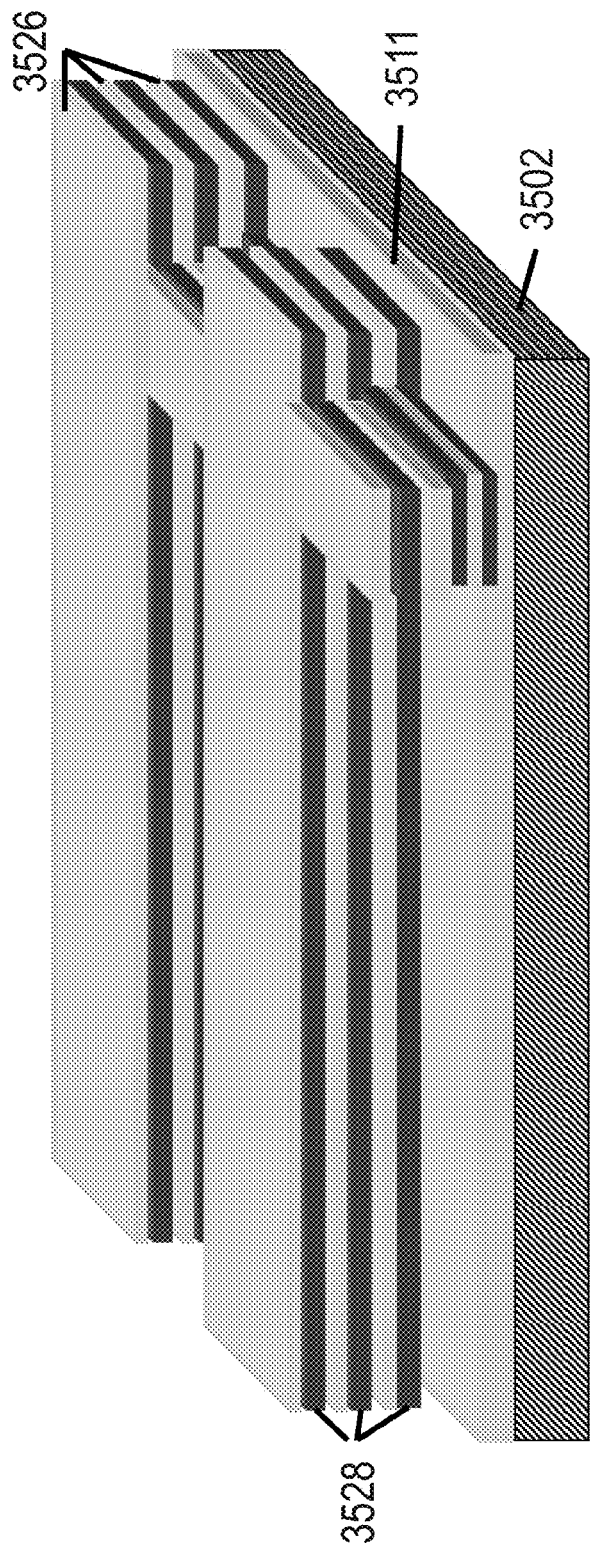
FIGS. 35A-35E are exemplary drawing illustrations of a process flow which may be utilized to form a 3D NAND R-RAM architecture.

As illustrated in FIGS. 35A-35E, a process flow which may be utilized to form a 3D NAND R-RAM architecture is shown and described. As illustrated in FIG. 35A, multiple mono-crystalline p− silicon layers may be formed with insulator layers in-between and then lithography and etch processes may be utilized to make a structure, such as, for example, as shown in FIG. 35A. Thus p− regions 3528 and insulator regions 3526 may be stacked and formed above peripheral circuits 3502, which may include the isolation and bonding insulator layer 3511. Processes to form the structure in FIG. 35A may include the steps described with respect to FIGS. 31A to 31E herein and in at least a portion of FIG. 106 in U.S. Pat. No. 8,273,610, incorporated herein by reference. The multi-layer/region stack structure may be formed within one lithographic and etch step, thus, the transistor elements or portions may have been defined by a common lithography step, which also may be described as a single lithography step, same lithography step, or one lithography step, or single masking step, same masking step, or one masking step. Peripheral circuits 3502 may be constructed with tungsten, or conventional aluminum/copper, wiring and may have isolation and/or bonding oxide above it (in-between the top metallization/wiring of peripheral circuits 3502 and the bottom p-silicon region in the stack, such as isolation and bonding insulator layer 3511. Isolation and bonding insulator layer 3511 may include an etch stop layer. The composition of the insulator regions 3526 within the stacked Si/SiO$_2$ layers may be insulators or dielectrics such as, for example, silicon dioxide, a low-k dielectric, carbon containing silicon oxides, amorphous carbon. The thickness of insulator regions 3526 within the stacked Si/SiO$_2$ layers may be adjusted to minimize layer to layer, strata to strata disturb and interference mechanisms, and may include thicknesses of 50 nm, 65 nm, 100 nm, 150 nm, 200 nm, 500 nm, and less than 1000 nm. Insulator regions 3526 within the stacked Si/SiO$_2$ layers may include a thin conductive layer, such as a metal, which may be formed between the two bonding oxides/insulator layers to form a field shield to mitigate layer to layer, strata to strata disturb and interference mechanisms, and may be electrically floating, or may be tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach, and then layer transferred on top of peripheral circuits 3502, or peripheral circuits may be formed on top of the memory stack. The peripheral circuits 3502 may include memory control circuits as well as circuitry for other purposes and of various types, such as, for example, analog, digital, RF, or memory, as well as circuits/devices as described herein and in the referenced patents, publications, applications. The lithography steps in the formation processing may be done with precise alignment to the underlying peripheral circuits 3502 as the stack layers are thin and the alignment marks on the peripheral circuits 3502 substrate/layer may be visible at the short wavelengths utilized for precision alignment. If necessary, a step of a window etch could be added for better visibility of the underneath alignment marks. In general, precise alignment is the good alignment of a state of the art stepper which results in a less than 40 nm alignment error. All the lithography steps may be aligned accordingly.

Figure 35B:
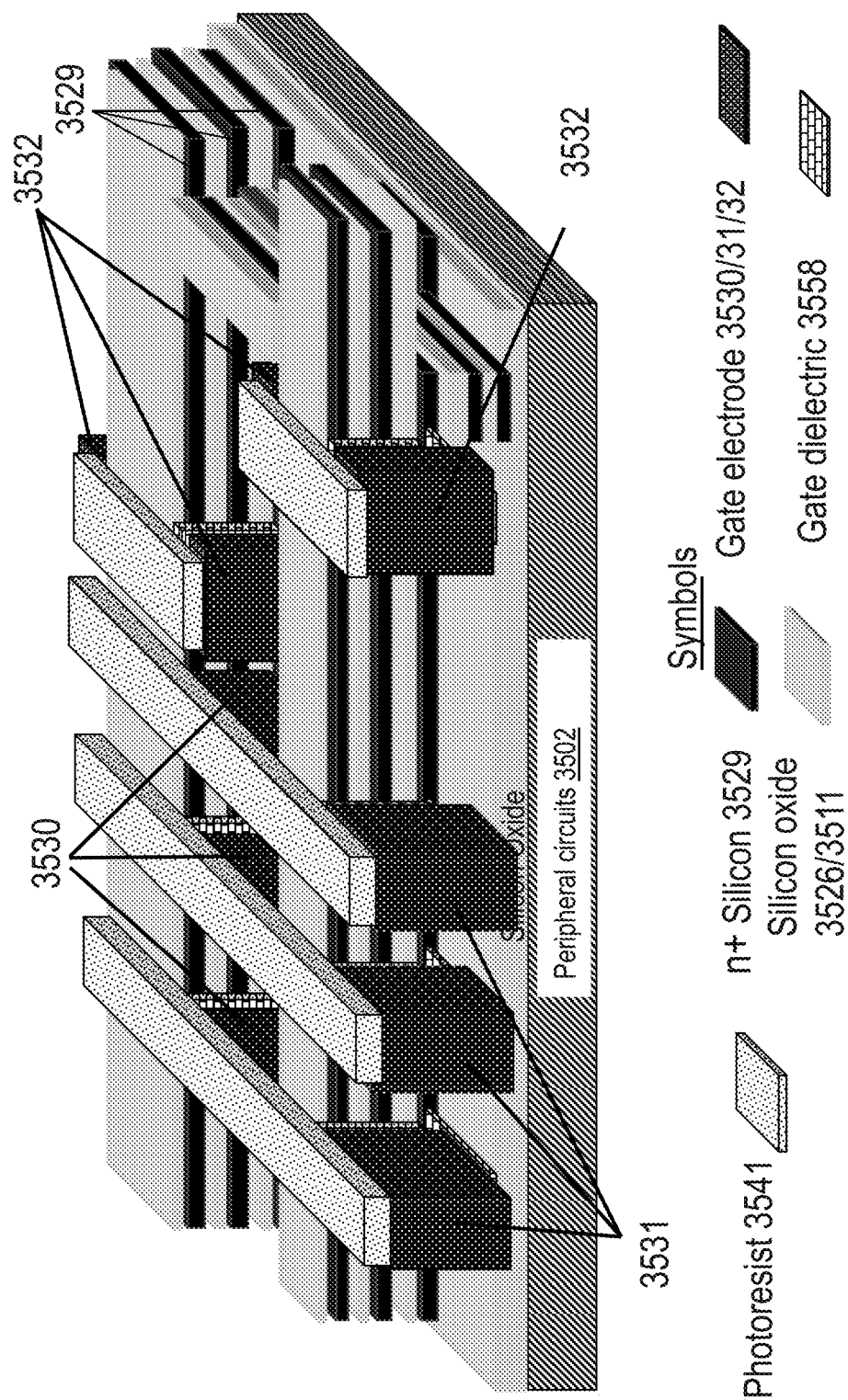

As illustrated in FIG. 35B, an intermediate structure may be formed wherein the select gates and memory transistor gates may be formed and a self-aligned multiple energy n+ implant and activation may be done to form the connecting N+ regions and a portion of the array access lines. A gate dielectric may be grown on the exposed surfaces of p− regions 3528 (for example, with the TEL SPA tool radical oxidation oxide) or deposited substantially over the structure's surface, such as, for example, in the well-known HKMG formation processing using ALD or other conformal deposition technique. This step could use high temperature or other type of process to form the gate dielectric. A gate electrode material, such as, for example, doped amorphous or polysilicon, or the well-known metal stack of HKMG processing, may be deposited. The gate electrode material may be in-situ doped during deposition, or doped at a later step. Additional material, such as insulator material, for example silicon oxide, may be deposited to complete filling the gate fill regions between the ridges of Si/SiO$_2$ stacks and enable the following CMP step. CMP may be performed to planarize the gate electrode material and insulator fill material, and may be planarized substantially to the top of the Si/SiO2 region stacks, or partially into the etch stop/CMP stop material (not shown). The top face of the topmost insulator region of insulator regions 3526 may include an insulating (unless removed later) etch stop/CMP stop material, such as, for example, SiN or a-carbon, placed on it at an earlier stage, so to provide a CMP stop, thus enabling the formation of separate gate and select gate regions. Although the width of the p– regions 3528 near and under the gates are illustrated as being larger than the thickness, one skilled in the art would recognize that the reverse (i.e., thickness larger than width) could be formed to provide increased gate control of the transistor channel. A lithographic pattern of photoresist 3541 may be formed wherein the memory gate regions 3530, eventual resistor regions 3531, select gate regions 3532, and the top layer of the stack that is in-between memory gate regions 3530 and eventual resistor regions 3531, and the top layer of the stack that is in-between the two legs of the select gate regions 3532, may be covered so to protect from the following multiple implant sequence and the etch of the gate material. Using the remaining photoresist of the gate structure regions lithography, portions of p– regions 3528 not covered by the gate structure regions photoresist may utilize a self-aligned multiple energy n+ implant to form n+ regions 3529, and thus form p– transistor channel regions 3538 (not visible). The p– transistor channel regions 3538 may eventually be controlled by the gate of its formed transistor, such as memory gate regions 3530 for the memory transistors and select gate regions 3532 for the select transistors. The remaining gate fill may then be etched to define gate structure regions shown in FIG. 35B, thus forming the memory gate regions 3530, eventual resistor regions 3531, select gate regions 3532, and gate dielectric regions 3558. The photoresist 3541 may be stripped at this point (not shown), and the structure filled with additional isolative material, such as an insulator material, for example silicon oxide, which may be deposited to complete filling the gap regions between the ridges of Si/SiO$_2$ stacks and the gate structure regions and enable the following CMP step. CMP may be performed to planarize the structure isolative fill material, and may be planarized to above to the top of the Si/SiO2 region stacks, thereby covering the entire structure.

Figure 35C:
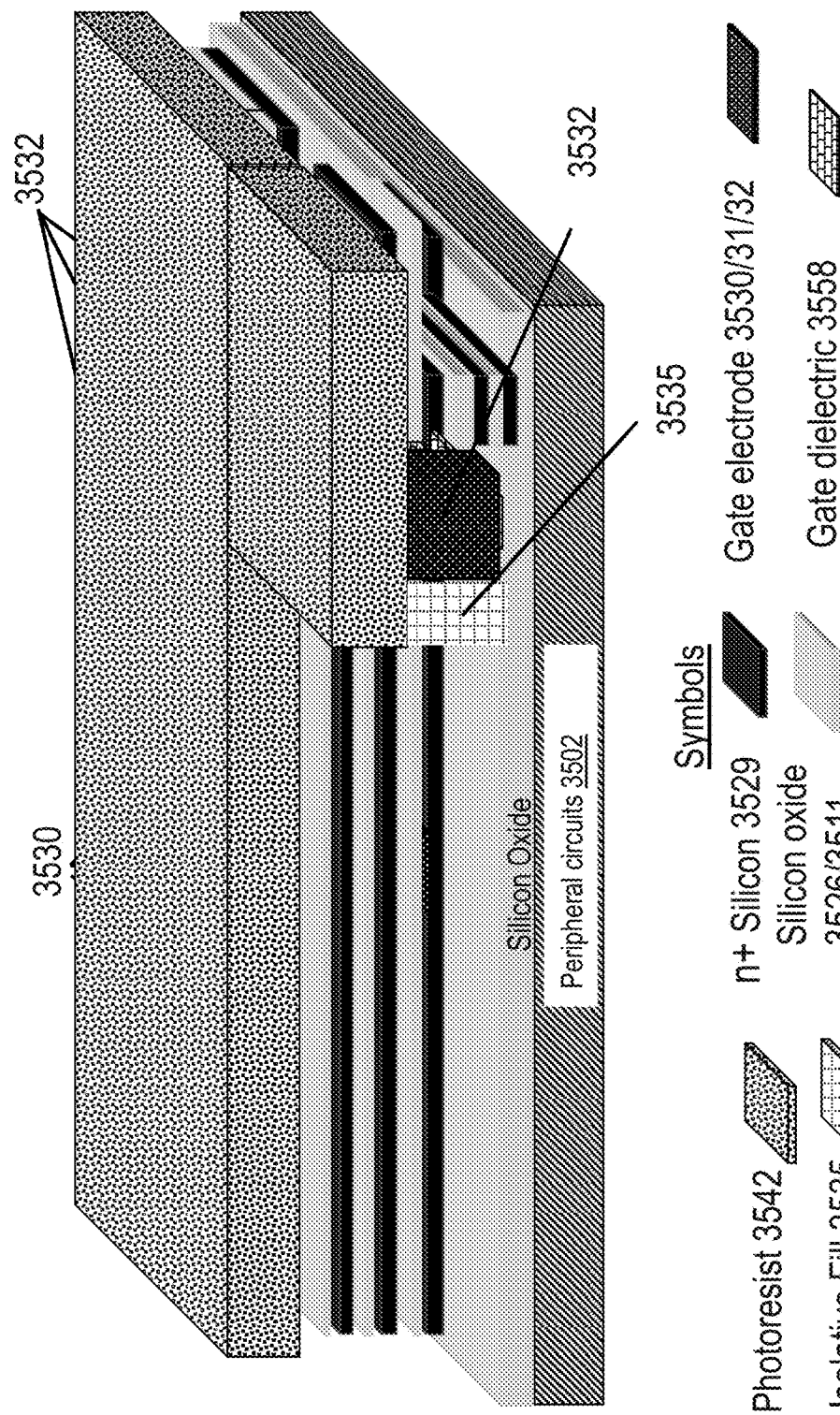

As illustrated in FIG. 35C, a lithographic pattern of etch opening photoresist 3542 may be formed to be open over the eventual resistor regions 3531 and may have a misalignment tolerance driven overlap of the top of the stack isolation layer. The lithographic pattern of photoresist 3542 may protect the memory gate regions 3530, select gate regions 3532, and most of the stack regions from the etch, and the stack regions may be protected from the etch by the CMP/etch stop material on the topmost layer of the stack. An etch may be performed which may remove the eventual resistor regions 3531, associated isolative fill material, and associated gate dielectric regions 3558 that is exposed/open by a lithographic pattern of etch opening photoresist 3542. Remaining after etch may include remaining isolative fill material region 3535, Si/SiO2 region stacks (partially shown) and (not shown) memory gate regions 3530, select gate regions 3532, and associated gate dielectric regions 3558.

Figure 35D:
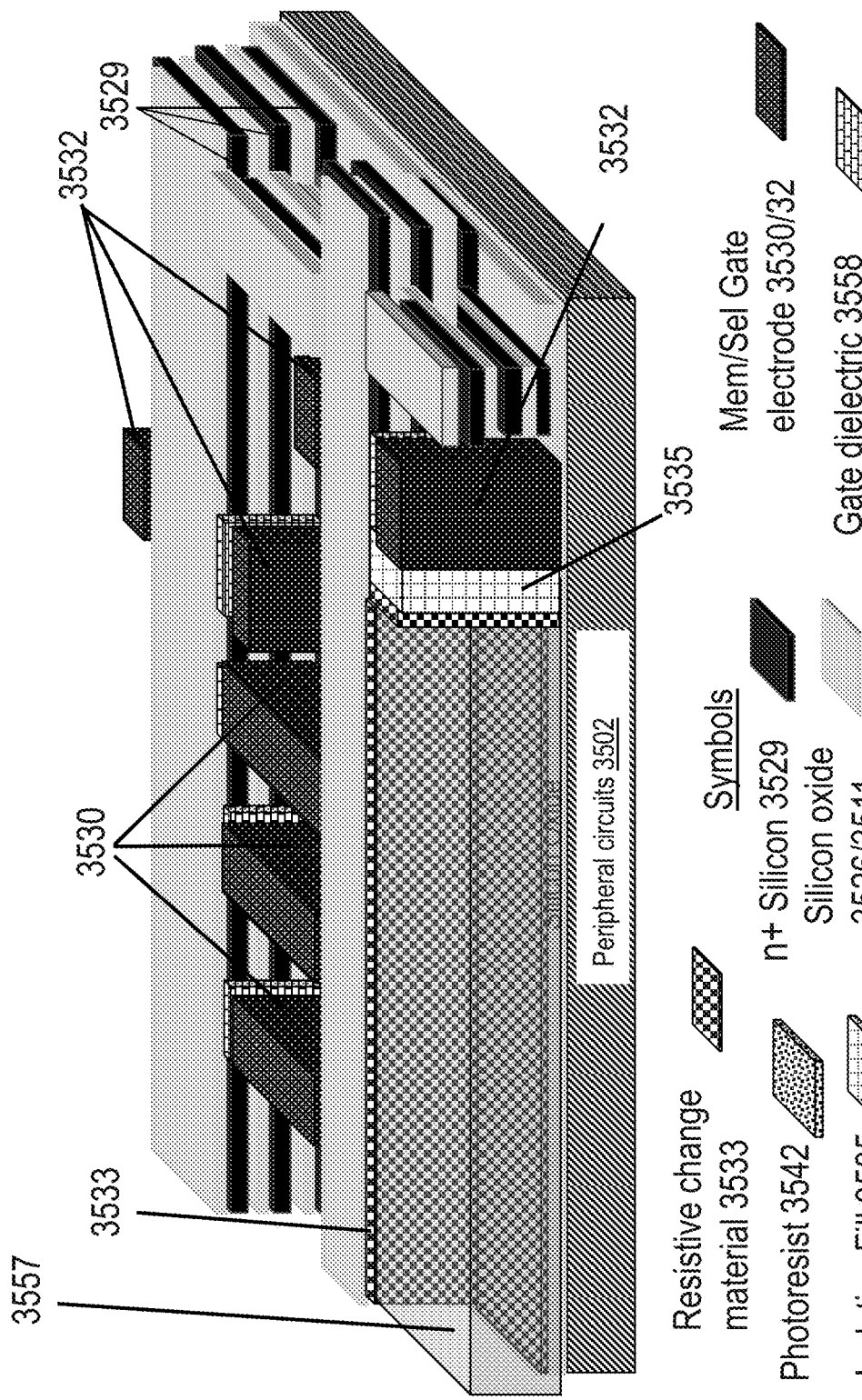

As illustrated in FIG. 35D, the RRAM/Memristor elements may be formed. Normally resistive RRAM/memristor resistive change material may be deposited, for example by ALD or other conformal deposition techniques, and then a second isolative fill, for example, silicon oxide may be performed and a CMP may be done to remove the resistive change material from the top surface of the structure, thus forming remaining resistive change material regions 3533, and second isolative fill regions 3557. The first isolative fill regions, other than the single illustrated remaining isolative fill material region 3535, are not shown for clarity. This flow is useful for RRAM/memristor resistive change material that is initially non-conducting and which could became conductive if the proper voltage is applied on it. An advantage of this suggested flow is that lithography could be applied for all groups of layers together.

Figure 35E:
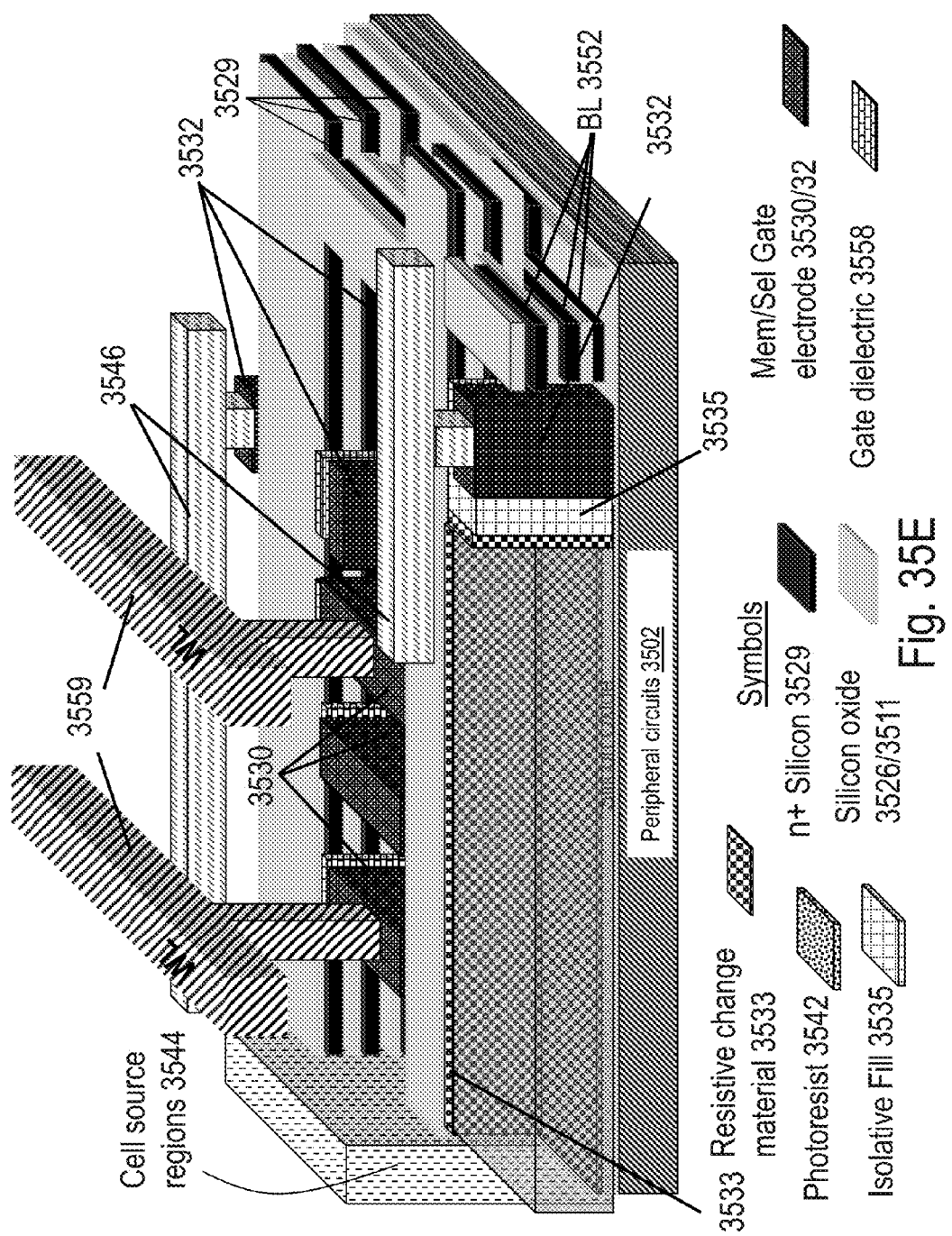

As illustrated in FIG. 35E, the entire structure may be covered with an interlayer dielectric (ILD), for example, SACVD silicon oxide, which may be planarized with chemical mechanical polishing. The ILD is shown transparent in the figure for clarity in illustration. Select metal lines 3546 may be formed and connected to the associated select gate contacts, the contacts may be formed to overlap both related regions of select gate regions 3532. The select metal lines 3546 signal may be routed to another metallization layer and parallel the WL direction (not shown). Word-line (WL) metallization 3559 may be formed and connected to the associated gate contacts, the contacts may be formed to overlap the specific memory gate regions 3530. Cell source regions 3544 may be formed by a trench contact etch and filled to couple to the N+ silicon regions on the source end of the NAND strings. BL contacts (not shown) can be made into stair-like structures of BL 3552 (portions of N+ regions 3529) using techniques described in "Bit Cost Scalable Technology with Punch and Plug Process for Ultra High Density Flash Memory," *VLSI Technology, 2007 IEEE Symposium on VLSI Technology*, pp. 14-15, 12-14 Jun. 2007 by Tanaka, H.; Kido, M.; Yahashi, K.; Oomura, M.; et al., and in U.S. Pat. No. 7,915,667, or using the staircase methods of "A stacked memory device on logic 3D technology for ultra-high-density data storage," *Nanotechnology*, 22 (2011) 254006 by J. Kim, et al. Through layer vias (not shown) may be formed to electrically couple the BL, SL, and WL metallization to the peripheral circuits 3502.

Persons of ordinary skill in the art will appreciate that the illustrations in FIGS. 35A through 35E are exemplary only and are not drawn to scale. Such skilled persons will further appreciate that many variations may be possible such as, for example, BL or SL contacts may be constructed in a staircase manner as described previously. Moreover, the stacked memory layer may be connected to a periphery circuit that may be above the memory stack. Additionally, each tier of memory could be configured with a slightly different donor wafer P– layer doping profile. Further, the memory could be organized in a different manner, such as BL and SL interchanged, or where buried wiring for the memory array may be below the memory layers but above the periphery. Furthermore, cell source regions 3544 could be tied to Vpp and the other side through select transistors and then the BL line which could be the N+ silicon to a staircase-like structure to control each layer using the BL lines. Moreover, if diagonal sneak paths (a sidewall programmable resistor than spans two layers in the stack rather than being only parallel to one layer) cannot be overcome with neighboring BL biasing schemes, than the commoned side of each string (where cell source regions 3544 are) could be staircased to permit both sides of the selected gate column of the device selected to program/read, etc. to be biased appropriately to suppress the sneak. Moreover, the peripheral circuits could be formed to the side of the stack memory array on any of the stack layers or the substrate on which they sit. Many other modifications within the scope of the illustrated embodiments of the invention will suggest themselves to such skilled persons after reading this specification. Thus the invention is to be limited only by the appended claims.

Figure 36A:
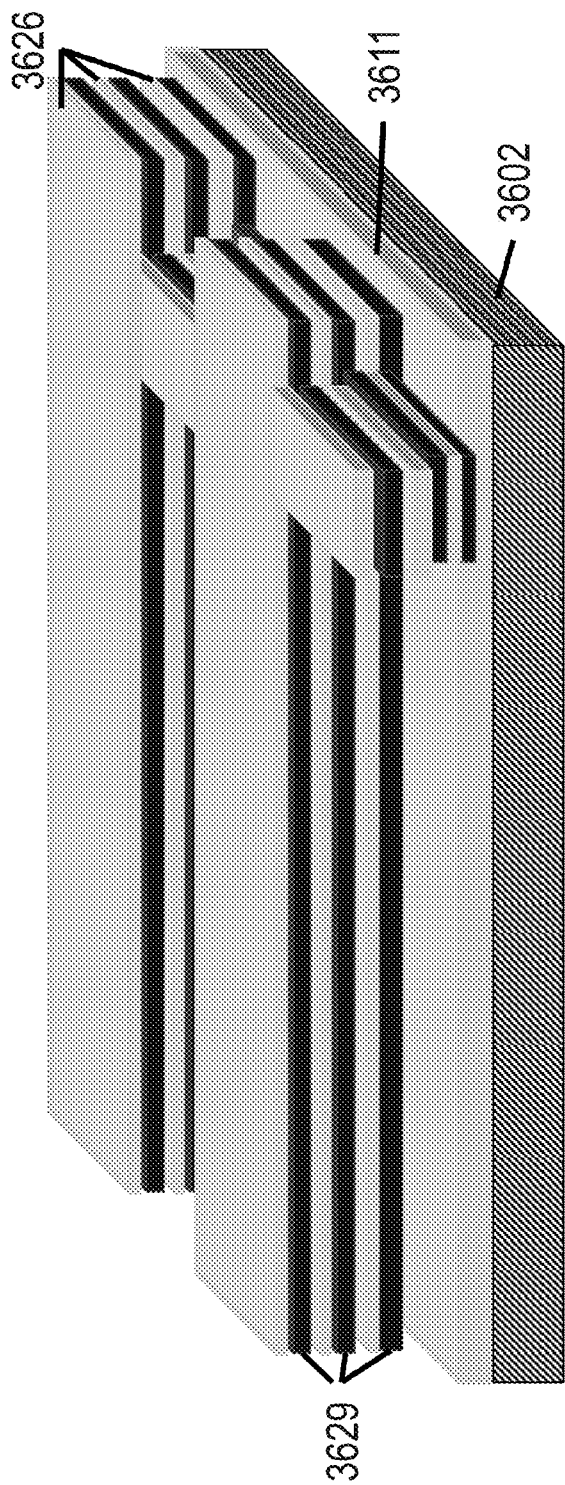
FIGS. 36A-36E are exemplary drawing illustrations of a process flow which may be utilized to form a 3D NAND R-RAM architecture utilizing junction-less transistors.

As illustrated in FIGS. 36A-36E, a process flow which may be utilized to form a 3D NAND R-RAM architecture utilizing junction-less transistors is shown and described. As illustrated in FIG. 36A, multiple mono-crystalline heavily doped n+ silicon layers may be formed with insulator layers in-between and then lithography and etch processes may be utilized to make a structure, such as, for example, as shown in FIG. 36A. Thus n+ silicon regions 3629 and insulator regions 3626 may be stacked and formed above peripheral circuits 3602, which may include the isolation and bonding insulator layer 3611. Processes to form the structure in FIG. 36A may include the steps described with respect to FIGS. 6A to 6E herein and in at least a portion of FIG. 101 in U.S. Pat. No. 8,273,610, incorporated herein by reference. The multi-layer/region stack structure may be formed within one lithographic and etch step, thus, the transistor elements or portions may have been defined by a common lithography step, which also may be described as a single lithography step, same lithography step, or one lithography step, or single masking step, same masking step, or one masking step. Peripheral circuits 3602 may be constructed with tungsten, or conventional aluminum/copper, wiring and may have isolation and/or bonding oxide above it (in-between the top metallization/wiring of peripheral circuits 3602 and the bottom n+ silicon region in the stack, such as isolation and bonding insulator layer 3611. Isolation and bonding insulator layer 3611 may include an etch stop layer. The composition of the insulator regions 3626 within the stacked Si/SiO$_2$ layers may be insulators or dielectrics such as, for example, silicon dioxide, a low-k dielectric, carbon containing silicon oxides, amorphous carbon. The thickness of insulator regions 3626 within the stacked Si/SiO$_2$ layers may be adjusted to minimize layer to layer, strata to strata disturb and interference mechanisms, and may include thicknesses of 50 nm, 65 nm, 100 nm, 150 nm, 200 nm, 500 nm, and less than 1000 nm. Insulator regions 3626 within the stacked Si/SiO$_2$ layers may include a thin conductive layer, such as a metal, which may be formed between the two bonding oxides/insulator layers to form a field shield to mitigate layer to layer, strata to strata disturb and interference mechanisms, and may be electrically floating, or may be tied to a bias, such as ground or Vdd. The stacked Si/SiO$_2$ layers may alternatively be formed by successive ion implants of oxygen atoms/ions to various depths from the top surface of a mono-crystalline silicon wafer/substrate and then heat treated to form oxide layers thus forming silicon layers in-between the oxide layers, a layered 'SIMOX' process approach, and then layer transferred on top of peripheral circuits 3602, or peripheral circuits may be formed on top of the memory stack. The peripheral circuits 3602 may include memory control circuits as well as circuitry for other purposes and of various types, such as, for example, analog, digital, RF, or memory, as well as circuits/devices as described herein and in the referenced patents, publications, applications. The lithography steps in the formation processing may be done with precise alignment to the underlying peripheral circuits 3602 as the stack layers are thin and the alignment marks on the peripheral circuits 3602 substrate/layer may be visible at the short wavelengths utilized for precision alignment. If necessary, a step of a window etch could be added for better visibility of the underneath alignment marks. In general, precise alignment is the good alignment of a state of the art stepper which results in a less than 40 nm alignment error. All the lithography steps may be aligned accordingly.

Figure 36B:
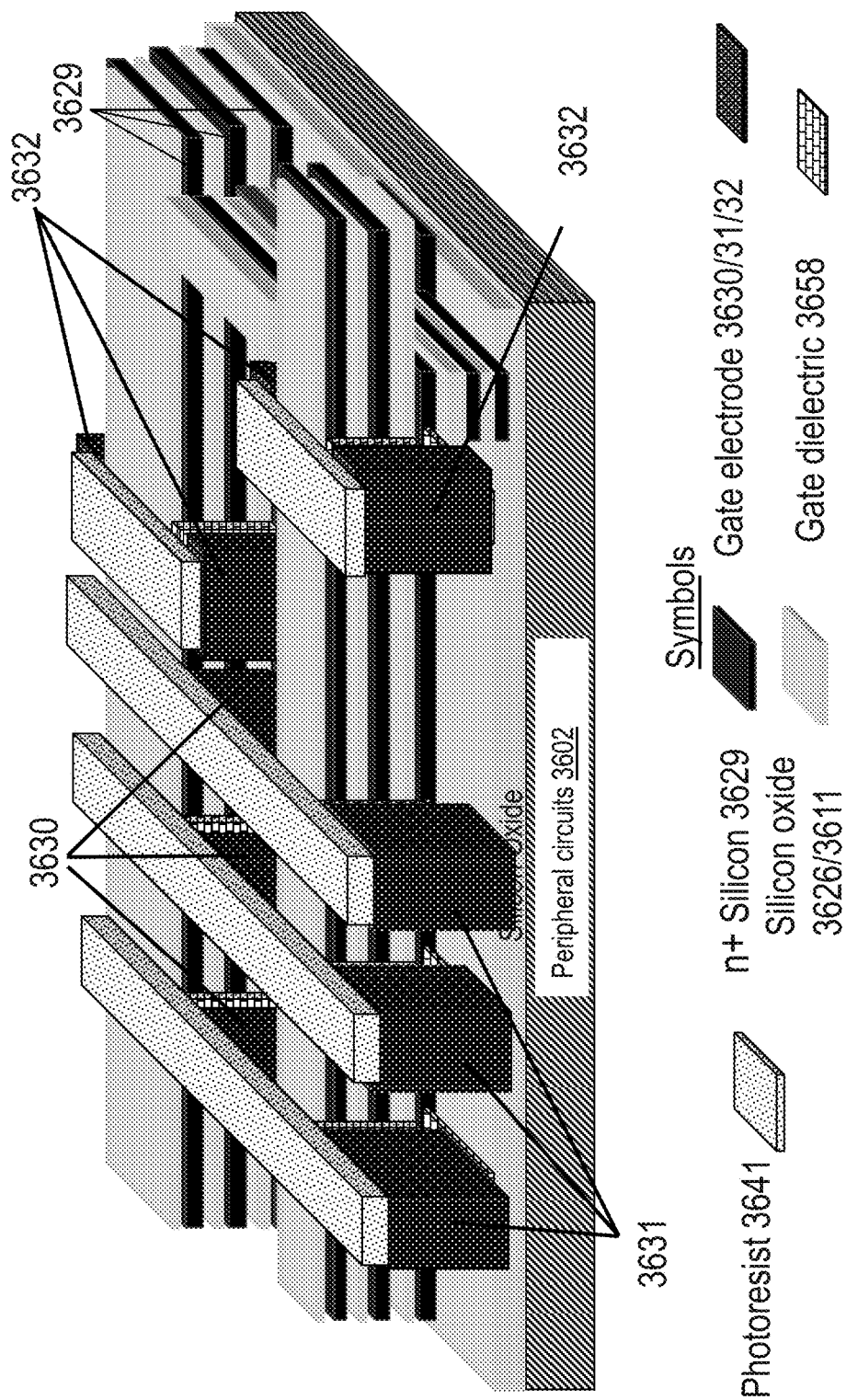

As illustrated in FIG. 36B, an intermediate structure may be formed wherein the select gates and memory transistor gates may be formed. A gate dielectric may be grown on the exposed surfaces of n+ silicon regions 3629 (for example, with the TEL SPA tool radical oxidation oxide) or deposited substantially over the structure's surface, such as, for example, in the well-known HKMG formation processing using ALD or other conformal deposition technique. This step could use high temperature or other type of process to form the gate dielectric. A gate electrode material, such as, for example, doped amorphous or polysilicon, or the well-known metal stack of HKMG processing, may be deposited. The gate electrode material may be in-situ doped during deposition, or doped at a later step. Additional material, such as insulator material, for example silicon oxide, may be deposited to complete filling the gate fill regions between the ridges of Si/SiO$_2$ stacks and enable the following CMP step. CMP may be performed to planarize the gate electrode material and insulator fill material, and may be planarized substantially to the top of the Si/SiO2 region stacks, or partially into the etch stop/CMP stop material (not shown). The top face of the topmost insulator region of insulator regions 3626 may include an insulating (unless removed later) etch stop/CMP stop material, such as, for example, SiN or a-carbon, placed on it at an earlier stage, so to provide a CMP stop, thus enabling the formation of separate gate and select gate regions. Although the width of the n+ regions 3629 near and under the gates are illustrated as being larger than the thickness, one skilled in the art would recognize that the reverse (i.e., thickness larger than width) could be formed to provide increased gate control of the transistor channel. A lithographic pattern of photoresist 3641 may be formed wherein the memory gate regions 3630, eventual resistor regions 3631, select gate regions 3632, and the top layer of the stack that is in-between memory gate regions 3630 and eventual resistor regions 3631, and the top layer of the stack that is in-between the two legs of the select gate regions 3632, may be covered so to protect from the etch of the gate material. The remaining gate fill may then be etched to define gate structure regions shown in FIG. 36B, thus forming the memory gate regions 3630, eventual resistor regions 3631, select gate regions 3632, and gate dielectric regions 3658. The photoresist 3641 may be stripped at this point (not shown), and the structure filled with additional isolative material, such as an insulator material, for example silicon oxide, which may be deposited to complete filling the gap regions between the ridges of Si/SiO$_2$ stacks and the gate structure regions and enable the following CMP step. CMP may be performed to planarize the structure isolative fill material, and may be planarized to above to the top of the Si/SiO2 region stacks, thereby covering the entire structure.

Figure 36C:
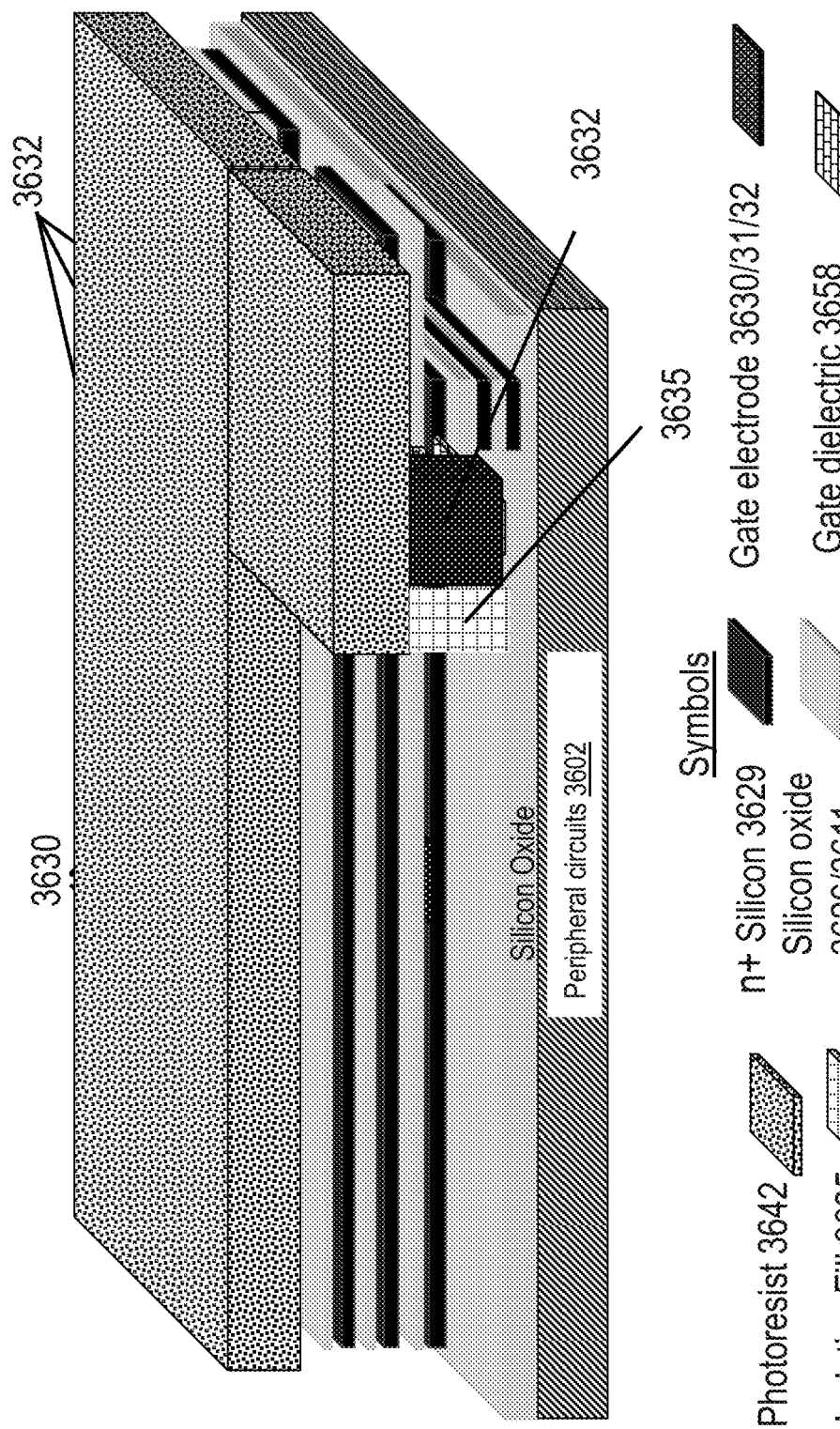

As illustrated in FIG. 36C, a lithographic pattern of etch opening photoresist 3642 may be formed to be open over the eventual resistor regions 3631 and may have a misalignment tolerance driven overlap of the top of the stack isolation layer. The lithographic pattern of photoresist 3642 may protect the memory gate regions 3630, select gate regions 3632, and most of the stack regions from the etch, and the stack regions may be protected from the etch by the CMP/etch stop material on the topmost layer of the stack. An etch may be performed which may remove the eventual resistor regions 3631, associated isolative fill material, and associated gate dielectric regions 3658 that is exposed/open by a lithographic pattern of etch opening photoresist 3642.

Remaining after etch may include remaining isolative fill material region 3635, Si/SiO2 region stacks (partially shown) and (not shown) memory gate regions 3630, select gate regions 3632, and associated gate dielectric regions 3658.

Figure 36D:
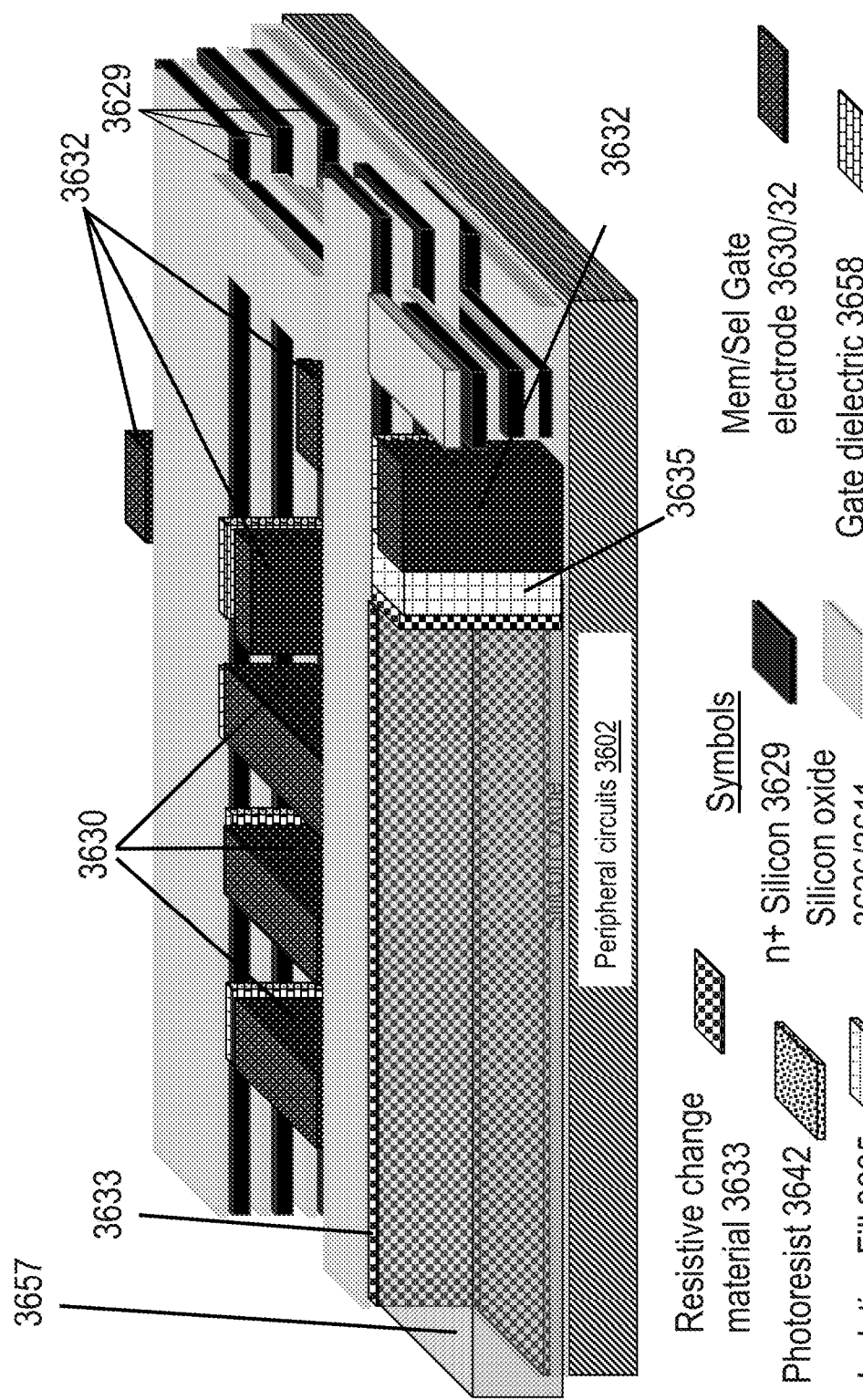

As illustrated in FIG. 36D, the RRAM/Memristor elements may be formed. Normally resistive RRAM/memristor resistive change material may be deposited, for example by ALD or other conformal deposition techniques, and then a second isolative fill, for example, silicon oxide may be performed and a CMP may be done to remove the resistive change material from the top surface of the structure, thus forming remaining resistive change material regions 3633, and second isolative fill regions 3657. The first isolative fill regions, other than the single illustrated remaining isolative fill material region 3635, are not shown for clarity. This flow is useful for RRAM/memristor resistive change material that is initially non-conducting and which could became conductive if the proper voltage is applied on it. An advantage of this suggested flow is that lithography could be applied for all groups of layers together.

Figure 36E:
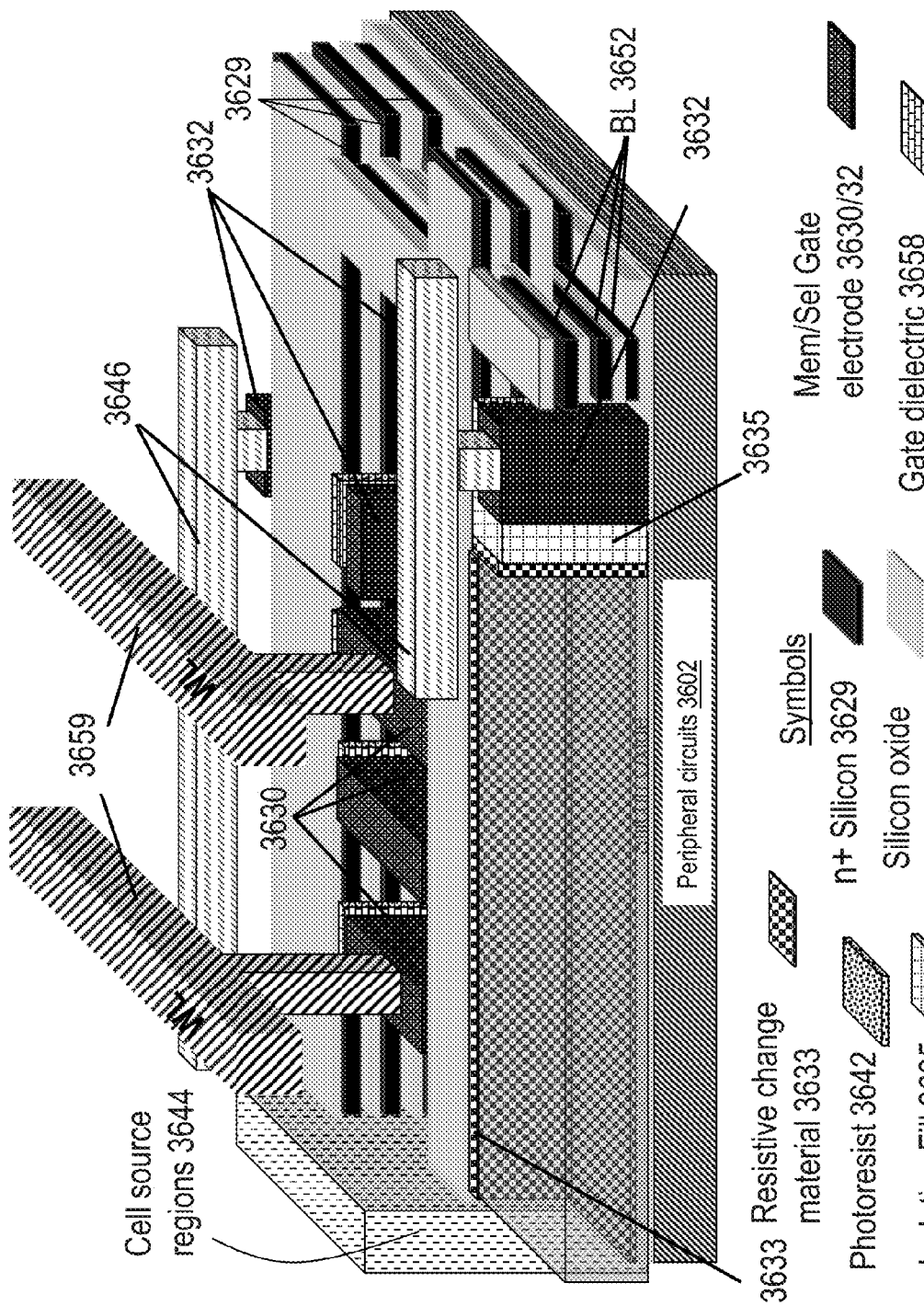

As illustrated in FIG. 36E, the entire structure may be covered with an interlayer dielectric (ILD), for example, SACVD silicon oxide, which may be planarized with chemical mechanical polishing. The ILD is shown transparent in the figure for clarity in illustration. Select metal lines 3646 may be formed and connected to the associated select gate contacts, the contacts may be formed to overlap both related regions of select gate regions 3632. The select metal lines 3646 signal may be routed to another metallization layer and parallel the WL direction (not shown). Word-line (WL) metallization 3659 may be formed and connected to the associated gate contacts, the contacts may be formed to overlap the specific memory gate regions 3630. Cell source regions 3644 may be formed by a trench contact etch and filled to couple to the N+ silicon regions on the source end of the NAND strings. BL contacts (not shown) can be made into stair-like structures of BL 3652 (portions of N+ regions 3629) using techniques described in "Bit Cost Scalable Technology with Punch and Plug Process for Ultra High Density Flash Memory," *VLSI Technology, 2007IEEE Symposium on VLSI Technology*, pp. 14-15, 12-14 Jun. 2007 by Tanaka, H.; Kido, M.; Yahashi, K.; Oomura, M.; et al., and in U.S. Pat. No. 7,915,667, or using the staircase methods of "A stacked memory device on logic 3D technology for ultra-high-density data storage," *Nanotechnology*, 22 (2011) 254006 by J. Kim, et al. Through layer vias (not shown) may be formed to electrically couple the BL, SL, and WL metallization to the peripheral circuits 3602.

Persons of ordinary skill in the art will appreciate that the illustrations in FIGS. 36A through 36E are exemplary only and are not drawn to scale. Such skilled persons will further appreciate that many variations may be possible such as, for example, BL or SL contacts may be constructed in a staircase manner as described previously. Moreover, the stacked memory layer may be connected to a periphery circuit that may be above the memory stack. Additionally, each tier of memory could be configured with a slightly different donor wafer n+ layer doping profile. Further, the memory could be organized in a different manner, such as BL and SL interchanged, or where buried wiring for the memory array may be below the memory layers but above the periphery. Furthermore, cell source regions 3644 could be tied to Vpp and the other side through select transistors and then the BL line which could be the N+ silicon to a staircase-like structure to control each layer using the BL lines. Moreover, if diagonal sneak paths (a sidewall pro-grammable resistor than spans two layers in the stack rather than being only parallel to one layer) cannot be overcome with neighboring BL biasing schemes, than the commoned side of each string (where cell source regions 3644 are) could be staircased to permit both sides of the selected gate column of the device selected to program/read, etc. to be biased appropriately to suppress the sneak. Moreover, the peripheral circuits could be formed to the side of the stack memory array on any of the stack layers or the substrate on which they sit. Many other modifications within the scope of the illustrated embodiments of the invention will suggest themselves to such skilled persons after reading this specification. Thus the invention is to be limited only by the appended claims.

An alternative NAND R-RAM structure and architecture could be used for cases where the memristor material may be naturally conductive, for example, such as for conductive Bridge-RAM. The alternative could be used in other situations such as phase change memory (PCM). Naturally non-conductive resistive change material could also be utilized in this configuration.

This alternative NAND R-RAM structure and architecture may use at least one critical lithography step every memory layer. In this alternative the transistors are serially connected along the stack rim direction with a select transistor for every rim, and the memory transistors and select transistors may be double gated. Each programmable resistor layer may be horizontally oriented and in parallel to each mono-crystal layer. FIG. 37 illustrates a junction-less transistor flow, and FIG. 38 illustrates and discuses variants for a junction MOSFET memory and select transistor.

Figure 37A:
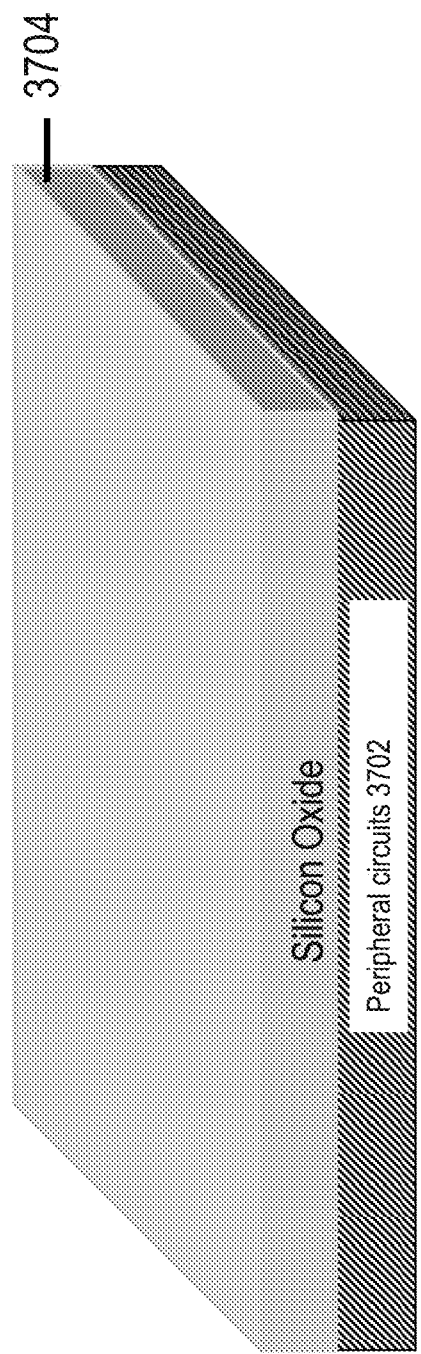
Figure 38:
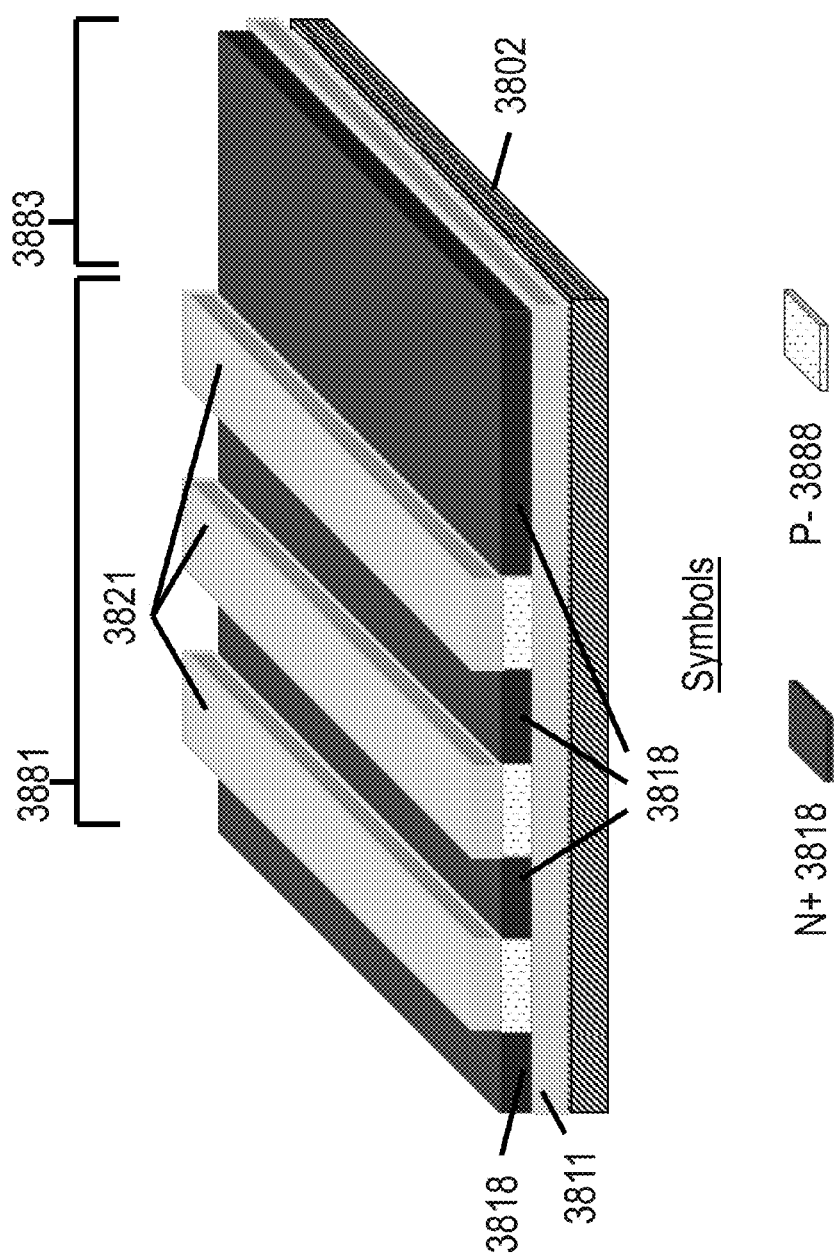
FIG. 38 is an exemplary drawing illustration of an alternative 3D NAND R-RAM structure and architecture with process flow with conventional junctioned MOSFETs.

As illustrated in FIG. 37A, peripheral circuits 3702, which may include high temperature wiring, made with metals such as, for example, tungsten, and may include logic circuit regions and other device as has been previously described herein, may be constructed. An insulator layer 3704, for example silicon oxide, may be deposited above peripheral circuits 3702.

Figure 37B:
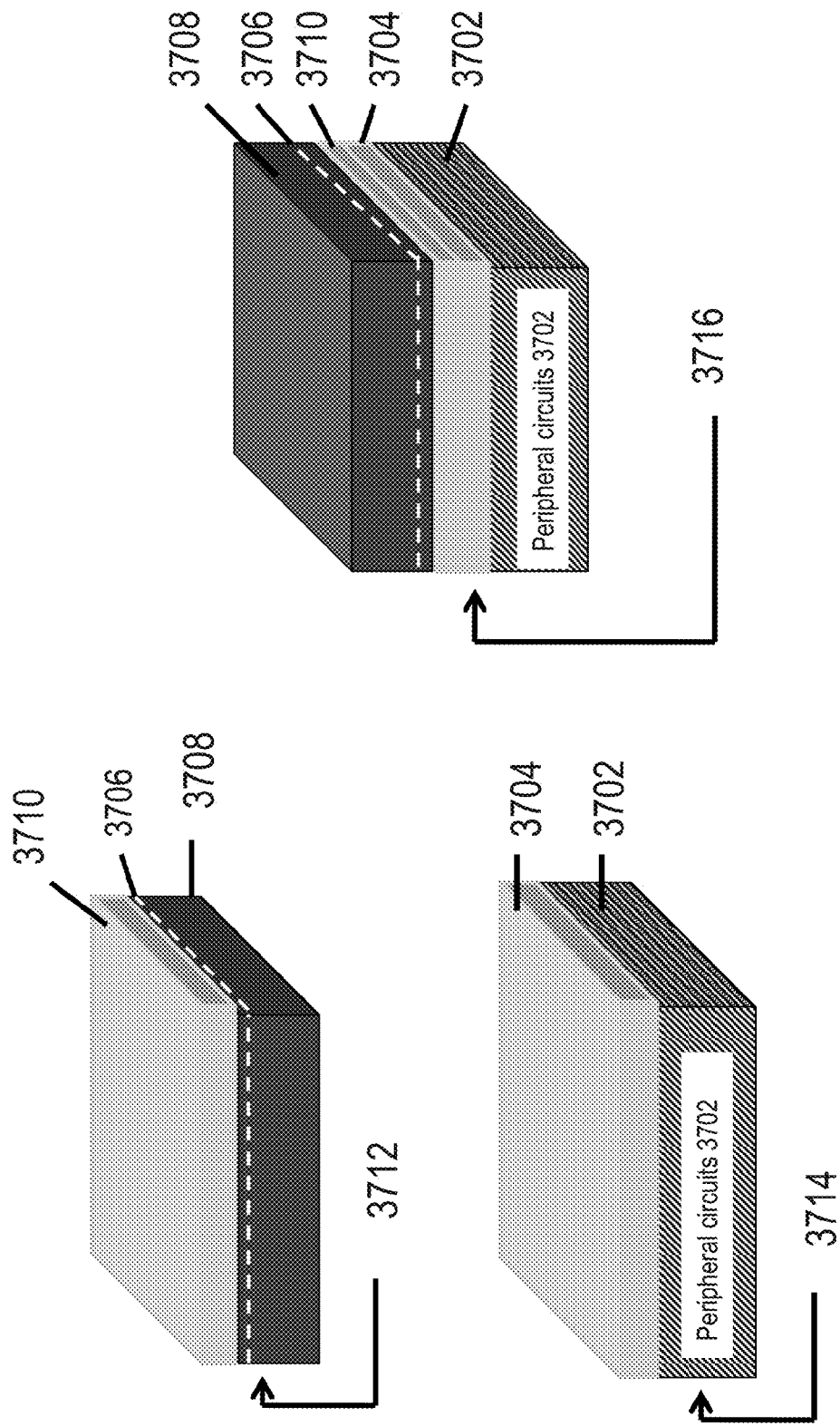

As illustrated in FIG. 37B, n+ silicon wafer 3708 may have an insulator layer 3710 grown or deposited above it. Hydrogen may be ion-implanted to a certain depth indicated by hydrogen plane 3706. Alternatively, some other atomic species, such as Helium and/or boron, may be (co-)implanted. Thus, top layer 3712 may be formed. The bottom layer 3714 may include the peripheral circuits 3702 with insulator layer 3704. The top layer 3712 may be flipped and bonded to the bottom layer 3714 using oxide-to-oxide bonding to form top and bottom stack 3716.

As illustrated in FIG. 37C, the top and bottom stack 3716 may be cleaved at the hydrogen plane 3706 using methods including, for example, a thermal anneal or a sideways mechanical force, described previously and in referenced patents and publications. A CMP process may be conducted. Thus n+ Silicon layer 3718 may be formed. Insulator layer 3720, such as silicon oxide, may be deposited atop the n+ silicon layer 3718. At the end of this step, a single-crystal n+ silicon layer 3718, which may be heavily doped for use as an effective junction-less transistor (as has been described in referenced patents and know in the art, and may have vertical doping gradients within it), may exist atop the peripheral circuits 3702, and this has been achieved using layer-transfer techniques.

Figure 37D:
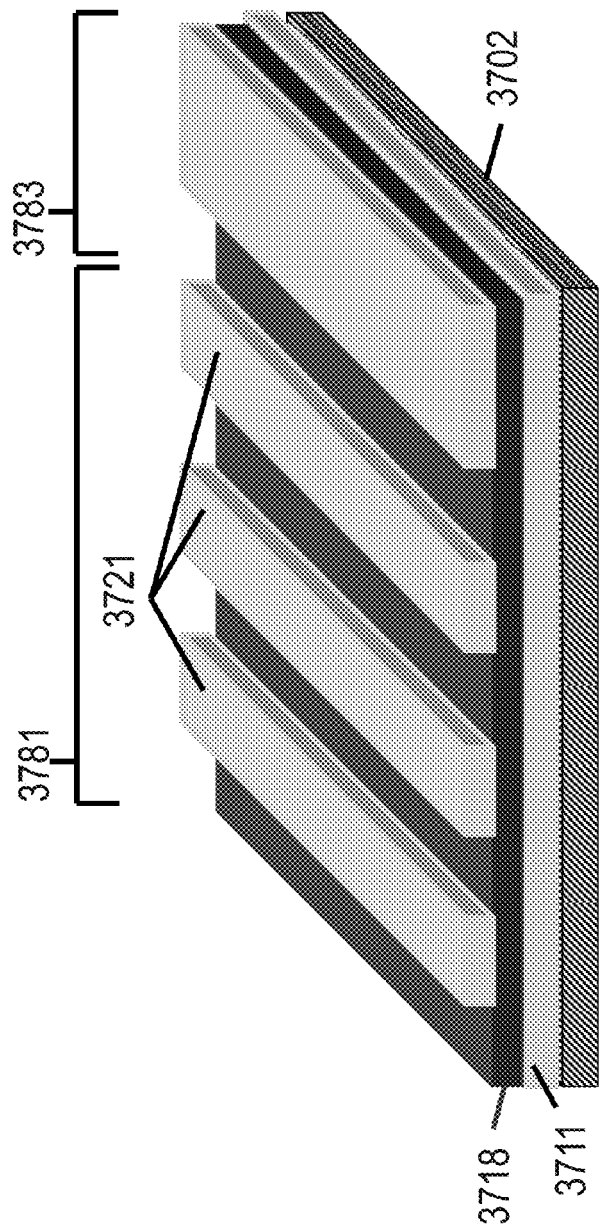

As illustrated in FIG. 37D, regions of insulator layer 3720 may be removed by aligned lithography and insulator etch, thus forming insulator regions 3721 and exposed portions of n+ silicon layer 3718. The alignment may be done to peripheral circuits 3702 substrate/marks. For clarity, the bonding oxides/insulators insulator layer 3704 and insulator layer 3710 have been combined in the illustrations into isolation and bonding insulator layer 3711. As a guidepost, memory transistor area 3781 indicates where the NAND string of memory transistor with parallel programmable resistor pairs will be formed, and select transistor area 3783 indicates where the select transistors for each NAND string may be formed.

Figure 37E:
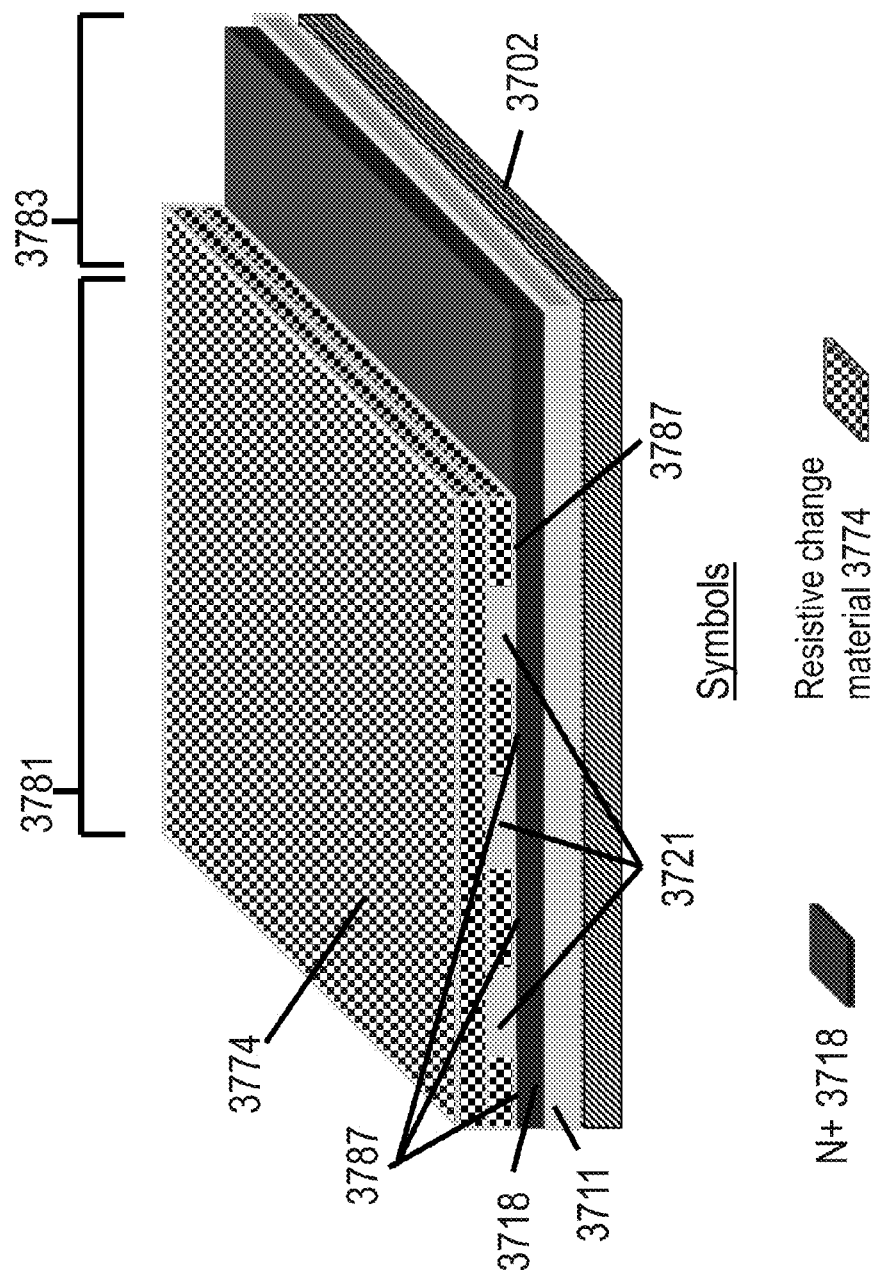

As illustrated in FIG. 37E, a RRAM/memristor resistive change material may be deposited, for example by ALD or other deposition techniques, and then an insulating layer deposited on top of the resistive change material (not shown) for protection. The regions where the memory array transistors and programmable resistors are to be formed (such as memory transistor area 3781) may be lithographically defined and the resistive material may be etched away. Thus, resistive material array regions 3774 may be formed, which contact and connect to n+ silicon layer 3718 where insulator regions 3721 are not, for example, surface areas 3787 (partially visible in illustration). A self-aligned barrier metal or metals may be deposited, reacted with the exposed areas of n+ silicon layer 3718, and the unreacted barrier material may be removed prior to the resistive change material deposition.

Figure 37F:
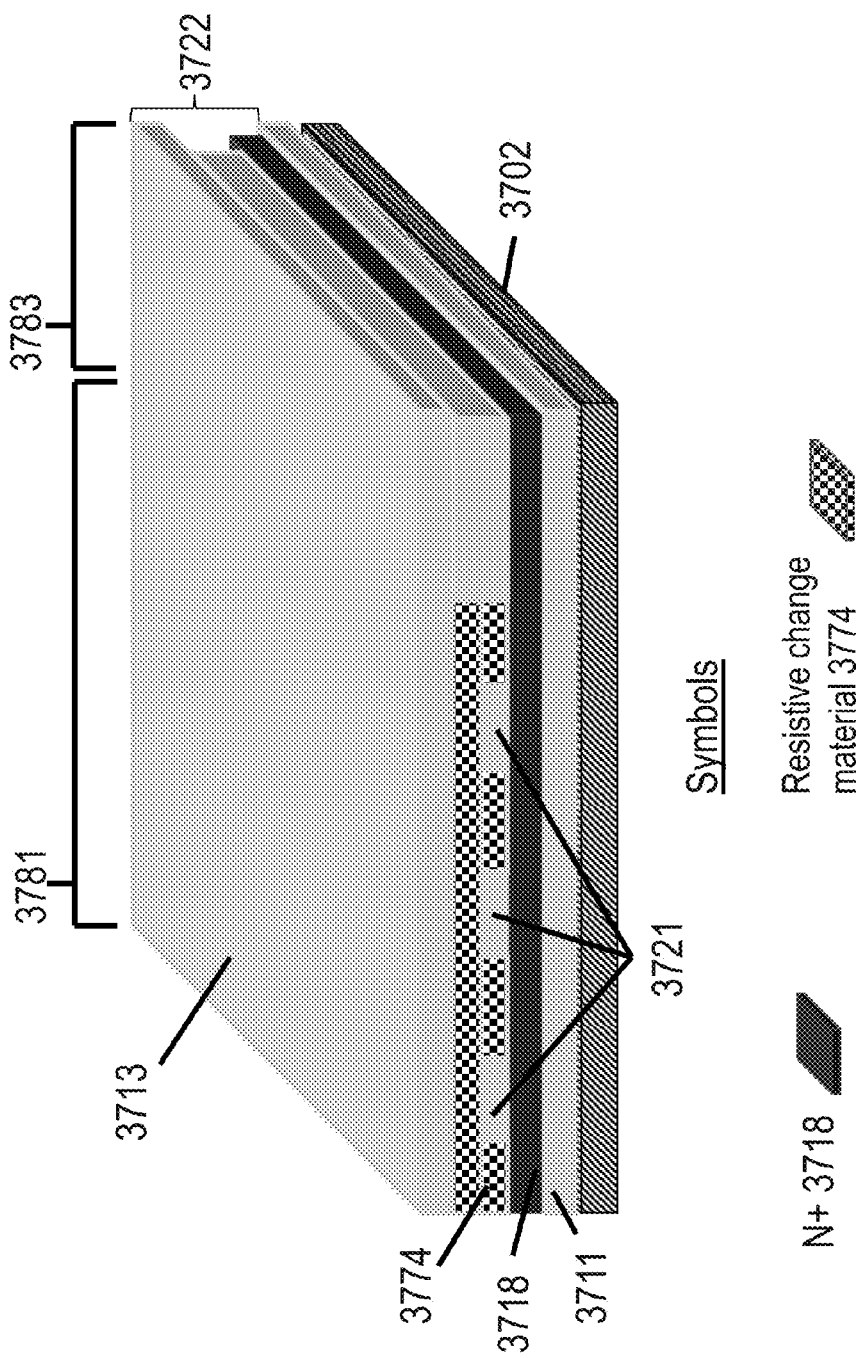

As illustrated in FIG. 37F, a deposition of an electrically isolative and bonding material, for example, silicon oxide may be performed, and a CMP may be done to planarize and prepare the structure for bonding the next n+ silicon layer with bonding oxide, thus forming stack bonding layer 3713.

Figure 37G:
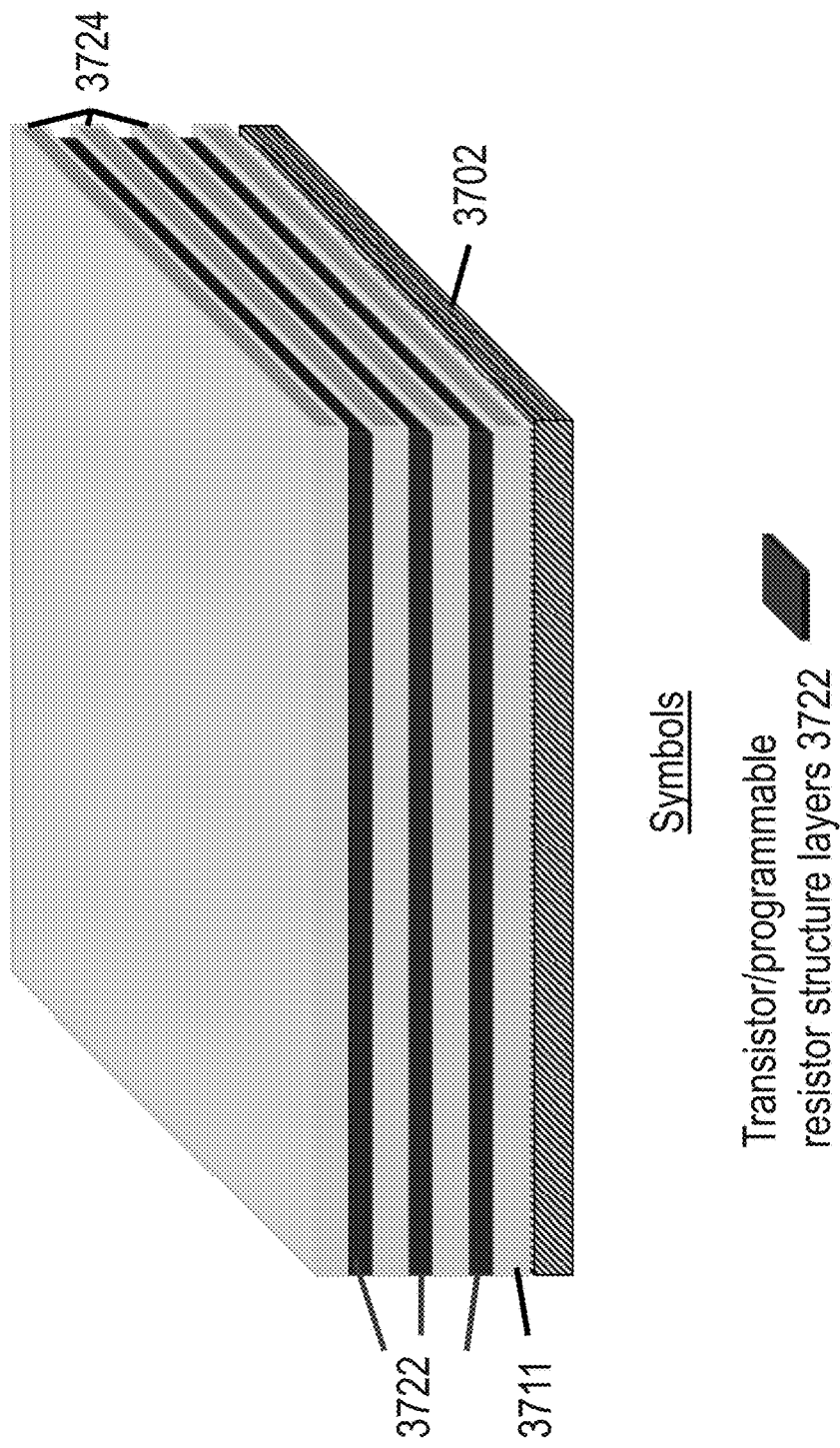

As illustrated in FIG. 37G, multiple transistor/programmable resistor layers 3722 and bonding oxides (not shown) may be formed with associated inter transistor/programmable resistor insulating layers 3724. Transistor/programmable resistor layer 3722 may include n+ silicon layer 3718, resistive material array regions 3774, insulator regions 3721, and stack bonding layer 3713. For clarity in the illustrations further, transistor/programmable resistor layer 3722 with be drawn as a mono-shaded drawing object. Isolation and bonding insulator layer 3711 may include an etch stop layer.

As illustrated in FIG. 37H, lithography and etch processes may be utilized to make a structure, such as, for example, as shown in FIG. 37H. Thus transistor/programmable resistor regions 3729 and insulator regions 3726 may be stacked and formed above peripheral circuits 3702, which may include the isolation and bonding insulator layer 3711. The multilayer/region stack structure may be formed within one lithographic and etch step, thus, the transistor elements and programmable resistor elements or portions may have been defined by a common lithography step, which also may be described as a single lithography step, same lithography step, or one lithography step, or single masking step, same masking step, or one masking step. Peripheral circuits 3702 may be constructed with tungsten, or conventional aluminum/copper, wiring and may have isolation and/or bonding oxide above it (in-between the top metallization/wiring of peripheral circuits 3702 and the bottom n+ silicon region in the stack), such as isolation and bonding insulator layer 3711. Isolation and bonding insulator layer 3711 may include an etch stop layer. The composition of the insulator regions 3726 vertically between the transistor/programmable resistor regions may be insulators or dielectrics such as, for example, silicon dioxide, a low-k dielectric, carbon containing silicon oxides, amorphous carbon. The thickness of insulator regions 3726 within the stacked layers may be adjusted to minimize layer to layer, strata to strata disturb and interference mechanisms, and may include thicknesses of 50 nm, 65 nm, 100 nm, 150 nm, 200 nm, 500 nm, and less than 1000 nm. Insulator regions 3726 within the stacked layers may include a thin conductive layer, such as a metal, which may be formed between the two bonding oxides/insulator layers to form a field shield to mitigate layer to layer, strata to strata disturb and interference mechanisms, and may be electrically floating, or may be tied to a bias, such as ground or Vdd. The peripheral circuits 3702 may include memory control circuits as well as circuitry for other purposes and of various types, such as, for example, analog, digital, RF, or memory, as well as circuits/devices as described herein and in the referenced patents, publications, applications. The lithography steps in the formation processing may be done with precise alignment to the underlying peripheral circuits 3702 as the stack layers are thin and the alignment marks on the peripheral circuits 3702 substrate/layer may be visible at the short wavelengths utilized for precision alignment. If necessary, a step of a window etch could be added for better visibility of the underneath alignment marks. In general, precise alignment is the good alignment of a state of the art stepper which results in a less than 40 nm alignment error. All the lithography steps may be aligned accordingly.

Figure 37I:
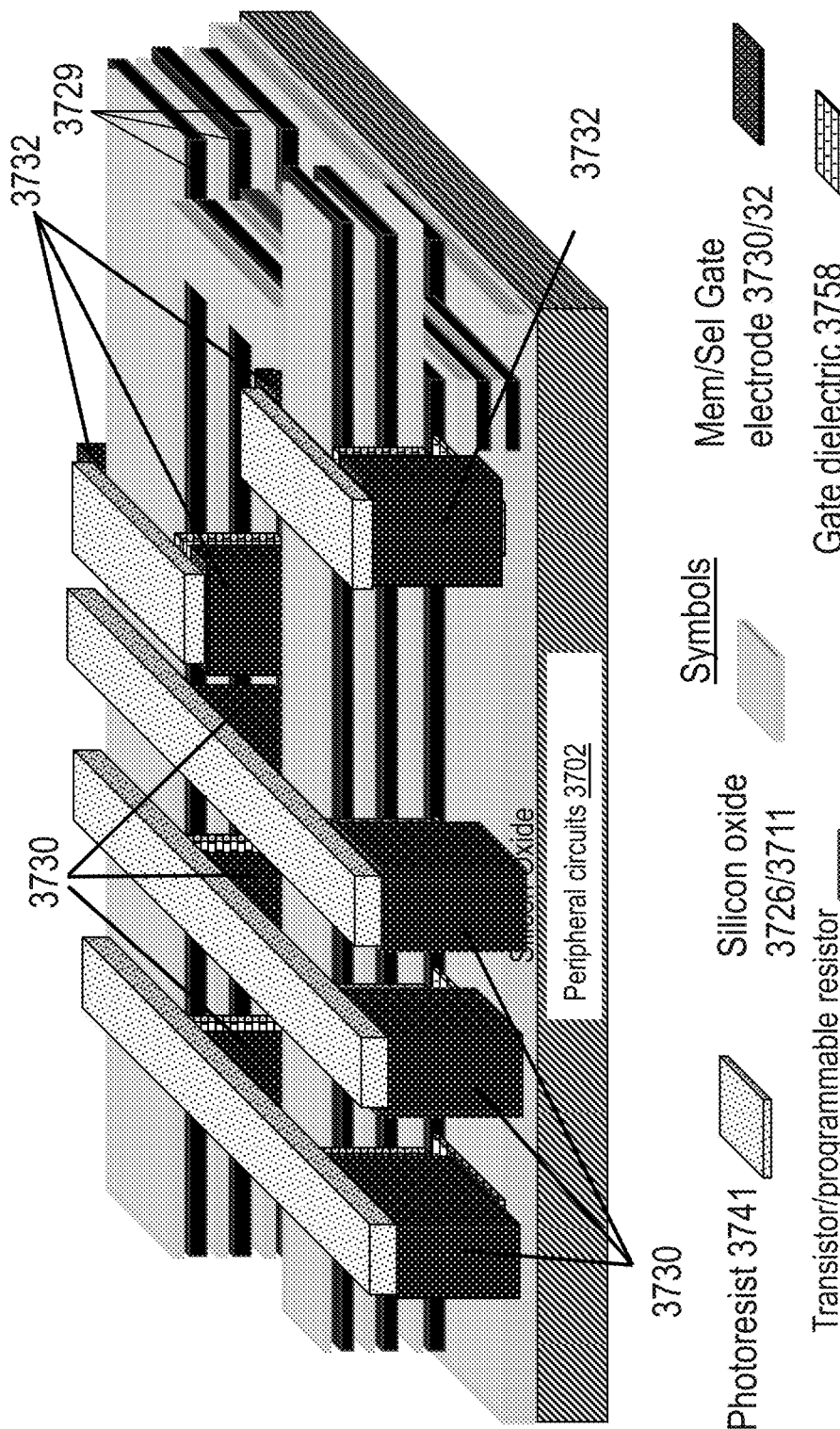

As illustrated in FIG. 37I, the select transistor gates and memory transistor gates may be formed. A gate dielectric may be grown on the exposed N+ silicon surfaces of transistor/programmable resistor regions 3729 (for example, with the TEL SPA tool radical oxidation oxide) or deposited substantially over the structure's surface, such as, for example, in the well-known HKMG formation processing using ALD or other conformal deposition technique. A gate electrode material, such as, for example, doped amorphous or polysilicon, or the well-known metal stack of HKMG processing, may be deposited. The gate electrode material may be in-situ doped during deposition. Additional material, such as insulator material, for example silicon oxide, may be deposited to complete filling the gate fill regions between the ridges of stacks and enable the following CMP step. CMP may be performed to planarize the gate electrode material and insulator fill material, and may be planarized substantially to the top of the Si/SiO$_2$ region stacks, or partially into the etch stop/CMP stop material (not shown). The top face of the topmost insulator region of insulator regions 3726 may include an insulating (unless removed later) etch stop/CMP stop material, such as, for example, SiN or a-carbon, placed on it at an earlier stage, so to provide a CMP stop, thus enabling the formation of separate gate and select gate regions. Although the width of the transistor/programmable resistor regions 3729 near and between the double side gates are illustrated as being larger than the thickness, one skilled in the art would recognize that the reverse (i.e., thickness larger than width) could be formed to provide increased gate control of the transistor channel. A lithographic pattern of photoresist 3741 may be formed wherein the memory double side gate regions 3730, select gate regions 3732, and the top layer of the stack that is in-between the two legs of the memory double side gate regions 3730, and the top layer of the stack that is in-between the two legs of the select gate regions 3732, may be covered so to protect from the etch of the gate material. The lithographic pattern may be designed such that the memory double side gate regions 3730 are roughly (the double gated channel may only have to to be shut off in the horizontal direction by the gate control) aligned to the etched stack portions of insulator regions 3721, thus forming strings of paralleled memory transistor/programmable resistor pairs. The programmable resistor in each pair is overlaying its associated memory transistor. The remaining gate fill may then be etched to define gate structure regions shown in FIG. 37I, thus forming the memory double side gate regions 3730, select gate regions 3732, and gate dielectric regions 3758. The photoresist 3741 may be stripped at this point (not shown), and the structure may be filled with additional isolative material, such as an insulator material, for example silicon oxide, which may be deposited to complete filling the gap regions between the ridges of the stacks and the gate structure regions and enable the following CMP step. CMP may be performed to planarize the structure isolative fill material, and may be planarized to above to the top of the Si/SiO$_2$ region stacks, thereby covering the entire structure.

Figure 37J:
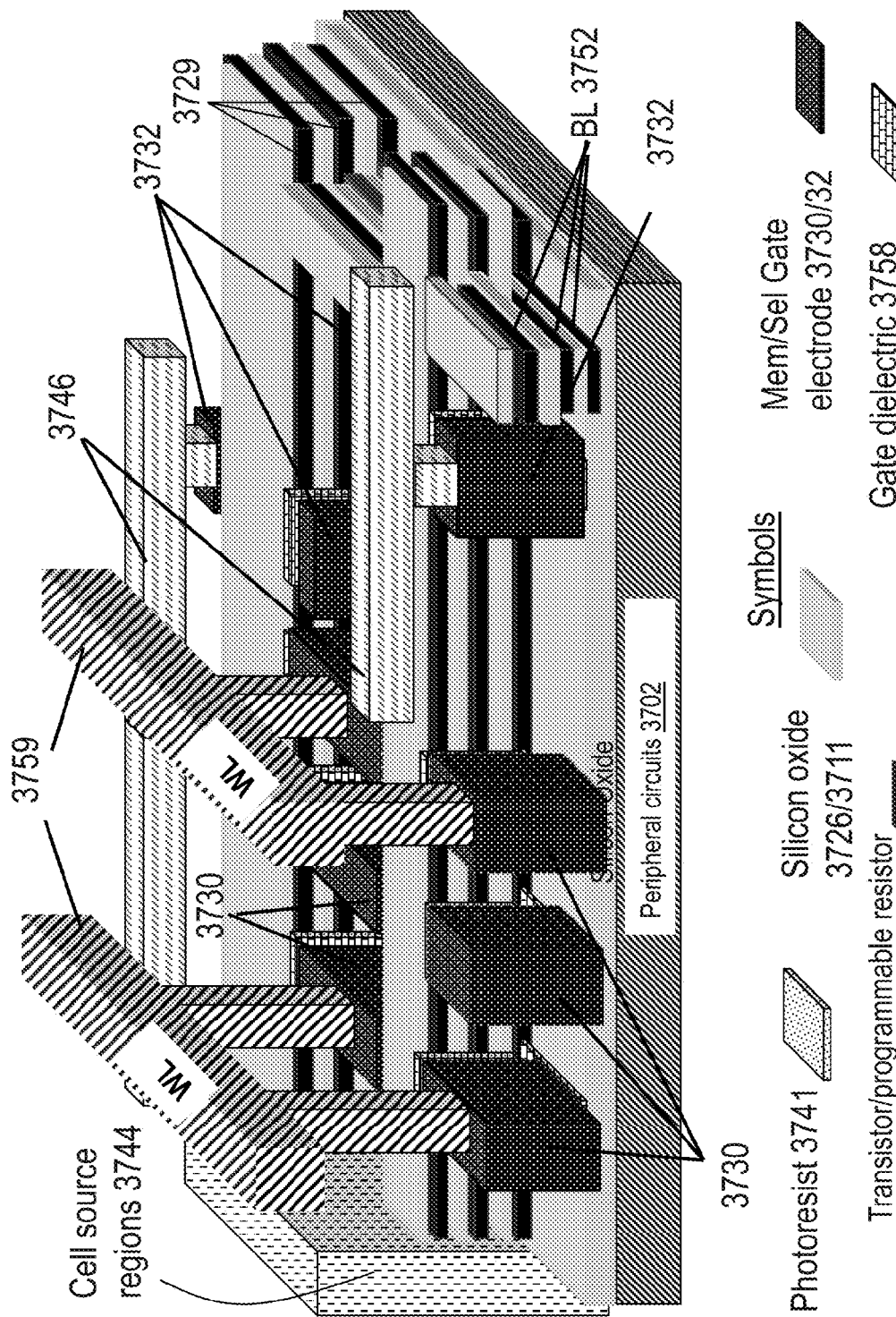

As illustrated in FIG. 37J, the entire structure may be covered with an interlayer dielectric (ILD), for example, SACVD silicon oxide, which may be planarized with chemical mechanical polishing (or the previous dep/CMP may accomplish the ILD necessary, depending n design choices). The ILD is shown transparent in the figure for clarity in illustration. Select metal lines 3746 may be formed and connected to the associated select gate contacts, the contacts may be formed to overlap both related regions of select gate regions 3732. The select metal lines 3746 signal may be routed to another metallization layer and parallel the WL direction (not shown). Word-line (WL) metallization 3759 may be formed and connected to the associated gate contacts, the contacts may be formed to overlap the specific memory gate regions 3730 (not all WL connects are shown for clarity). Cell source regions 3744 may be formed by a trench contact etch and filled to couple to the N+ silicon regions on the source end of the NAND strings. BL contacts (not shown) can be made into stair-like structures of BL 3752 (portions of transistor/programmable resistor regions 3729) using techniques described in "Bit Cost Scalable Technology with Punch and Plug Process for Ultra High Density Flash Memory," *VLSI Technology, 2007 IEEE Symposium on VLSI Technology*, pp. 14-15, 12-14 Jun. 2007 by Tanaka, H.; Kido, M.; Yahashi, K.; Oomura, M.; et al., and in U.S. Pat. No. 7,915,667, or using the staircase methods of "A stacked memory device on logic 3D technology for ultra-high-density data storage," *Nanotechnology*, 22 (2011) 254006 by J. Kim, et al. Through layer vias (not shown) may be formed to electrically couple the BL, SL, and WL metallization to the peripheral circuits 3702.

Persons of ordinary skill in the art will appreciate that the illustrations in FIGS. 37A through 37J are exemplary only and are not drawn to scale. Such skilled persons will further appreciate that many variations may be possible such as, for example, BL or SL contacts may be constructed in a staircase manner as described previously. Moreover, the stacked memory layers may be connected to a periphery circuit that may be above the memory stack. Additionally, each tier of memory could be configured with a slightly different donor wafer n+ layer doping profile. Further, the memory could be organized in a different manner, such as BL and SL interchanged, or where buried wiring for the memory array may be below the memory layers but above the periphery. Furthermore, cell source regions 3744 could be tied to Vpp and the other side through select transistors and then the BL line which could be the N+ silicon to a staircase-like structure to control each layer using the BL lines. Moreover, the peripheral circuits could be formed to the side of the stack memory array on any of the stack layers or the substrate on which they sit. Many other modifications within the scope of the illustrated embodiments of the invention will suggest themselves to such skilled persons after reading this specification. Thus the invention is to be limited only by the appended claims.

An alternate method to form the NAND RRAM/Memristor device may utilize conventional junctioned MOSFETs instead of the junction-less devices of FIG. 37. Processing may be similar to FIG. 37; however, instead of stacking N+ layers of silicon with the paralleled layers of programmable resistor material, a p− doped or undoped silicon layer may be transferred instead of the heavily doped n+ layers. As illustrated in FIG. 38, when the insulator regions 3821 are formed, an N+ implant may be done (with the photoresist still in place) to N+ dope substantially everywhere in the p-transferred silicon layer except where the insulator regions 3821 are. Then the resist may be removed and short pulse length/short wavelength optical annealing may be performed to activate the n+ implanted dopants, as described in detail in at least U.S. patent application Ser. No. 13/803,437 and U.S. Patent Publication No. 2012/0306082, which are incorporated by reference. Thus, p−/undoped regions 3888 and n+ doped regions 3818 may be formed. P−/undoped regions 3888 may eventually become the memory transistor and select transistor channels. Drawing references are similar to FIG. 37D, where periphery circuits 3802, isolation and bonding insulator layer 3811, and memory transistor area 3881 indicates where the NAND string of memory transistors with parallel programmable resistors will be formed, and select transistor area 3883 indicates where the select transistors for each NAND string will be formed. The processing may proceed in a similar manner as FIG. 37, with a bit more care of alignment of the gates over the p− regions. The short pulse length/short wavelength optical annealing of each layer in the stack may be useful to minimize thermal exposure of the resistive material that may be below the n+ implanted layer that is being ion-implanted and activated/annealed. The programmable resistor in each pair is overlaying its associated memory transistor.

Persons of ordinary skill in the art will appreciate that the illustrations in FIG. 38 are exemplary only and are not drawn to scale. Such skilled persons will further appreciate that many variations may be possible such as, for example, the N+ regions may be multi-depth implanted and then annealed/activated after the stack of p−/undoped transferred layers with programmable resistive material integrated to connect to the isolation region openings to make the diffusion contacts between the programmable resistor material and the p−/updoped silicon layers, if the programmable resistive material can withstand both the multi-depth n+ implant and the thermal activation anneal processes. Moreover, peripherial circuits may be formed on top of the memory array stack. Many other modifications within the scope of the illustrated embodiments of the invention will suggest themselves to such skilled persons after reading this specification. Thus the invention is to be limited only by the appended claims.

Figure 27:
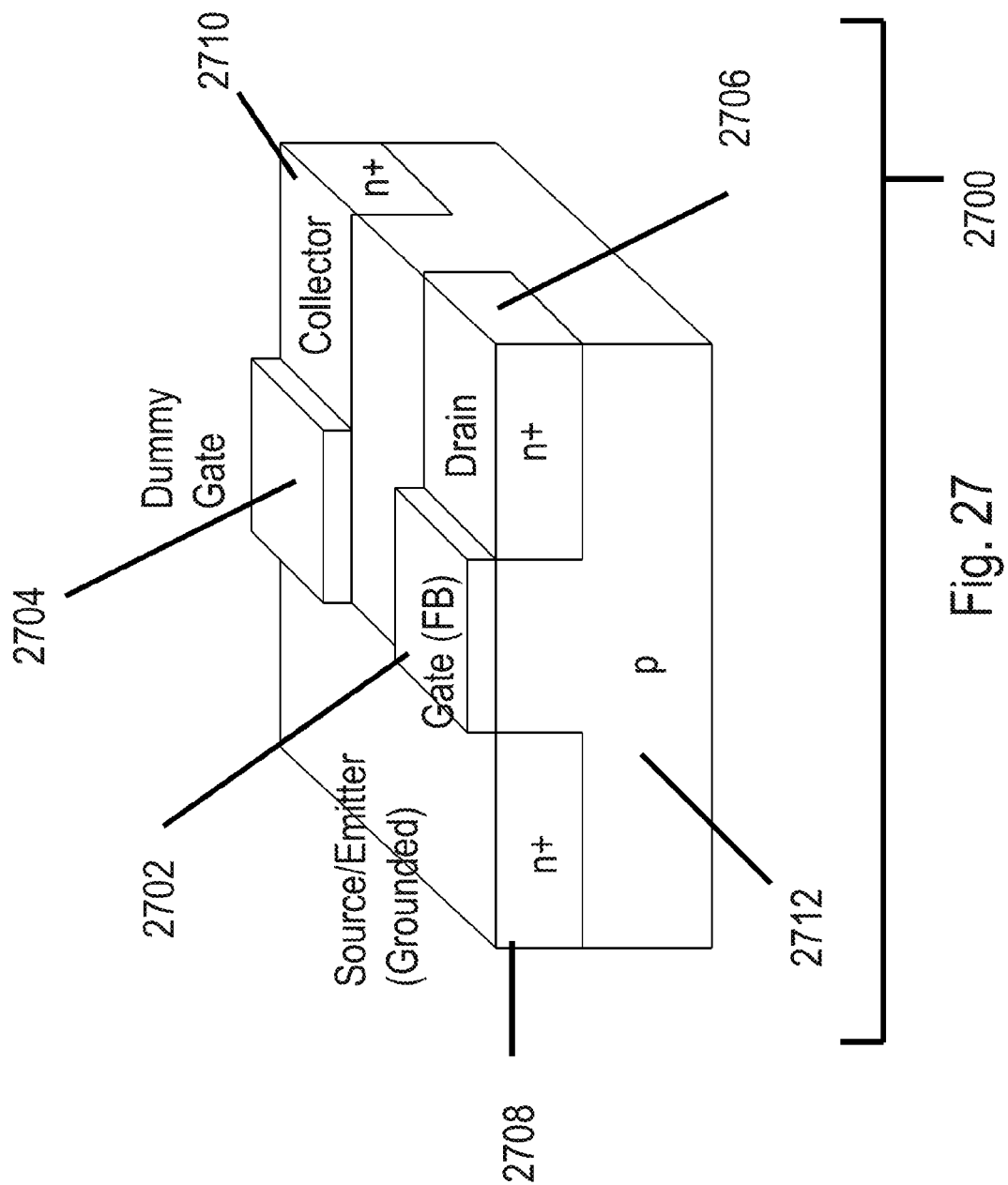
FIG. 27 is an exemplary drawing illustration of a side-to-side two-transistor floating body structure.

Side-to-Side Transistor Structure:

FIG. 27 illustrates a side-to-side two-transistor configuration 2700 where n+ drain region 2706, n+ source/emitter region 2708, p floating body region 2712 and gate metal and dielectric stack 2702 may form a NMOSFET transistor used for the reading and programming of the p floating body region 2712. N+ source/emitter region 2708 as emitter, p floating body region 2712 as base, and n+ collector 2710 may form a BJT transistor which may be used for the embedded BJT floating body refreshing scheme described above. The dummy gate and dielectric stack 2704 may remain unbiased, and the source/emitter region 2708 may be tied to ground during device operation. Using a conventional CMOS planar 2D flow, n+ drain region 2706, n+ source/emitter region 2708, and n+ collector region 2710 may be formed by a self-aligned to gate dopant ion implantation and thermal anneal, and the gate dielectrics of gate metal and dielectric stack 2702 and dummy gate metal and dielectric stack 2704 may be formed by oxide growth and/or deposition.

Persons of ordinary skill in the art will appreciate that the illustrations in FIGS. 21 through 27 are exemplary only and are not drawn to scale. Such skilled persons will further appreciate that many variations may be possible such as, for example, a PNP embedded BJT may be constructed by constructing p type regions in the place of the n type regions shown, and n type regions in the place of the p regions shown. Additionally, n layer 2110 may be a formed region. Moreover, n+ source region 2104, n+ drain region 2106, and p-well body 2108 doping concentrations may be factors of about 10 and 100 different than above. Further, gate metal and dielectric stacks, such as gate metal and dielectric stack 2702, may be formed with Hi-k oxides, such as, for example, hafnium oxides, and gate metals, such as, for example, TiAlN. Many other modifications within the scope of the invention described herein will suggest themselves to such skilled persons after reading this specification. Thus the invention is to be limited only by the appended claims.

Continuous Array Approaches:

In general, logic devices may need varying amounts of logic, memory, and I/O, and memory devices, such as, for example, floating body DRAM, may need varying amounts of I/O, logic, and controller circuits. The continuous array ("CA") of U.S. Pat. No. 7,105,871 allows flexible definition of the logic device size, yet for any size the ratio among the three components remained fixed, barring minor boundary effect variations. Further, there exist other types of specialized logic that may be difficult to implement effectively using standard logic such as DRAM, Flash memory, DSP blocks, processors, analog functions, or specialized I/O functions such as SerDes. The continuous array of prior art does not provide an effective solution for these specialized yet not common enough functions that would justify their regular insertion into CA wafer.

Some embodiments of the invention enable a different and more flexible approach. Additionally the prior art proposal for continuous array were primarily oriented toward Gate Array and Structured ASIC where the customization includes some custom masks. In contrast, some embodiments of the invention propose an approach which could fit well with memory and logic including embodiments without any custom masks. Instead of adding a broad variety of such blocks into the CA which would make it generally area-inefficient, and instead of using a range of CA types with different block mixes which would require large number of expensive mask sets, some embodiments of the current invention allow using Through Silicon Via or monolithic 3DIC approaches to enable a new type of configurable system.

The technology of "Package of integrated circuits and vertical integration" has been described in U.S. Pat. No. 6,322,903 issued to Oleg Siniaguine and Sergey. Accordingly, an embodiment of the invention suggests the use of CA tiles, each made of one type, or of very few types, of elements. The target system may then be constructed using desired number of tiles of desired type stacked on top of each other and electrically connected with TSVs or monolithic 3D approaches, thus, a 3D Configurable System may result.

Figure 28A:
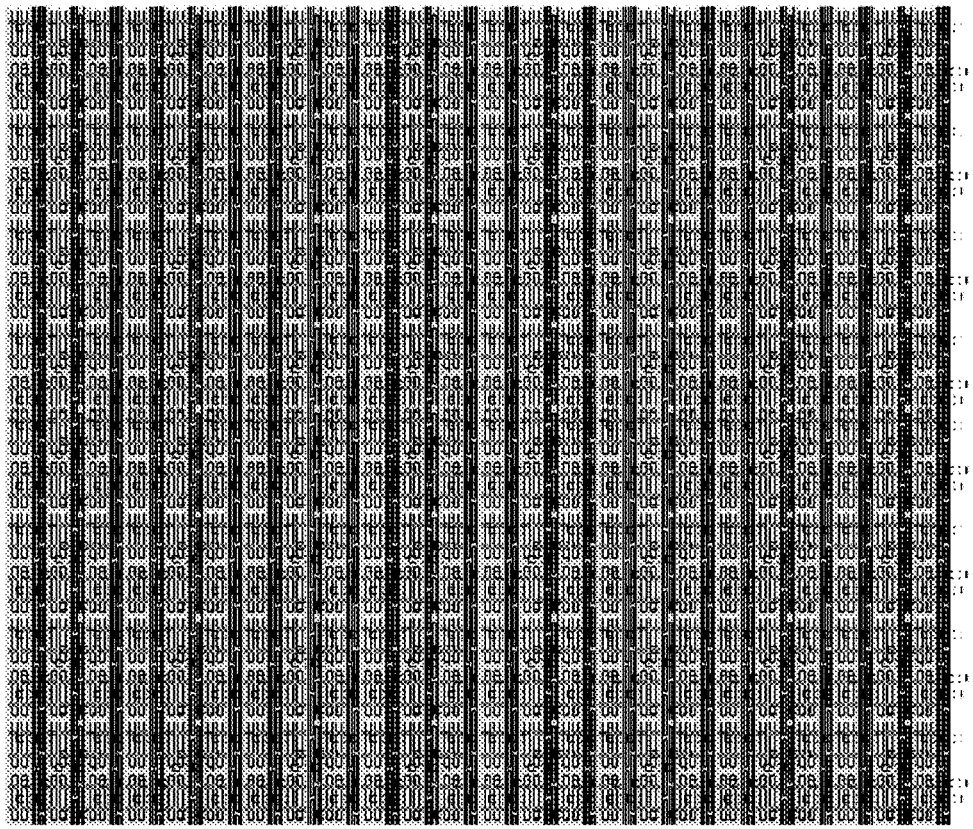
FIG. 28A is an exemplary drawing illustration of a reticle of a repeatable device structure.
Figure 28B:
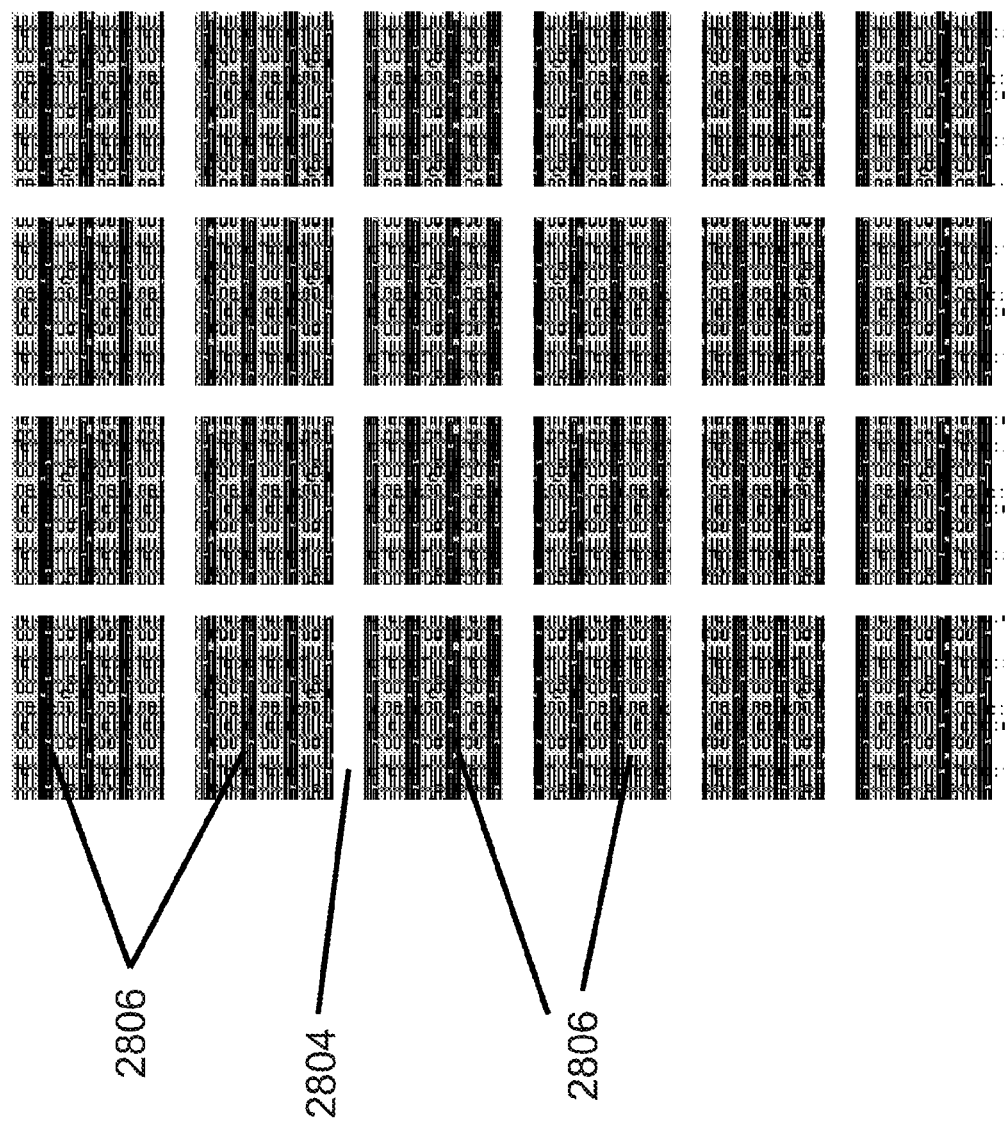
FIG. 28B is an exemplary drawing illustration of the application of a dicing line mask to a continuous array.

FIG. 28A illustrates an embodiment of the invention wherein a continuous array of, for example, floating-body RAM cells or logic cells, may fill a full reticle sized area 2803 with floating-body DRAM memory cells as described above or with the exemplary 8×12 array 8402 pattern of FIG. 84A of US patent publication 2011/0121366 respectively. Reticle sized area 2803, such as shown by FIG. 28A, may then be repeated across the entire wafer to form a wafer-sized continuous array of device structures (not shown). One or more custom lithographic and etch steps may be utilized to define custom dice lines within the wafer-sized continuous array of device structures, which may also be called a generic wafer. Accordingly a specific custom device may be diced from the previously generic wafer. The custom dice lines may be created by etching away some of the structures such as transistors of the continuous array or floating body DRAM as illustrated in FIG. 28B. This custom function etching may have a shape of multiple thin strips 2804 created by a custom mask, such as a dicing line mask, to etch away a portion of the devices. Thus custom forming logic or memory function, blocks, arrays, or devices 2806 (for clarity, not all possible blocks are labeled). A portion of these logic functions, blocks, arrays, or devices 2806 may be interconnected horizontally with metallization and may be electrically connected with vertical connections to circuitry above and below using TSV or utilizing the monolithic 3D variation, including, for example, some of the embodiments in this document and US patent application 2011/0121366. The invention may allow the use of a generic continuous array and then a customization process may be applied to construct multiple device sizes out of the same mask set. Therefore, for example, a continuous array as illustrated in FIG. 28A may be customized to a specific device size by etching the multiple thin strips 2804 as illustrated in FIG. 28B. Accordingly, wafers may be processed using one generic mask set of more than ten masks and then multiple device offerings may be constructed by a few custom function masks which may define specific sizes out of the generic continues array structure. And, accordingly, the wafer may then be diced to different device sizes for each device offering.

The concept of customizing a Continuous Array can be applied to logic, memory, I/O and other structures. Memory arrays have non-repetitive elements such as bit and word decoders, or sense amplifiers, which may need to be tailored to each memory size. An embodiment of the invention is to tile substantially the entire wafer with a dense pattern of memory cells, and then customize it using selective etching as before (custom function etching), and providing the required non-repetitive structures through an adjacent logic layer below or above the memory layer.

Figure 29A:
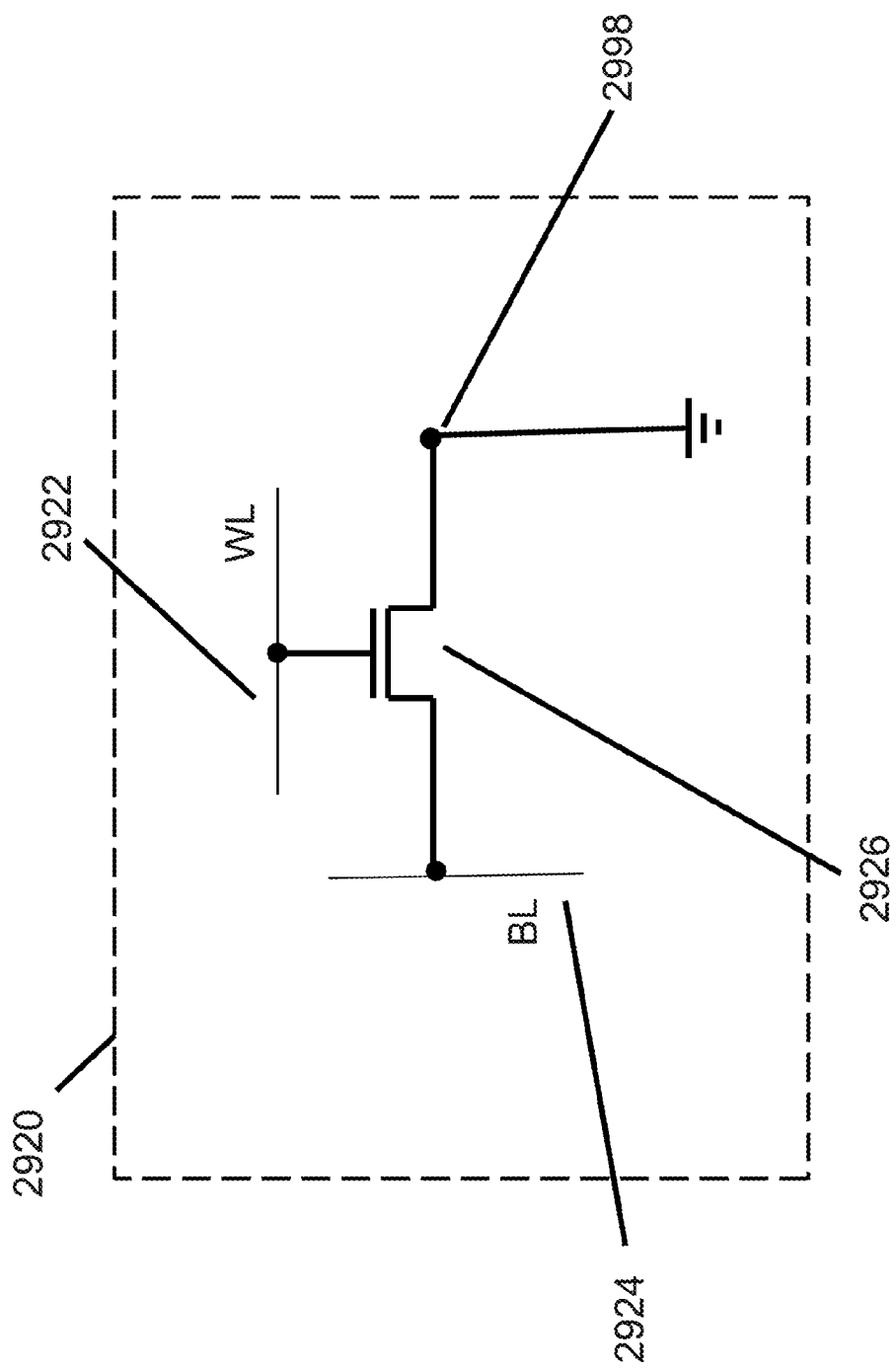
FIG. 29A is an exemplary drawing illustration of a floating-body memory cell suitable for use in a continuous array memory.

FIG. 29A is a drawing illustration of an exemplary floating-body DRAM cell 2920, with its word line 2922, bit line 2924, and transistor 2926. Such a bit cell may be typically densely packed and highly optimized for a given process. While terminal 2998 is shown to be connected to a "ground" voltage in FIG. 29A, one familiar with the art will recognize that it may be given a specific non-zero voltage as well.

Figure 29B:
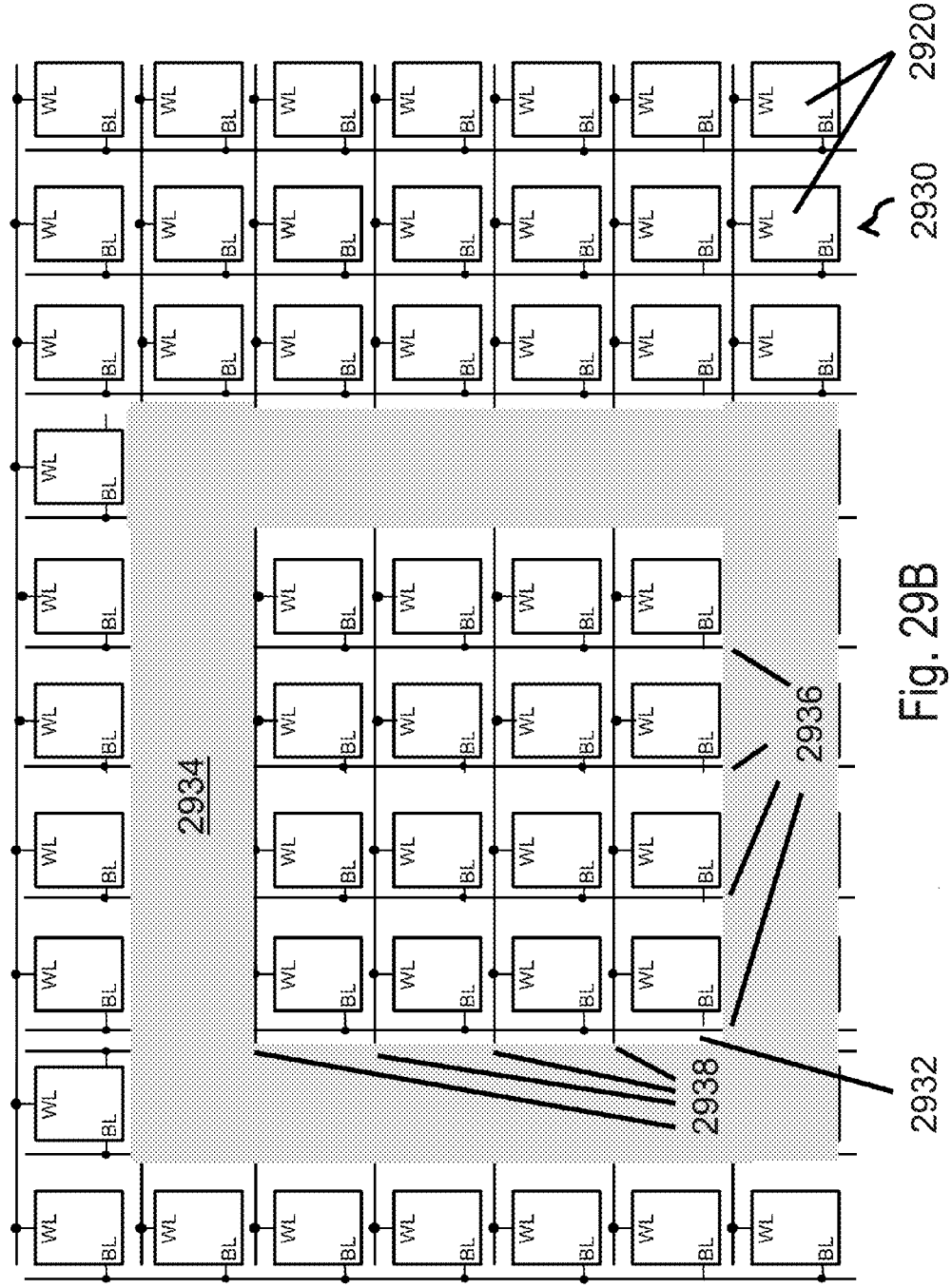
FIG. 29B is an exemplary drawing illustration of a continuous array of the memory cells of FIG. 30A with an etching pattern defining an exemplary 4×4 array.

A dense floating-body DRAM array 2930 (an exemplary memory region) may be constructed of a plurality of floating-body DRAM cells 2920 as illustrated in FIG. 29B. For example, a four by four array 2932 may be defined through custom etching away the cells in channel 2934, leaving bit lines 2936 and word lines 2938 unconnected. These word lines 2938 may be then electrically connected to an adjacent logic layer below or above that may have a word decoder (not shown) Similarly, the bit lines 2936 may be driven by another decoder such as bit line decoder (not shown). Connections may be made to other circuits such as sense amplifiers. A feature of this approach may be that the customized logic, such as word decoders, bit line decoders, and sense amplifiers, may be provided from below or above in close vertical proximity to the area where it may be needed, thus assuring high performance customized memory blocks.

Persons of ordinary skill in the art will appreciate that the illustrations in FIGS. 28 through 29 are exemplary only and are not drawn to scale. Such skilled persons will further appreciate that many variations may be possible such as, for example, the CA concept may include pre-defined scribe-lines, such as described in a US patent application 2011/0121366 FIG. 84. Moreover, memory architectures in addition to floating-body RAM, such as, for example, RRAM, SRAM, and conductive bridge, may utilize the continuous array concept and 3D IC application. Moreover, dense floating-body DRAM array 2930 may be a substantially wafer-sized CA or may less than a wafer-sized CA. Many other modifications within the scope of the invention described herein will suggest themselves to such skilled persons after reading this specification. Thus the invention is to be limited only by the appended claims.

As illustrated in FIG. 30A, the custom dicing line mask referred to in the FIG. 28B discussion to create multiple thin strips 2804 for etching may be shaped to create chamfered block corners 3002 of custom blocks 3004 to relieve stress. Custom blocks 3004 may include functions, blocks, arrays, or devices of architectures such as logic, FPGA, I/O, or memory.

As illustrated in FIG. 30B, this custom function etching and chamfering may extend thru the BEOL metallization of one device layer of the 3DIC stack as shown in first structure 3050, or extend thru the entire 3DIC stack to the bottom substrate and shown in second structure 3070, or truncate at the isolation of any device layer in the 3D stack as shown in third structure 3060. The cross sectional view of an exemplary 3DIC stack may include second layer BEOL dielectric 3026, second layer interconnect metallization 3024, second layer transistor layer 3022, substrate layer BEOL dielectric 3016, substrate layer interconnect metallization 3014, substrate transistor layer 3012, and substrate 3010.

Passivation of the edge created by the custom function etching may be accomplished as follows. If the custom function etched edge is formed on a layer or strata that is not the topmost one, then it may be passivated or sealed by filling the etched out area with dielectric, such as a Spin-On-Glass (SOG) method, and CMPing flat to continue to the next 3DIC layer transfer or TSV bonding. As illustrated in FIG. 30C, the topmost layer custom function etched edge may be passivated with an overlapping layer or layers of material including, for example, oxide, nitride, or polyimide. Oxide may be deposited over custom function etched block edge 3080 and may be lithographically defined and etched to overlap the custom function etched block edge 3080 shown as oxide structure 3084. Silicon nitride may be deposited over wafer and oxide structure 3084, and may be lithographically defined and etched to overlap the custom function etched block edge 3080 and oxide structure 3084, shown as nitride structure 3086.

In such way a single expensive mask set can be used to build wafers for different memory sizes and finished through another mask set that may be used to build logic wafers that can be customized by a few metal layers.

The various 3D memories architecture presented herein may be utilizing layer transfer technology over a base layer of peripheral circuits that may be utilizing refractory metal for the peripheral circuit interconnects. It was suggested to do the activation annealing together to all layer. Such high temperature anneal could also be used to repair the transferred layer from the ion-cut damages. Many variations could be applied including annealing the ion-cut damages for all layers in one step of high temperature of over about 600° C. before the step of ion implant which could be followed by high temperature of over about 750° C. for activation. Alternatively an anneal could be done for each layer following transfer including rapid anneal flash anneal or laser anneal.

Alternatively the 3D structure could be formed on a substrate bulk or SOI (Silicon On Isolator) wafer. Than after the formation of the 3D memory array an additional layer transfer could be applied to build the peripherals circuits using aluminum or copper. In some cases the memory control lines could be made on one side of the 3D stack and the peripherals circuits on the other. In some case the peripherals circuits could be built on both sides of the 3D memory stack. The peripherals circuits could be built in some cases using monolithic 3D techniques presented before or using techniques presented in U.S. Pat. No. 8,273,610 incorporated here in its entirety.

Persons skilled in the art will recognize that it is now possible to assemble a true monolithic 3D stack of monocrystalline silicon layers or strata with high performance devices using advanced lithography that repeatedly reuse same masks, with only few custom metal masks for each device layer. Such persons will also appreciate that one can stack in the same way a mix of disparate layers, some carrying transistor array for general logic and other carrying larger scale blocks such as memories, analog elements, Field Programmable Gate Array (FPGA), and I/O. Moreover, such a person would also appreciate that the custom function formation by etching may be accomplished with masking and etching processes such as, for example, a hard-mask and Reactive Ion Etching (RIE), or wet chemical etching, or plasma etching. Furthermore, the passivation or sealing of the custom function etching edge may be stair stepped so to enable improved sidewall coverage of the overlapping layers of passivation material to seal the edge.

It will also be appreciated by persons of ordinary skill in the art that the invention is not limited to what has been particularly shown and described hereinabove. Rather, the scope of the embodiments of the invention includes both combinations and sub-combinations of the various features described herein above as well as modifications and variations which would occur to such skilled persons upon reading the foregoing description. Thus the invention is to be limited only by the appended claims.

What is claimed is:

1. A 3D device, comprising:
  a first layer comprising a first memory comprising a first transistor;
  a second layer comprising a second memory comprising a second transistor;
  a Resistive RAM structure,
    wherein said second transistor is self-aligned to said first transistor, and
    wherein said Resistive RAM structure is overlaying said first layer and is overlaid by said second layer; and
  at least one horizontally oriented silicon strip,
    wherein said Resistive RAM structure is designed to be connected to said silicon strip.

2. The 3D device according to claim 1,
  wherein said first transistor comprises a single crystal channel.

3. The 3D device according to claim 1, further comprising:
at least one periphery transistor disposed underneath or above said first memory.

4. The 3D device according to claim 1,
wherein said second layer comprises a third transistor connected to said second transistor.

5. The 3D device according to claim 1, further comprising:
at least one logic transistor disposed underneath or above said first memory;
a vertical control line connecting said at least one logic transistor to said first transistor.

6. The 3D device according to claim 1,
wherein said device comprises a word-line controlling said first transistor and said second transistor.

7. The 3D device according to claim 1,
wherein said Resistive RAM structure is in-parallel to said first horizontally oriented silicon strip.

8. A 3D device, comprising:
a first layer comprising a first memory comprising a first transistor;
a second layer comprising a second memory comprising a second transistor;
a Resistive RAM structure;
a first horizontally oriented silicon strip; and
a second horizontally oriented silicon strip,
wherein said second transistor is self-aligned to said first transistor, and
wherein said Resistive RAM structure is in-parallel to said first horizontally oriented silicon strip and said second horizontally oriented silicon strip.

9. The 3D device according to claim 8,
wherein said first transistor comprises a single crystal channel.

10. The 3D device according to claim 8,
wherein said Resistive RAM structure is designed to be connected to said first horizontally oriented silicon strip and said second horizontally oriented silicon strip.

11. The 3D device according to claim 8, further comprising:
at least one periphery transistor disposed underneath or above said first memory.

12. The 3D device according to claim 8,
wherein said second layer comprises a third transistor connected to said second transistor.

13. The 3D device according to claim 8, further comprising:
at least one logic transistor disposed underneath or above said first memory;
a vertical control line connecting said at least one logic transistor to said first transistor.

14. The 3D device according to claim 8,
wherein said device comprises a word-line controlling said first transistor and said second transistor.

15. A 3D device, comprising:
a first layer comprising a first memory comprising a first transistor;
a second layer comprising a second memory comprising a second transistor;
a first Resistive RAM structure; and
a second Resistive RAM structure,
wherein said second transistor is self-aligned to said first transistor, and
wherein said first Resistive RAM structure is self-aligned to said second Resistive RAM structure, and
wherein said first Resistive RAM structure and said second Resistive RAM structure are not in contact.

16. The 3D device according to claim 15,
wherein said first transistor comprises a single crystal channel.

17. The 3D device according to claim 15, further comprising:
at least one periphery transistor disposed underneath or above said first memory.

18. The 3D device according to claim 15,
wherein said second layer comprises a third transistor connected to said second transistor.

19. The 3D device according to claim 15, further comprising:
at least one logic transistor disposed underneath or above said first memory,
a vertical control line connecting at least one logic transistor to said first transistor.

20. The 3D device according to claim 15,
wherein said device comprises a word-line controlling said first transistor and said second transistor.

* * * * *